United States Patent
Chiang et al.

(10) Patent No.: US 12,279,414 B2
(45) Date of Patent: Apr. 15, 2025

(54) INTEGRATED CIRCUIT AND MANUFACTURING METHOD THEREOF

(71) Applicant: Taiwan Semiconductor Manufacturing Company, Ltd., Hsinchu (TW)

(72) Inventors: Katherine H Chiang, New Taipei (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 334 days.

(21) Appl. No.: 17/844,040

(22) Filed: Jun. 19, 2022

(65) Prior Publication Data

US 2023/0413514 A1 Dec. 21, 2023

(51) Int. Cl.
*H10B 12/00* (2023.01)
*H01L 23/522* (2006.01)
*H01L 23/528* (2006.01)
*H01L 49/02* (2006.01)
*H10B 20/20* (2023.01)

(52) U.S. Cl.
CPC ......... *H10B 12/30* (2023.02); *H01L 23/5223* (2013.01); *H01L 23/5226* (2013.01); *H01L 23/5283* (2013.01); *H01L 28/60* (2013.01); *H10B 12/03* (2023.02); *H10B 12/05* (2023.02); *H10B 20/20* (2023.02)

(58) Field of Classification Search
CPC ........ H10B 12/05; H10B 61/10; H10B 53/00; H10B 53/50; H01L 23/5223
See application file for complete search history.

(56) References Cited

U.S. PATENT DOCUMENTS

| | | | | |
|---|---|---|---|---|
| 5,874,756 A * | 2/1999 | Ema | ...................... | H10B 12/05 |
| | | | | 257/E21.654 |
| 5,895,239 A * | 4/1999 | Jeng | ...................... | H10B 12/033 |
| | | | | 257/E21.654 |
| 6,242,300 B1 * | 6/2001 | Wang | .................. | H01L 27/0629 |
| | | | | 257/E21.654 |
| 2002/0068401 A1 * | 6/2002 | Wang | ..................... | H10B 12/09 |
| | | | | 257/E21.654 |
| 2005/0167718 A1 * | 8/2005 | Ema | .................. | H01L 21/76813 |
| | | | | 257/E21.582 |
| 2020/0411635 A1 * | 12/2020 | Lajoie | ................. | H01L 27/1255 |
| 2023/0005856 A1 * | 1/2023 | Chen | ....................... | H01L 25/18 |
| 2023/0005861 A1 * | 1/2023 | Wang | ..................... | H01L 24/08 |
| 2023/0062750 A1 * | 3/2023 | Wu | ........................ | H10B 80/00 |
| 2024/0407164 A1 * | 12/2024 | Norizuki | ............. | H01L 25/0657 |

\* cited by examiner

*Primary Examiner* — Evren Seven
(74) *Attorney, Agent, or Firm* — Eschweiler & Potashnik, LLC

(57) ABSTRACT

An integrated circuit includes a substrate, a first transistor, and an interconnect structure. The first transistor is over the substrate. The interconnect structure is disposed on the substrate and includes a first dielectric layer and a memory module. The memory module includes a first memory device, a second memory device, and a third memory device. The first memory device is embedded in the first dielectric layer. The second memory device is disposed aside the first memory device and is embedded in the first dielectric layer. The first memory device, the second memory device, and the third memory device are different types of memory devices.

20 Claims, 45 Drawing Sheets

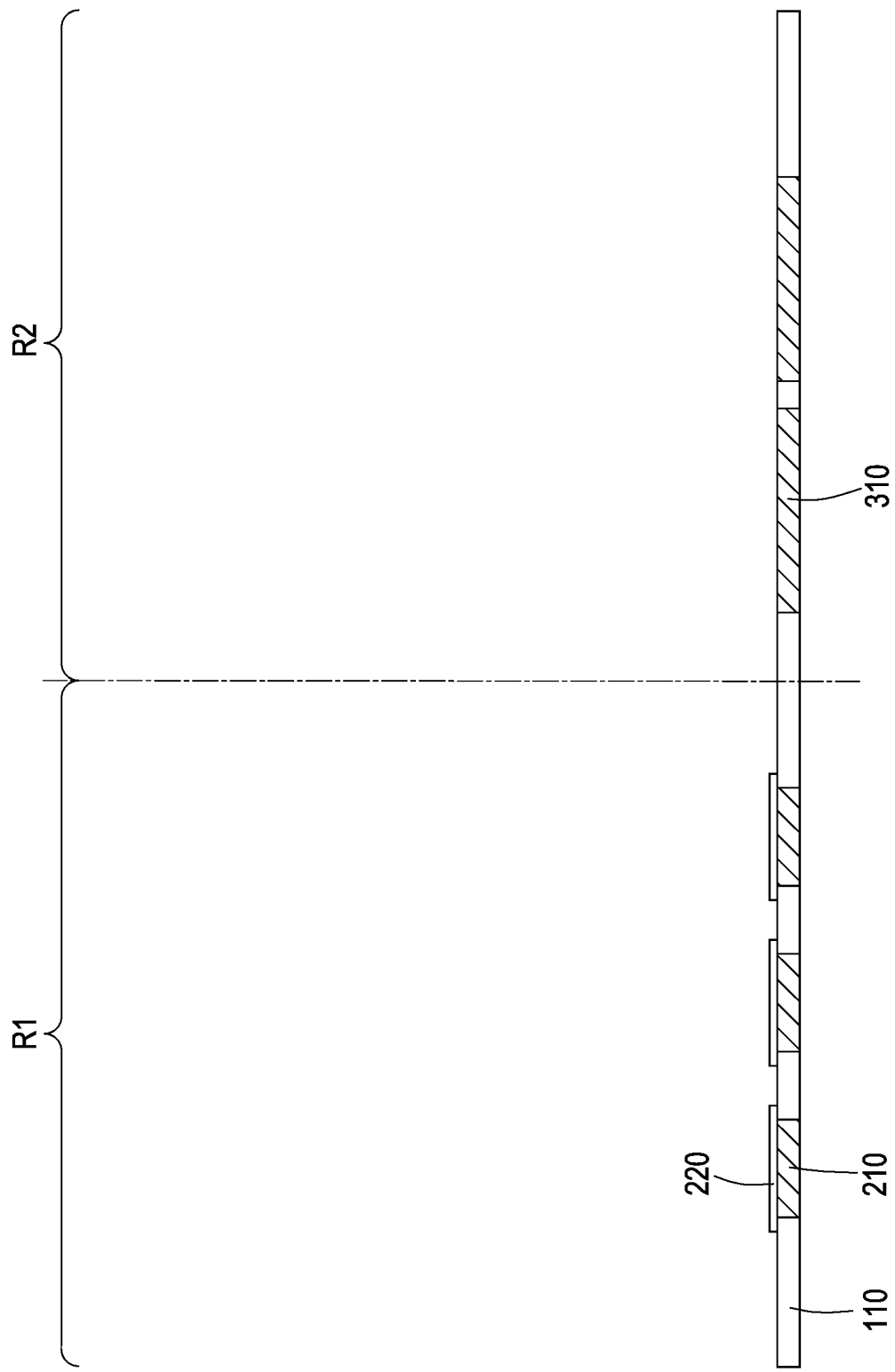

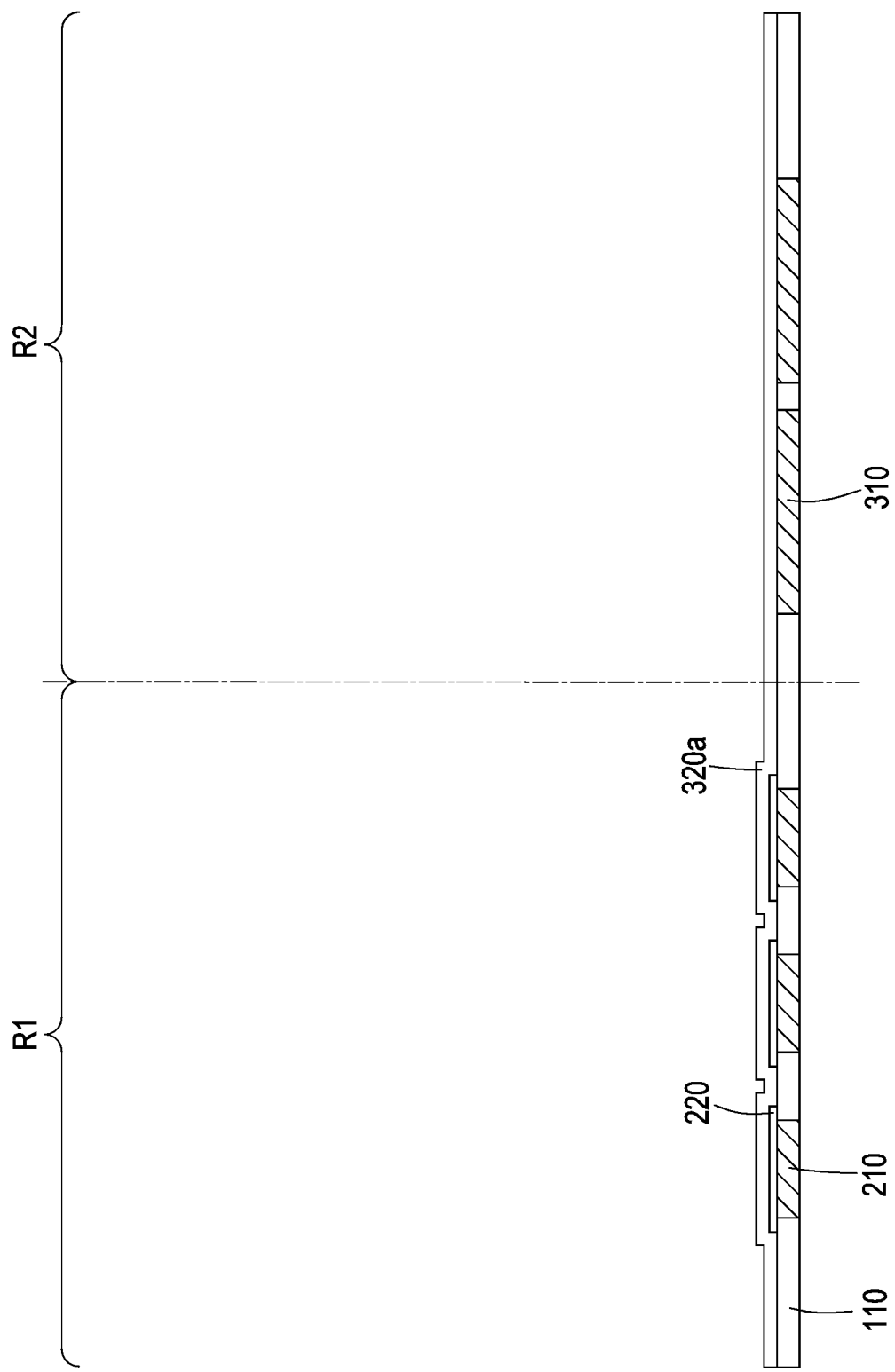

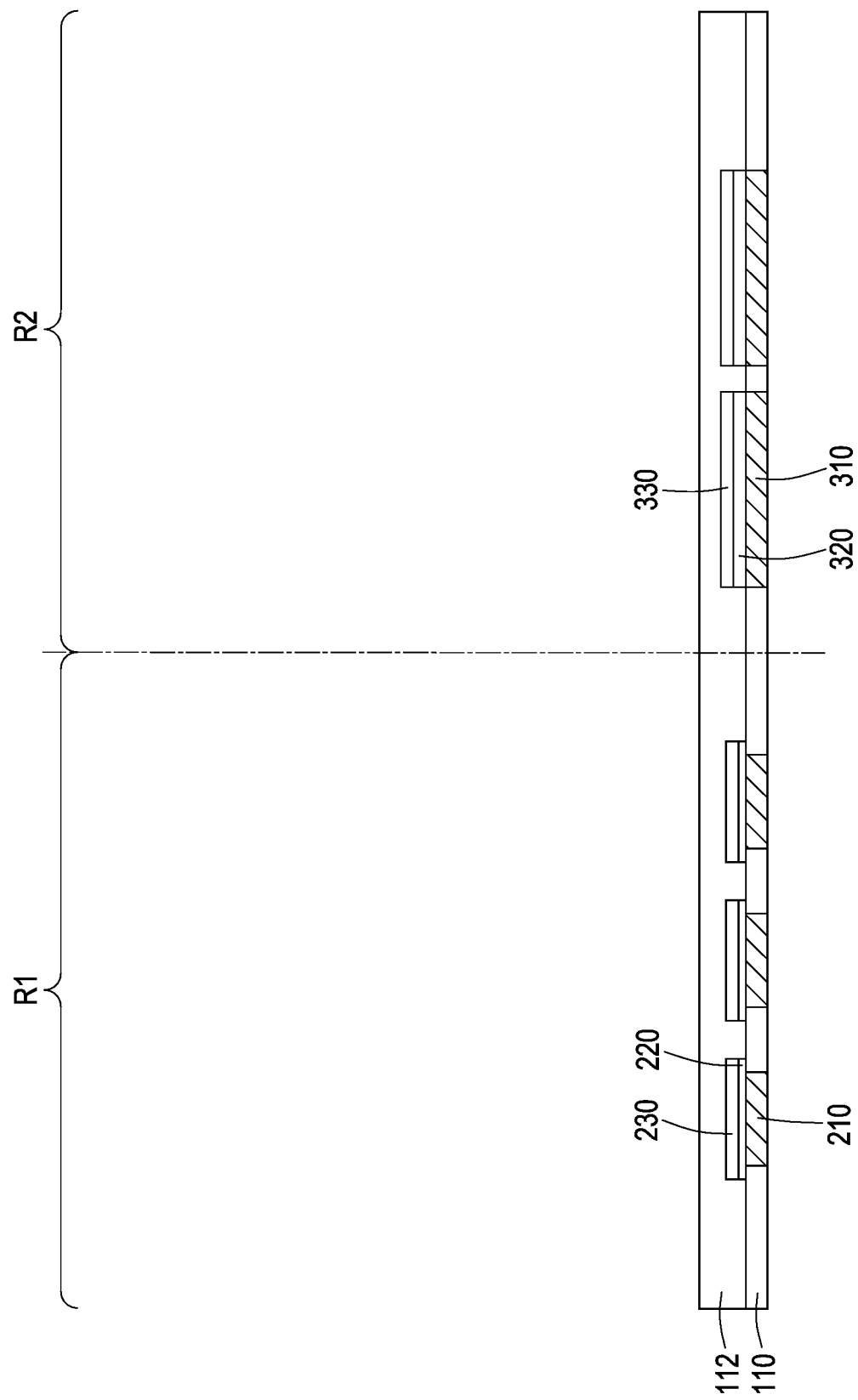

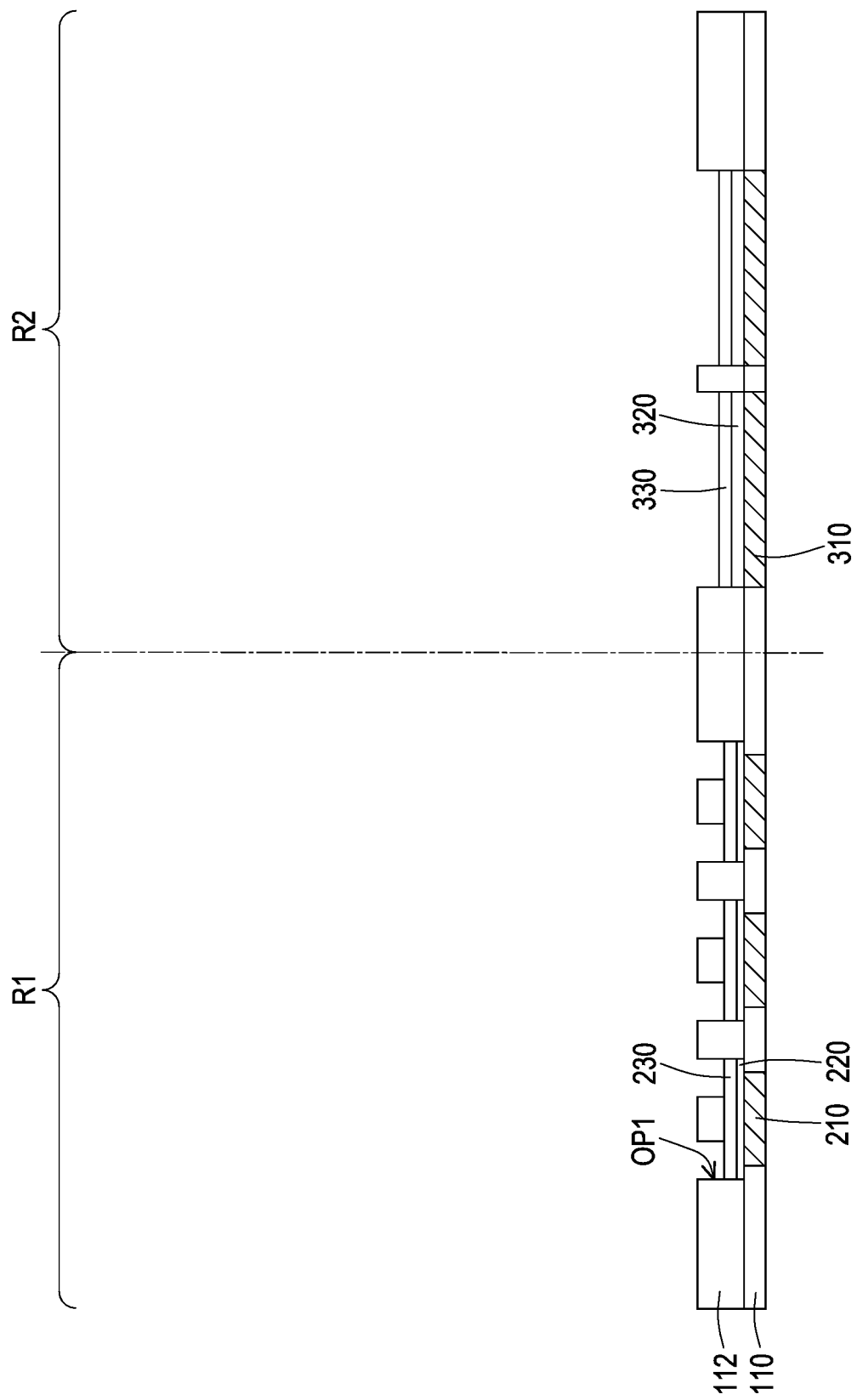

INTEGRATED CIRCUIT AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
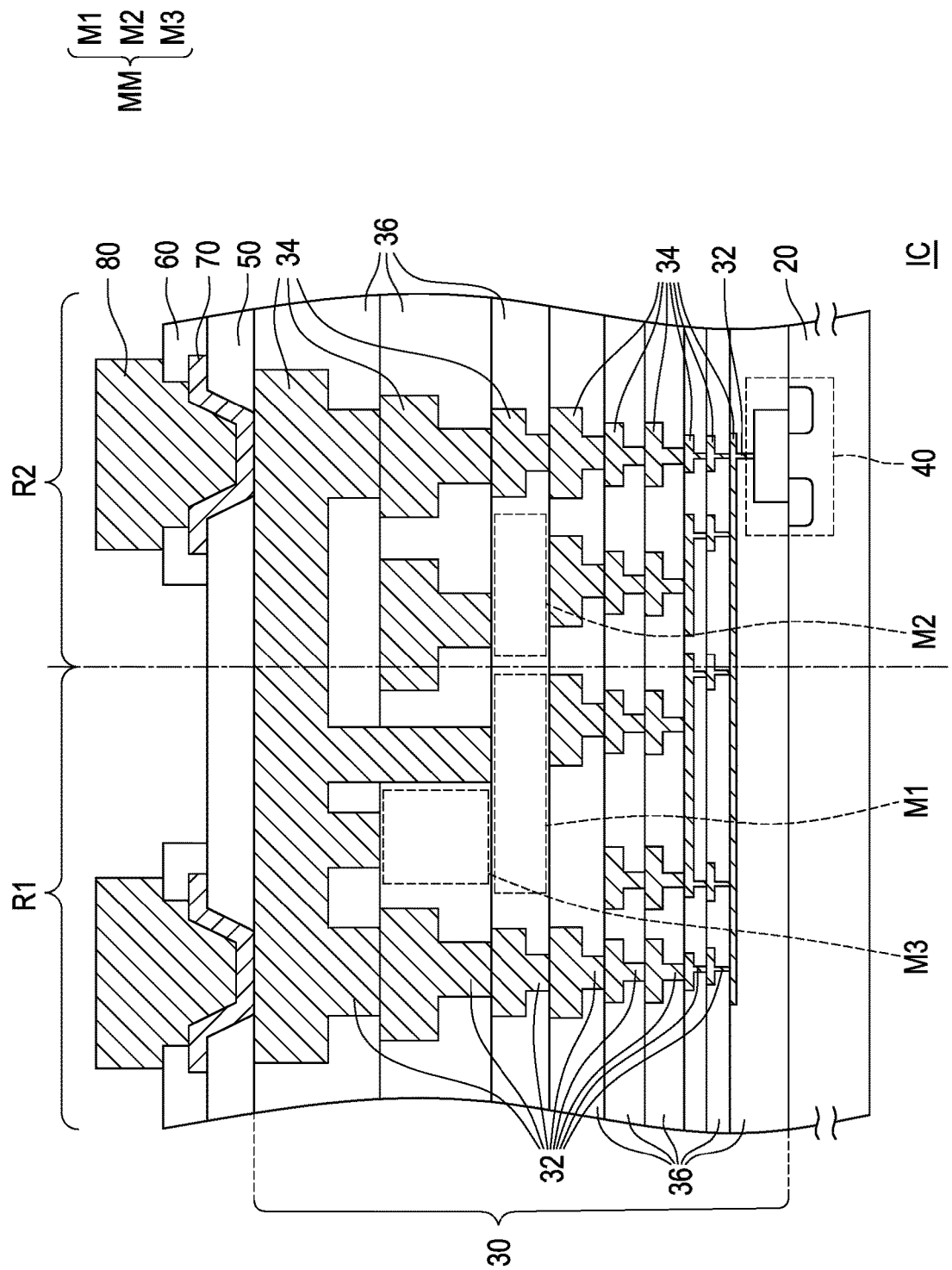
FIG. 1 is a schematic cross-sectional view of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of an integrated circuit IC in accordance with some embodiments of the disclosure. Referring to FIG. 1, the integrated circuit IC includes a substrate 20, an interconnect structure 30, a transistor 40, a passivation layer 50, a post-passivation layer 60, a plurality of conductive pads 70, and a plurality of conductive terminals 80. In some embodiments, the substrate 20 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 20 may be a bulk silicon substrate, a silicon-on-insulator (SOI) substrate, or a germanium-on-insulator (GOI) substrate.

In some embodiments, the substrate 20 includes various doped regions depending on circuit requirements (e.g., p-type semiconductor substrate or n-type semiconductor substrate). In some embodiments, the doped regions are doped with p-type or n-type dopants. For example, the doped regions may be doped with p-type dopants, such as boron or $BF_2$; n-type dopants, such as phosphorus or arsenic; and/or combinations thereof. In some embodiments, these doped regions serve as source/drain regions of the transistor 40, which is formed over the substrate 20. Depending on the types of the dopants in the doped regions, the transistor 40 may be referred to as n-type transistor or p-type transistor. In some embodiments, the transistor 40 further includes a metal gate and a channel under the metal gate. The channel is located between the source region and the drain region to serve as a path for electrons to travel through when the transistor 40 is turned on. On the other hand, the metal gate is located above the substrate 20 and is embedded in the interconnect structure 30. In some embodiments, the transistor 40 is formed using suitable Front-end-of-line (FEOL) process. That is, the transistor 40 may be referred to as a FEOL transistor. For simplicity, one transistor 40 is shown in FIG. 1. However, it should be understood that more than one transistor 40 may be presented depending on the application of the integrated circuit IC. When multiple transistors 40 are presented, these transistors 40 may be separated by shallow trench isolation (STI; not shown) located between two adjacent transistors 40. In some embodiments, the FEOL process may be further utilized to form other elements. For example, memory peripheral circuits, Static Random Access Memory (SRAM), and other computing circuits may be formed within/near the substrate 20 through the FEOL processes.

As illustrated in FIG. 1, the interconnect structure 30 is disposed on the substrate 20. In some embodiments, the interconnect structure 30 includes a plurality of conductive vias 32, a plurality of conductive patterns 34, a plurality of dielectric layers 36, and a memory module MM. As illustrated in FIG. 1, the conductive patterns 34 and the conductive vias 32 are embedded in the dielectric layers 36. In some embodiments, the conductive patterns 34 located at different level heights are connected to one another through the conductive vias 32. In other words, the conductive patterns 34 are electrically connected to one another through the conductive vias 32. In some embodiments, the bottommost conductive vias 32 are connected to the transistor 40. For example, the bottommost conductive vias 32 are connected to the metal gate, which is embedded in the bottommost dielectric layer 36, of the transistor 40. In other words, the bottommost conductive vias 32 establish electrical connection between the transistor 40 and the conductive patterns 34 of the interconnect structure 30. It should be noted that in some alternative cross-sectional views, other bottommost conductive vias 32 are also connected to the source/drain regions of the transistor 40. That is, in some embodiments, the bottommost conductive vias 32 may be referred to as "contact structures" of the transistor 40.

In some embodiments, a material of the dielectric layers 36 includes polyimide, epoxy resin, acrylic resin, phenol resin, benzocyclobutene (BCB), polybenzooxazole (PBO), or any other suitable polymer-based dielectric material. Alternatively, the dielectric layers 36 may be formed of oxides or nitrides, such as silicon oxide, silicon nitride, or the like. In some embodiments, different dielectric layers 36 are formed by the same material. However, the disclosure is not limited thereto. In some alternative embodiments, different dielectric layers 36 may be formed by different materials. The dielectric layers 36 may be formed by suitable fabrication techniques, such as spin-on coating, chemical vapor deposition (CVD), plasma-enhanced chemical vapor deposition (PECVD), or the like.

In some embodiments, a material of the conductive patterns 34 and the conductive vias 32 includes aluminum, titanium, copper, nickel, tungsten, or alloys thereof. The conductive patterns 34 and the conductive vias 32 may be formed by electroplating, deposition, and/or photolithography and etching. In some embodiments, the conductive patterns 34 and the underlying conductive vias 32 are formed simultaneously. It should be noted that the number of the dielectric layers 36, the number of the conductive patterns 34, and the number of the conductive vias 32 illustrated in FIG. 1 are merely for illustrative purposes, and the disclosure is not limited thereto. In some alternative embodiments, fewer or more layers of the dielectric layers 36, the conductive patterns 34, and/or the conductive vias 32 may be formed depending on the circuit design.

In some embodiments, the memory module MM includes a first memory device M1, a second memory device M2, and a third memory device M3. In some embodiments, the integrated circuit IC includes a first region R1 and a second region R2 adjacent to the first region R1. In some embodiments, the first region R1 is immediately adjacent to the second region R2. However, the disclosure is not limited thereto. In some alternative embodiments, the first region R1 is spatially separated from the second region R2 with other metal routings therebetween. The first memory device M1 and the third memory device M3 are located in the first region R1 while the second memory device M2 is located in the second region R2. For example, the second memory device M2 is aside the first memory device M1. On the other hand, the third memory device M3 is above the first memory device M1. As illustrated in FIG. 1, the memory module MM is embedded in the interconnect structure 30. For example, the memory module MM is embedded in the dielectric layers 36. In some embodiments, the first memory device M1 and the second memory device M2 are embedded in the same dielectric layer 36. Meanwhile, the first memory device M1 and the third memory device M3 are embedded in different dielectric layers 36. Moreover, the second memory device M2 and the third memory device M3 are also embedded in different dielectric layers 36. For example, the first memory device M1 and the second memory device M2 are embedded in one of the dielectric layers 36 and the third memory device M3 is embedded in another one of the dielectric layers 36 that is directly stacked on the one of the dielectric layers 36. In some embodiments, each of the first memory device M1, the second memory device M2, and the third memory device M3 can occupy one or multiple dielectric layers. In some embodiments, the first memory device M1, the second memory device M2, and the third memory device M3 are different types of memory devices. In some embodiments, the first memory device M1, the second memory device M2, and the third memory device M3 includes Non-Volatile Memory (NVM) device, high density cache device, One-time programmable (OTP) device, neuromorphic computing device, or the like. In some embodiments, examples of the NVM device include Resistive Random Access Memory (RRAM) device, Magnetoresistive Random Access Memory (MRAM) device, Phase Change Random Access Memory (PCRAM), Ferroelectric Random Access Memory (FeRAM) device, or the like. On the other hand, examples of the high density cache device include Dynamic Random Access Memory (DRAM) device, Static Random Access Memory (SRAM) device, or the like. In some embodiments, the first memory device M1, the second memory device M2, and the third memory device M3 may be selected from the devices listed above as long as the first memory device M1, the second memory device M2, and the third memory device M3 are different types of memory devices. The formation method and the structure of the memory module MM will be described in detail later.

As illustrated in FIG. 1, the passivation layer 50, the conductive pads 70, the post-passivation layer 60, and the conductive terminals 80 are sequentially formed on the interconnect structure 30. In some embodiments, the passivation layer 50 is disposed on the topmost dielectric layer 36 and the topmost conductive patterns 34. In some embodiments, the passivation layer 50 has a plurality of openings partially exposing each topmost conductive pattern 34. In some embodiments, the passivation layer 50 is a silicon oxide layer, a silicon nitride layer, a silicon oxynitride layer, or a dielectric layer formed by other suitable dielectric materials. The passivation layer 50 may be formed by suitable fabrication techniques, such as high-density-plasma chemical vapor deposition (HDP-CVD), PECVD, or the like.

In some embodiments, the conductive pads 70 are formed over the passivation layer 50. In some embodiments, the conductive pads 70 extend into the openings of the passivation layer 50 to be in direct contact with the topmost conductive patterns 34. That is, the conductive pads 70 are electrically connected to the interconnect structure 30. In some embodiments, the conductive pads 70 include aluminum pads, copper pads, aluminum copper pads, titanium pads, nickel pads, tungsten pads, or other suitable metal pads. The conductive pads 70 may be formed by, for example, electroplating, deposition, and/or photolithography and etching. It should be noted that the number and the shape of the conductive pads 70 illustrated in FIG. 1 are merely for illustrative purposes, and the disclosure is not limited thereto. In some alternative embodiments, the number and the shape of the conductive pad 70 may be adjusted based on demand.

In some embodiments, the post-passivation layer 60 is formed over the passivation layer 50 and the conductive pads 70. In some embodiments, the post-passivation layer 60 is formed on the conductive pads 70 to protect the conductive pads 70. In some embodiments, the post-passivation layer 60 has a plurality of contact openings partially exposing each conductive pad 70. The post-passivation layer 60 may be a polyimide layer, a PBO layer, or a dielectric layer formed by other suitable polymers. In some embodiments, the post-passivation layer 60 is formed by suitable fabrication techniques, such as HDP-CVD, PECVD, or the like.

As illustrated in FIG. 1, the conductive terminals 80 are formed over the post-passivation layer 60 and the conductive pads 70. In some embodiments, the conductive terminals 80 extend into the contact openings of the post-passivation layer 60 to be in direct contact with the corresponding conductive pad 70. That is, the conductive terminals 80 are electrically connected to the interconnect structure 30 through the conductive pads 70. In some embodiments, the conductive terminals 80 are conductive pillars, conductive posts, conductive balls, conductive bumps, or the like. In some embodiments, a material of the conductive terminals 80 includes a variety of metals, metal alloys, or metals and mixture of other materials. For example, the conductive terminals 80 may be made of aluminum, titanium, copper, nickel, tungsten, tin, and/or alloys thereof. The conductive terminals 80 are formed by, for example, deposition, electroplating, screen printing, or other suitable methods. In some embodiments, the conductive terminals 80 are used to establish electrical connection with other components (not shown) subsequently formed or provided.

As mentioned above, the first memory device M1, the second memory device M2, and the third memory device M3 can be different types of memory devices. Taking NVM device, high density cache device, and OTP device respectively as the first memory device M1, the second memory device M2, and the third memory device M3 as an example, the formation method and the structure of the memory module MM will be described below in conjunction with FIG. 2A to FIG. 2U.

Figure 2A:
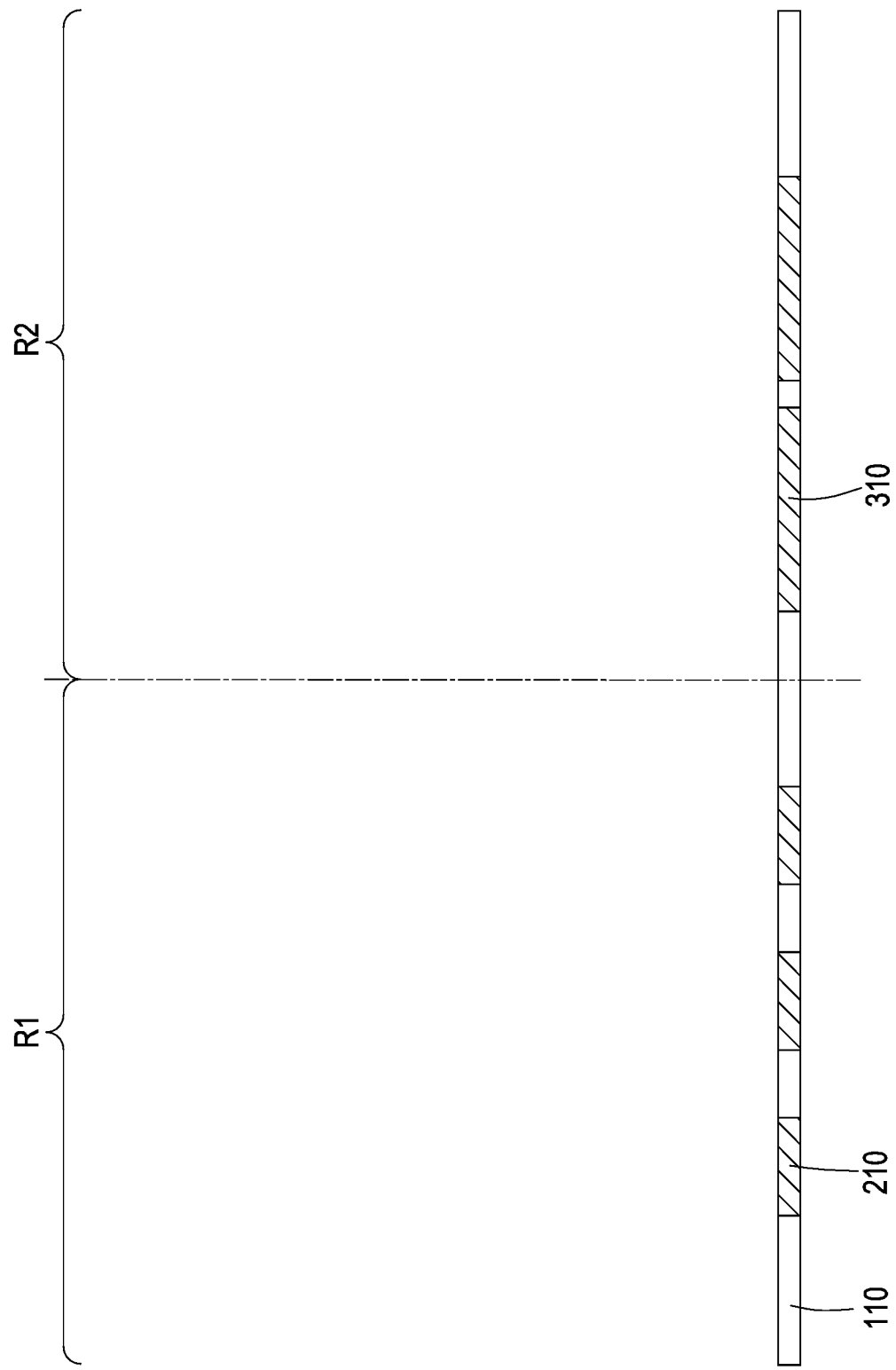
FIG. 2A to FIG. 2U are cross-sectional views illustrating various stages of a manufacturing method of the memory module in FIG. 1 in accordance with some embodiments of the disclosure.
Figure 2D:
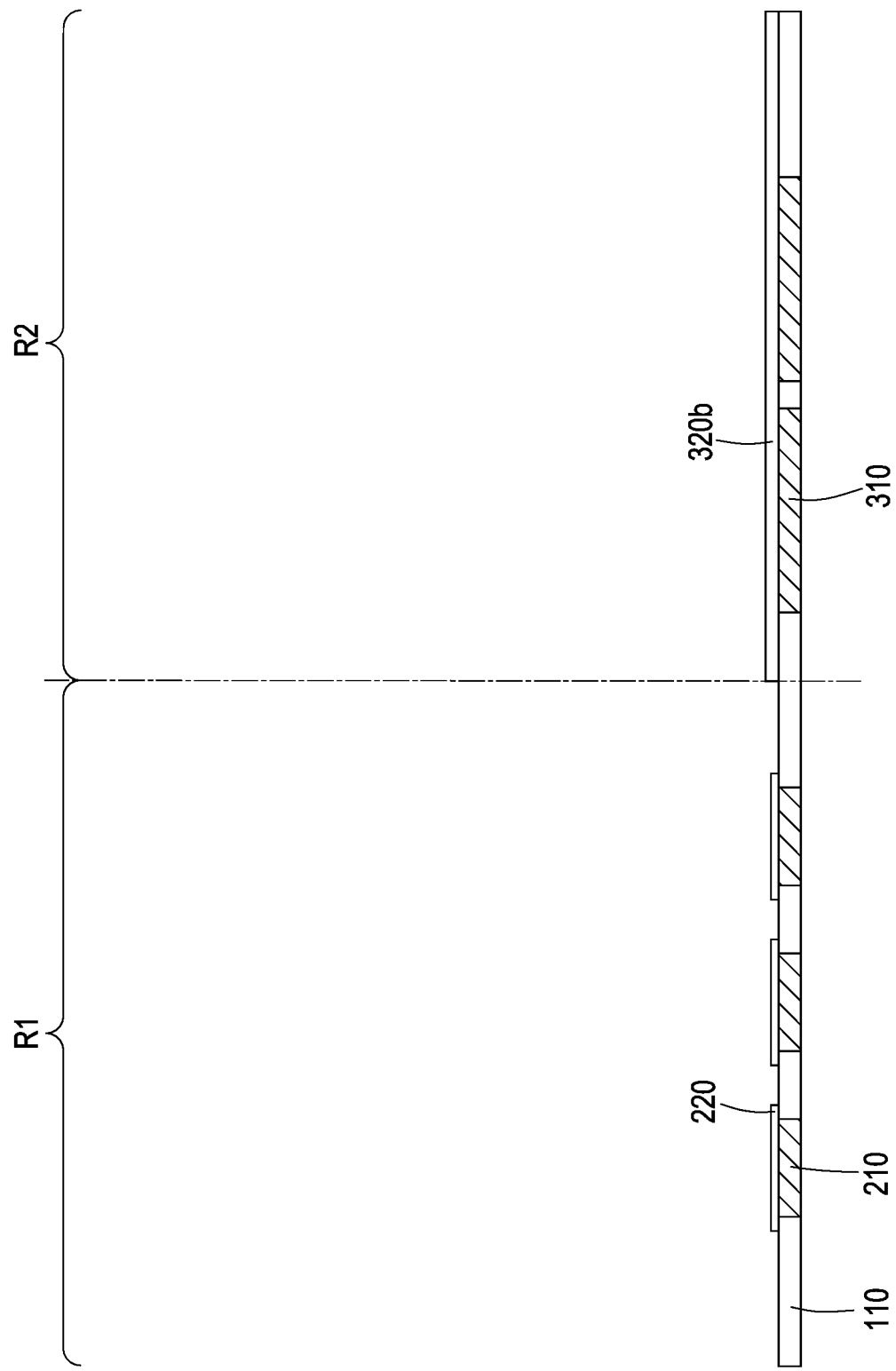
Figure 2E:
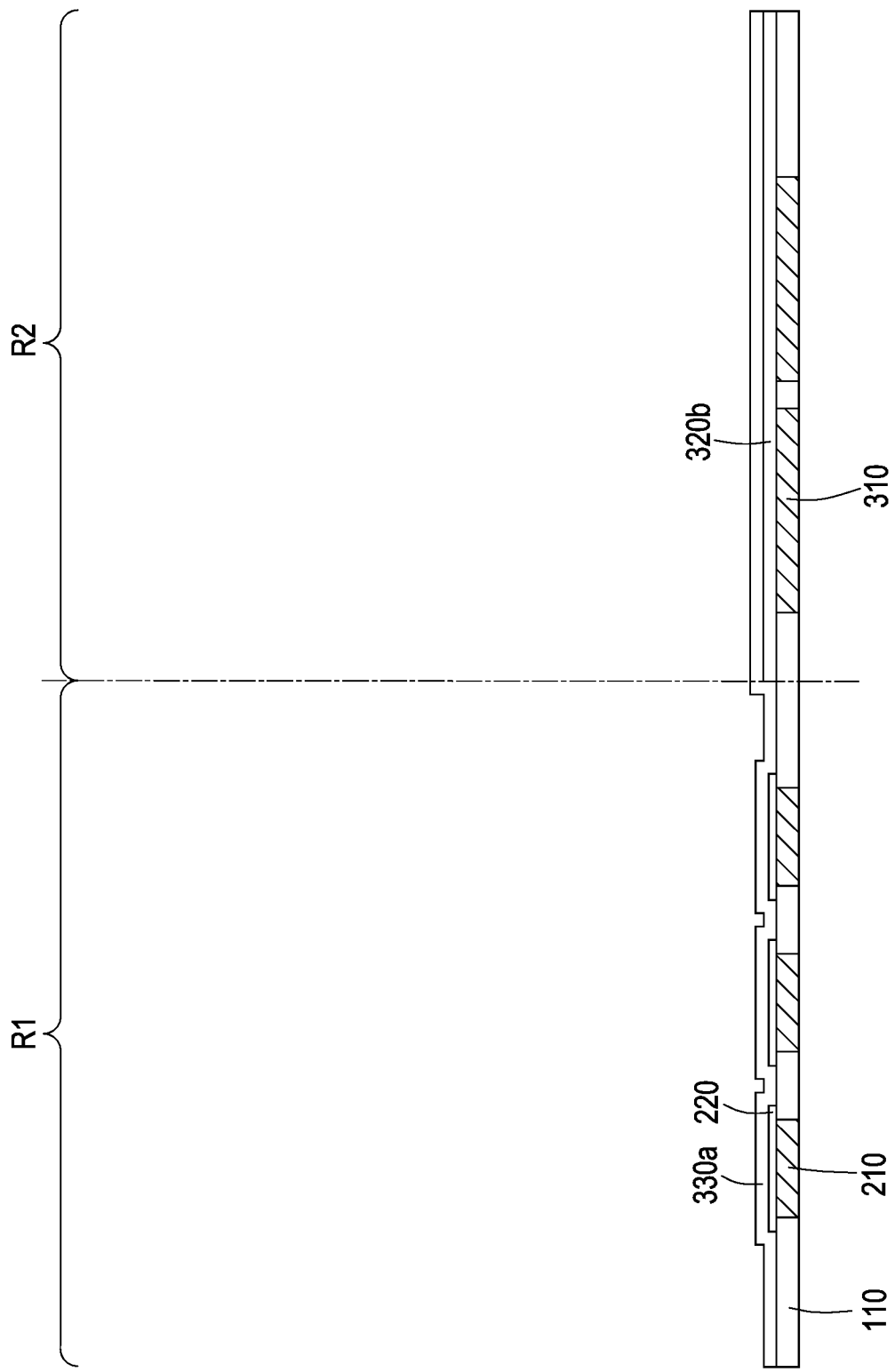
Figure 2F:
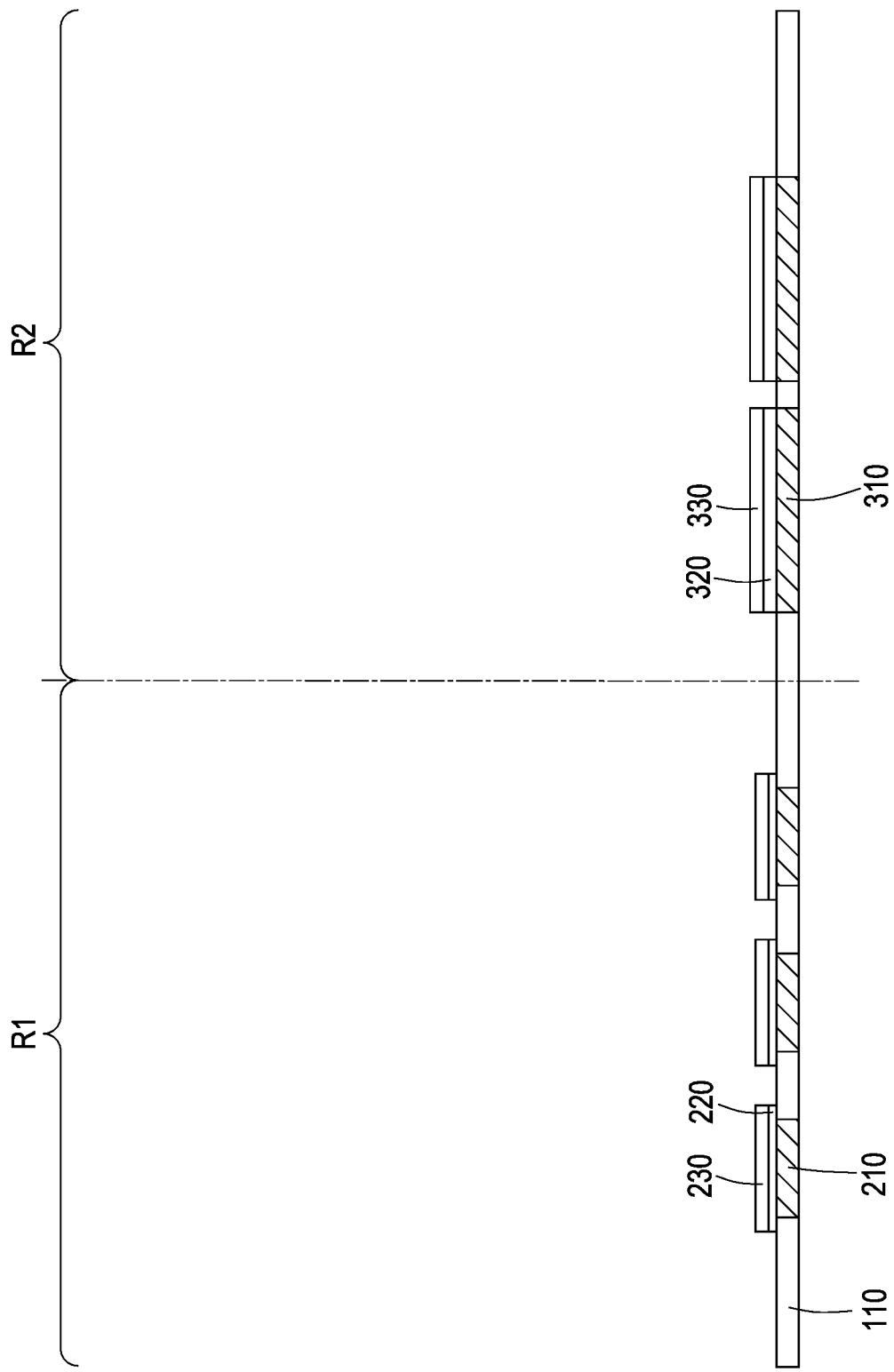
Figure 2I:
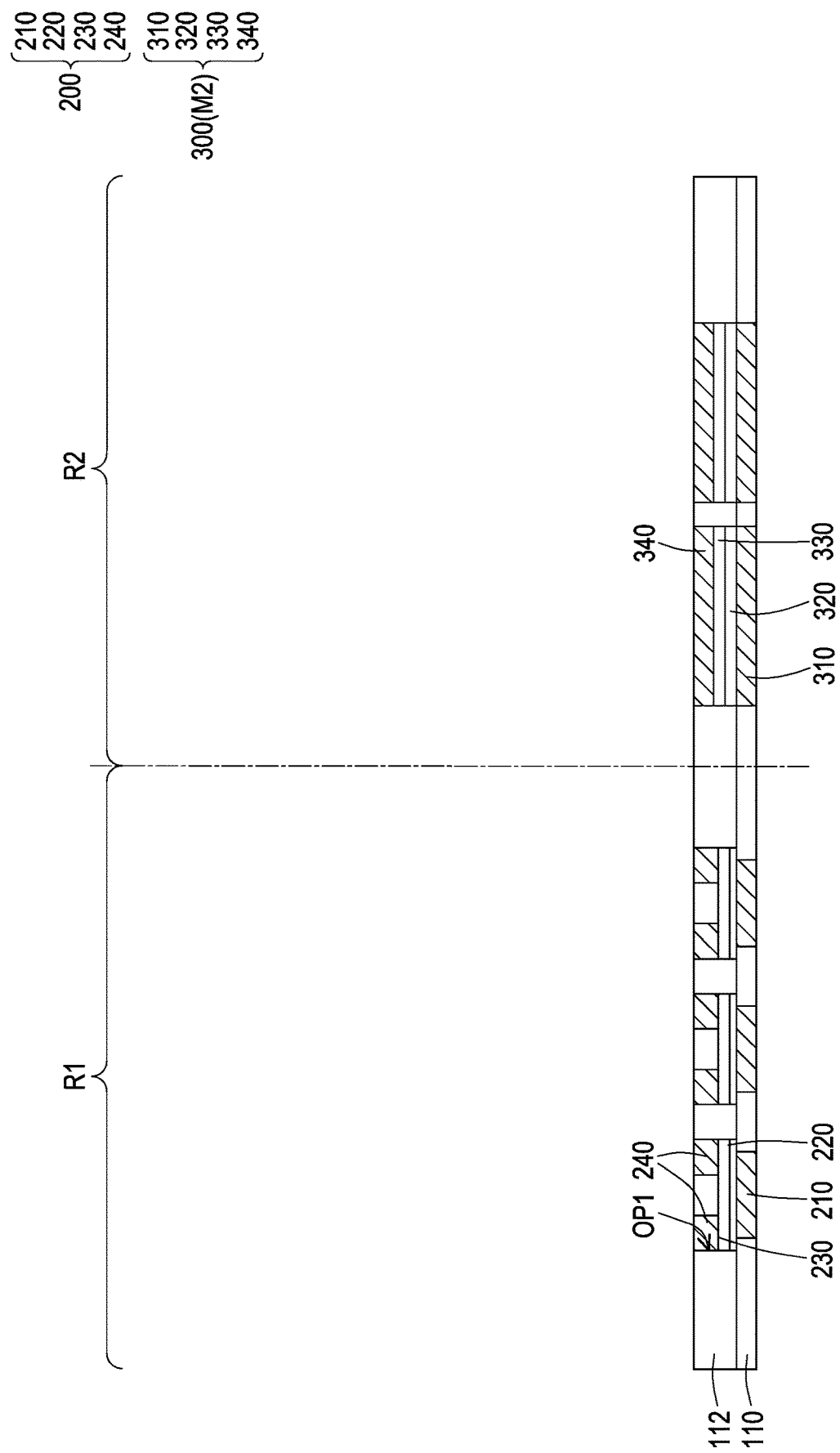
Figure 2J:
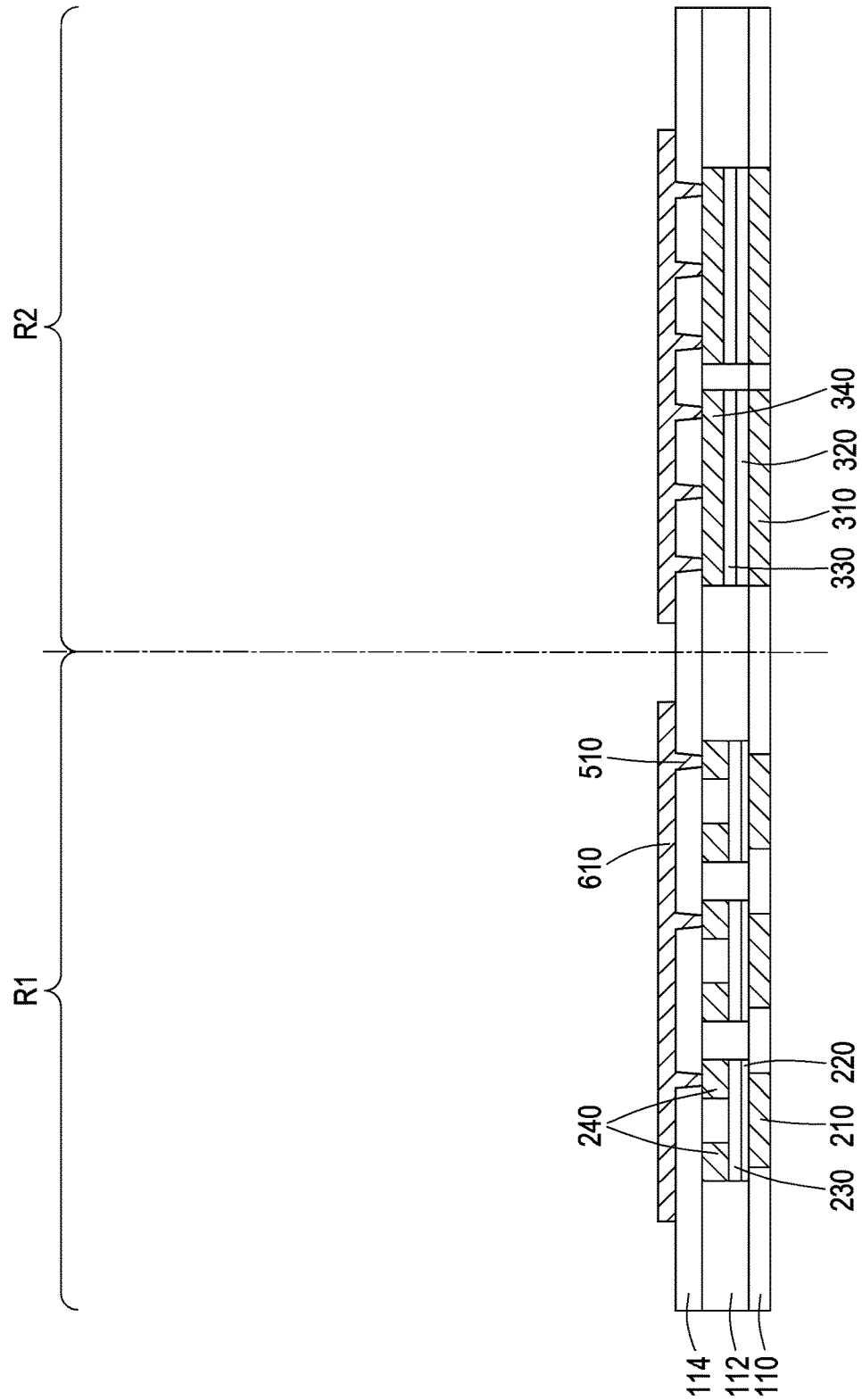
Figure 2K:
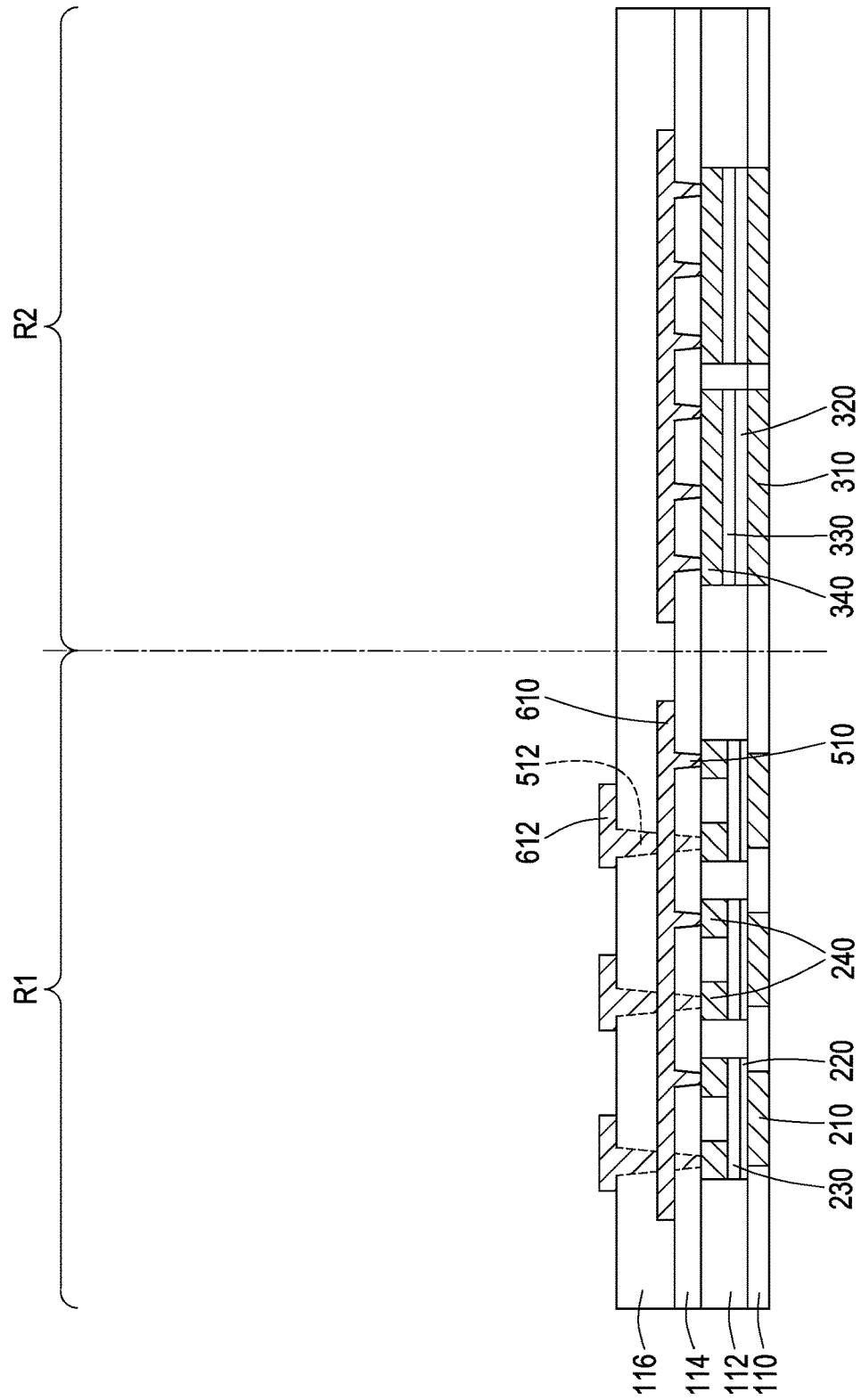
Figure 2L:
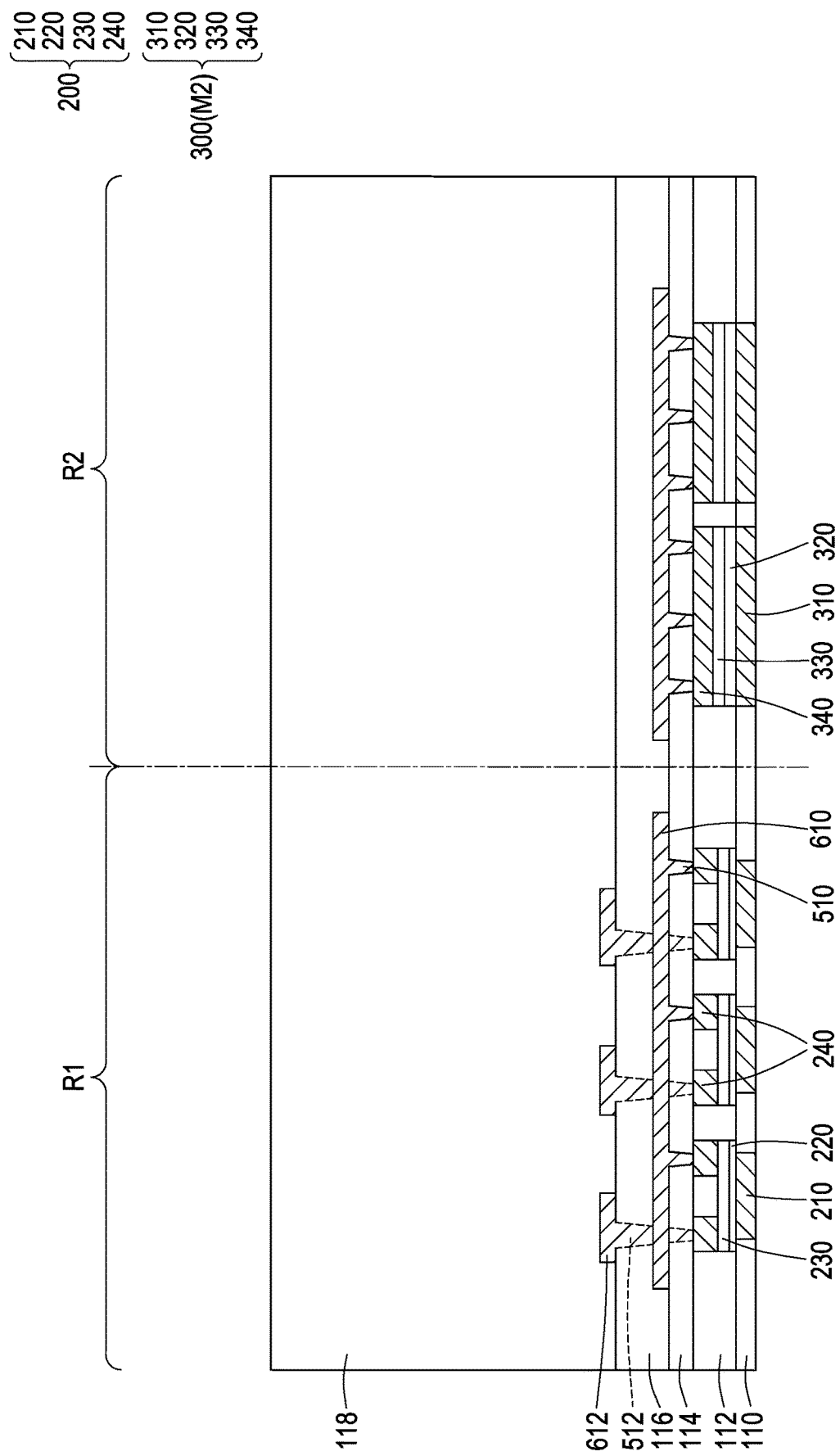
Figure 2M:
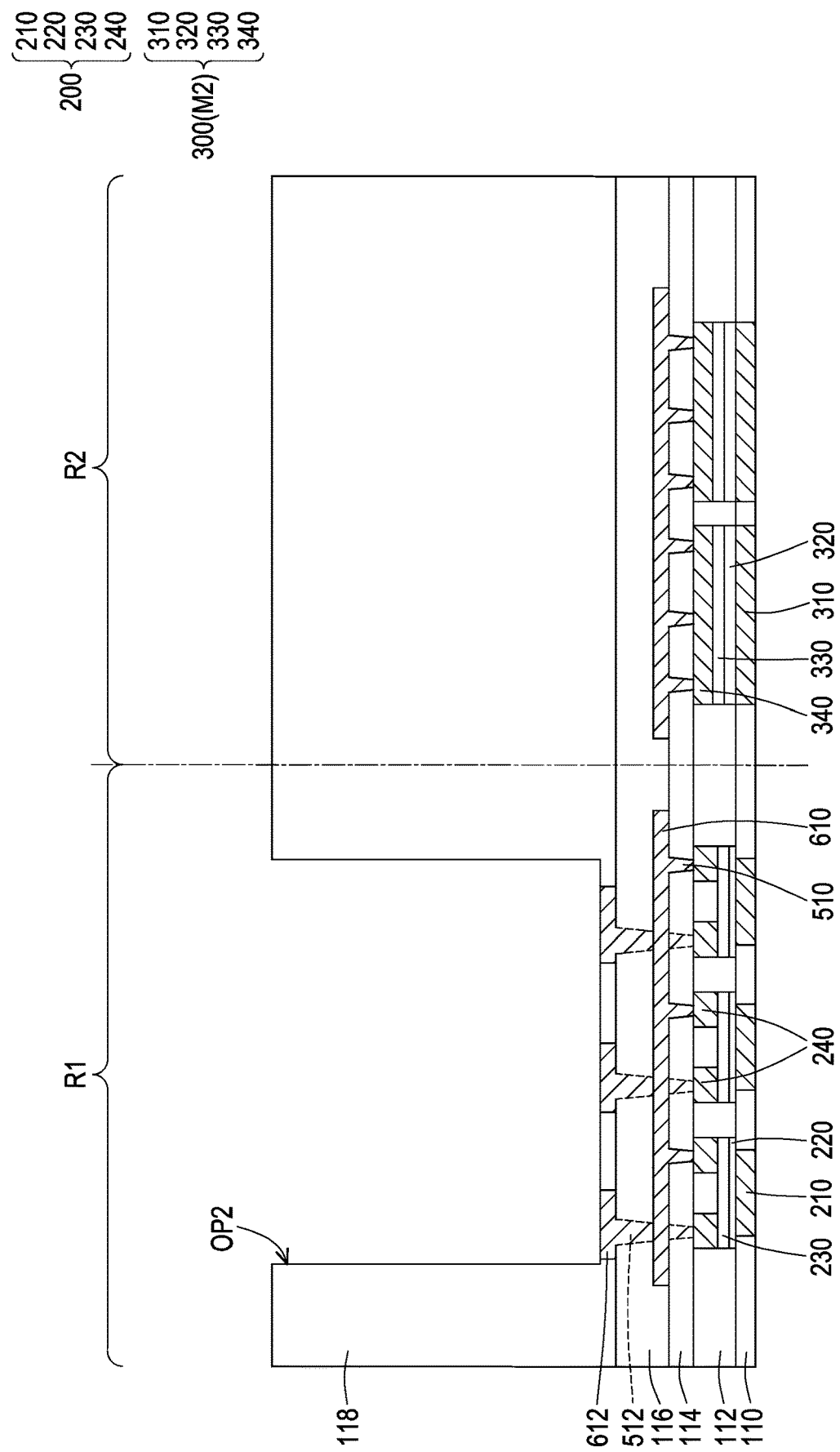
Figure 2N:
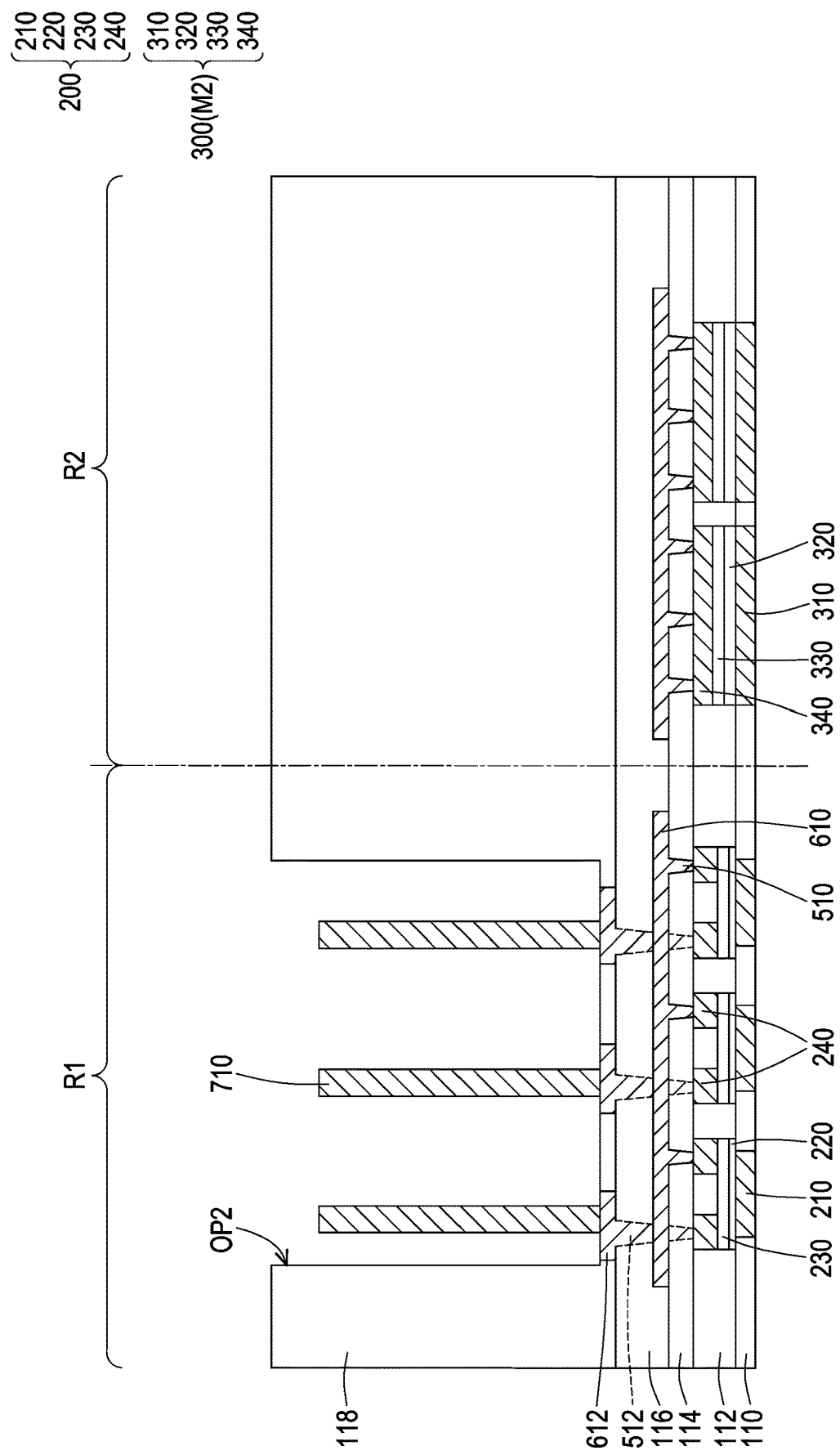
Figure 20:
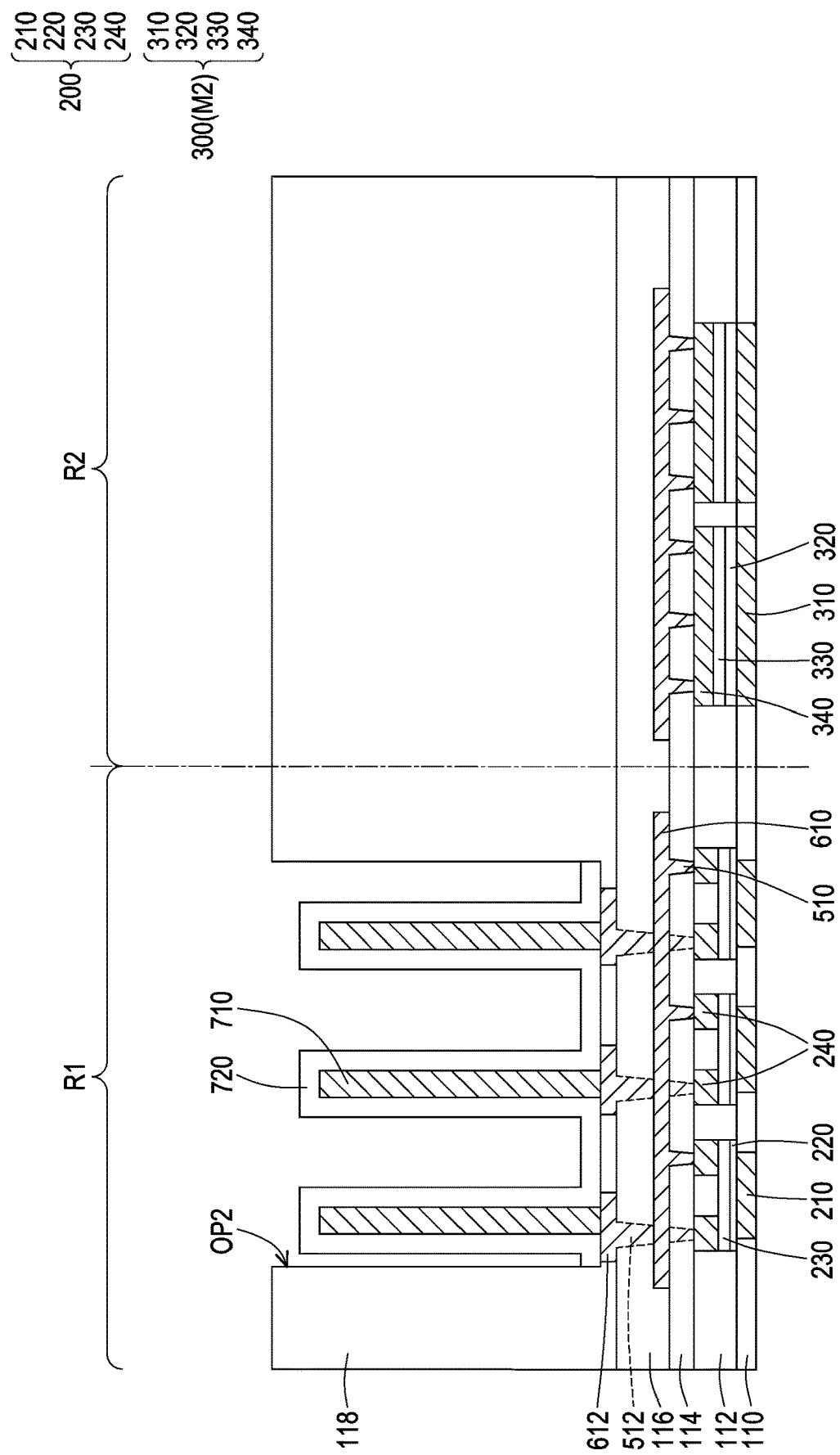
Figure 2P:
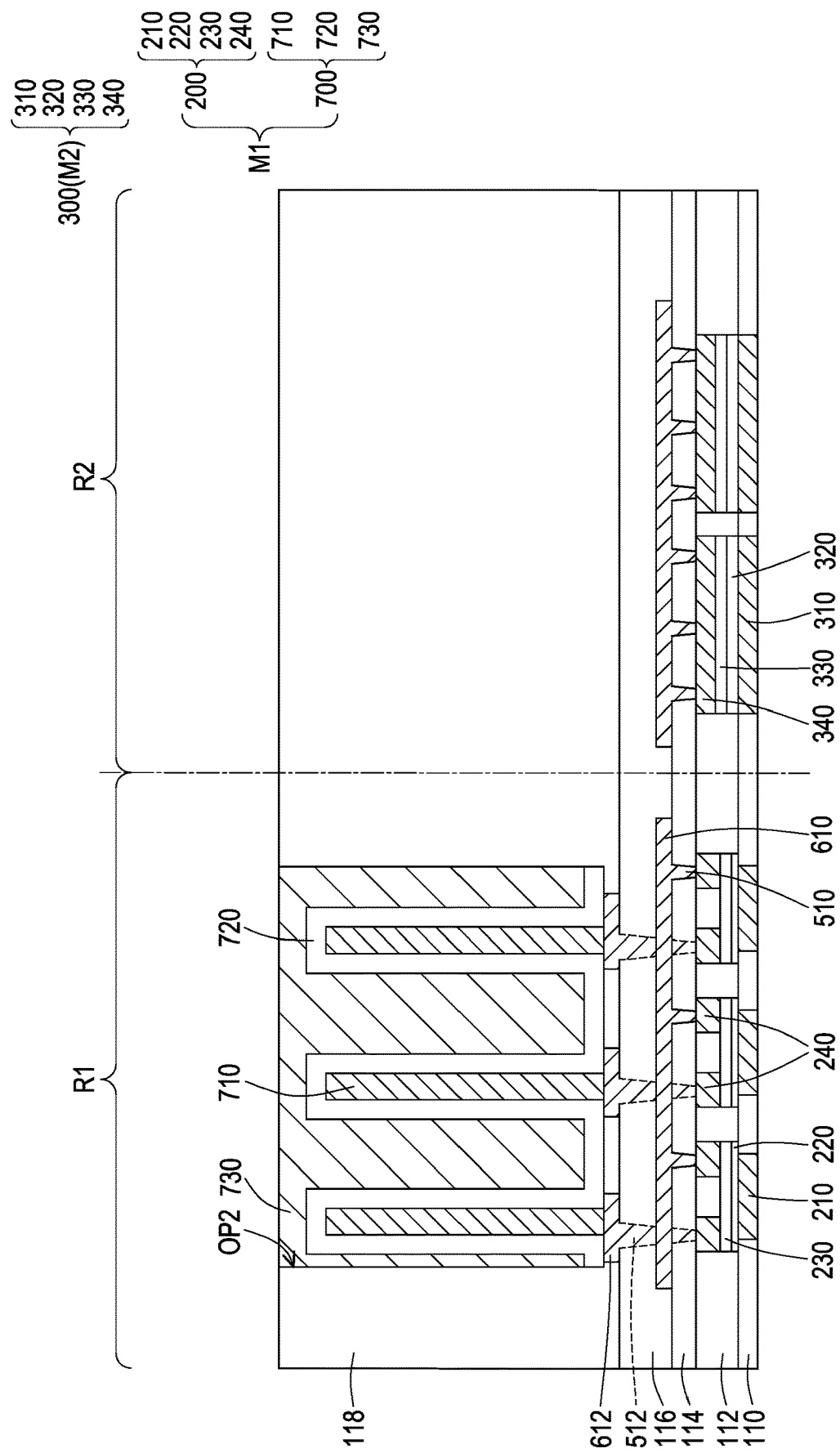
Figure 2Q:
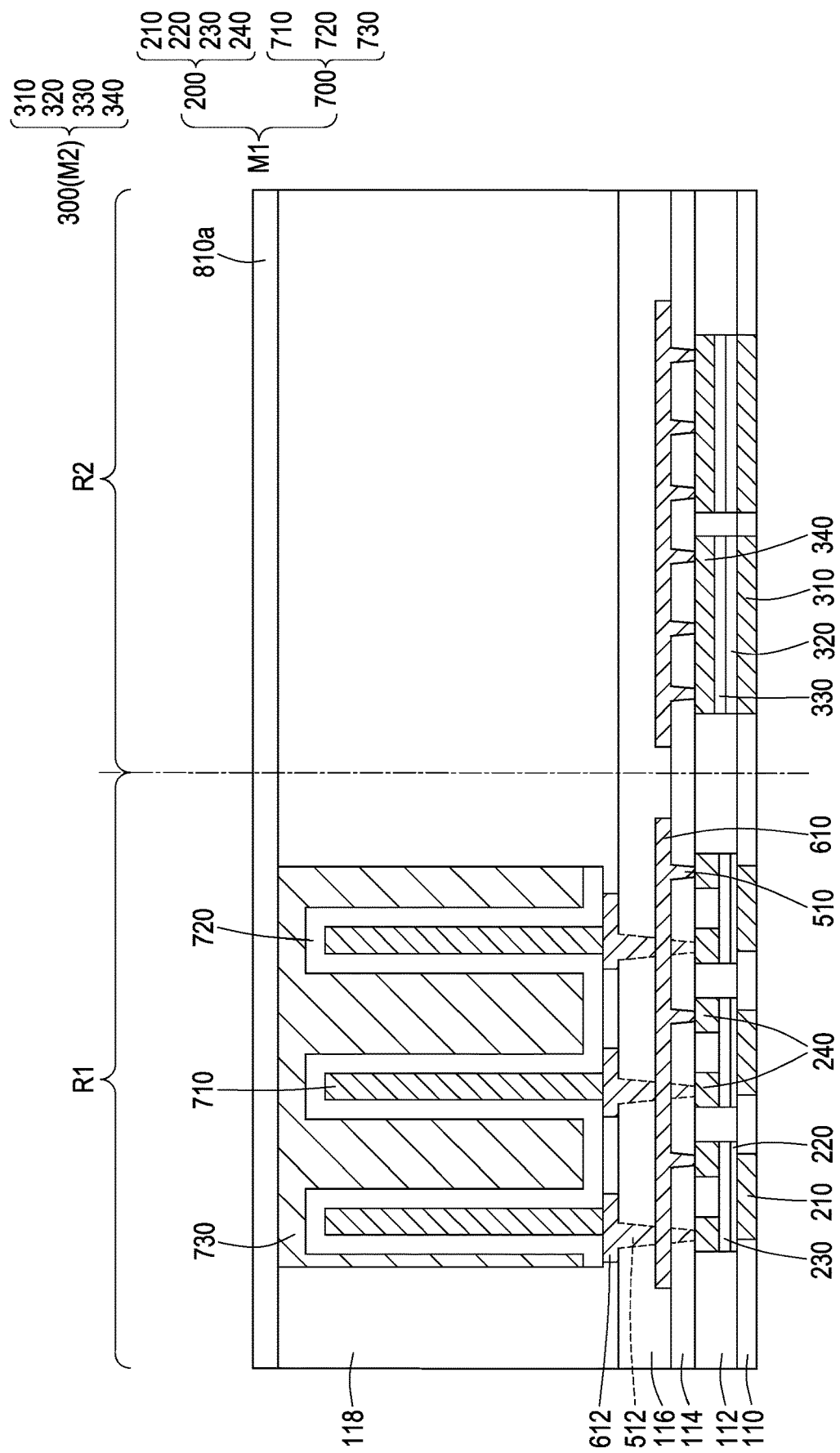
Figure 2R:
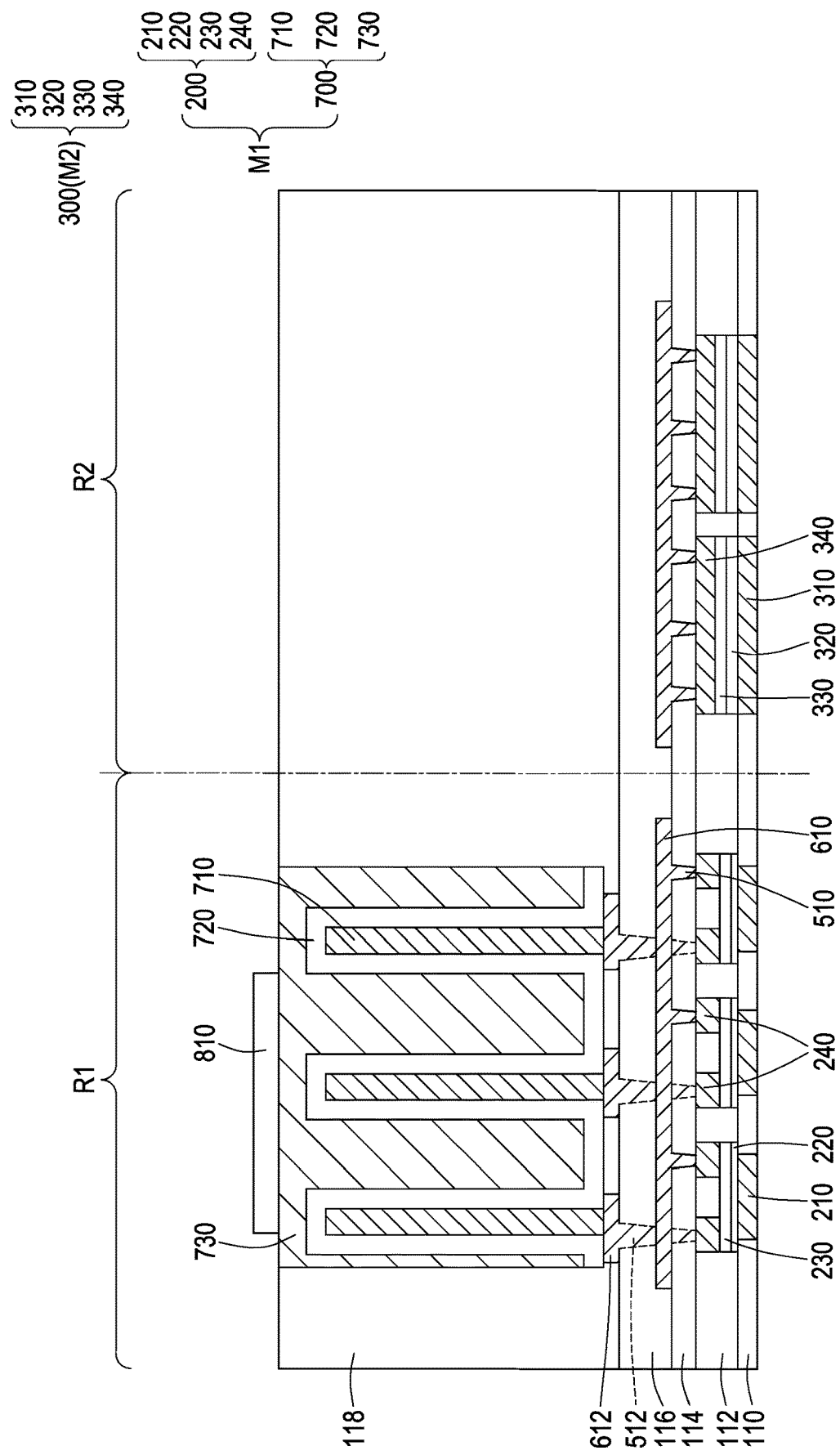
Figure 2S:
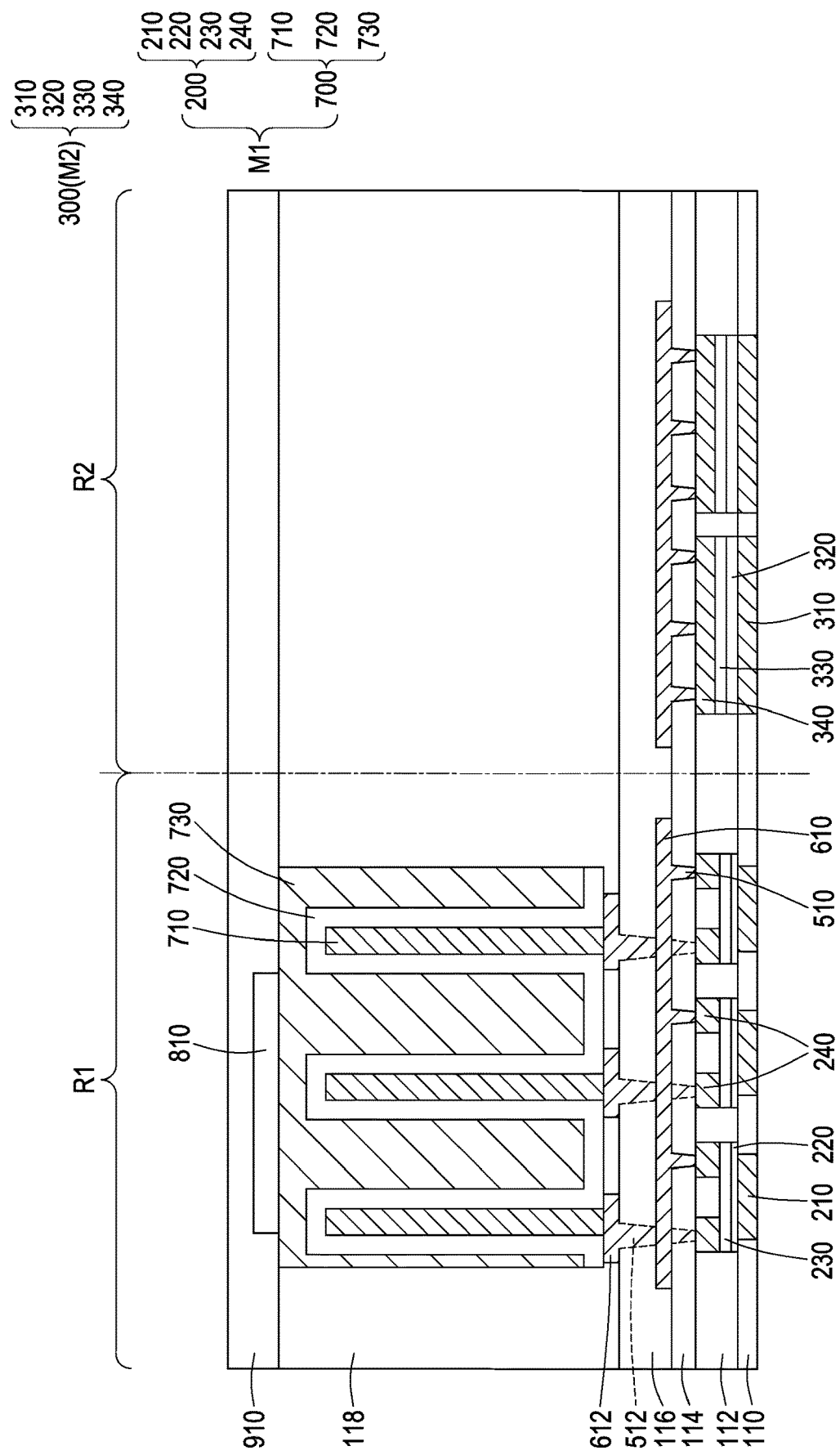
Figure 2T:
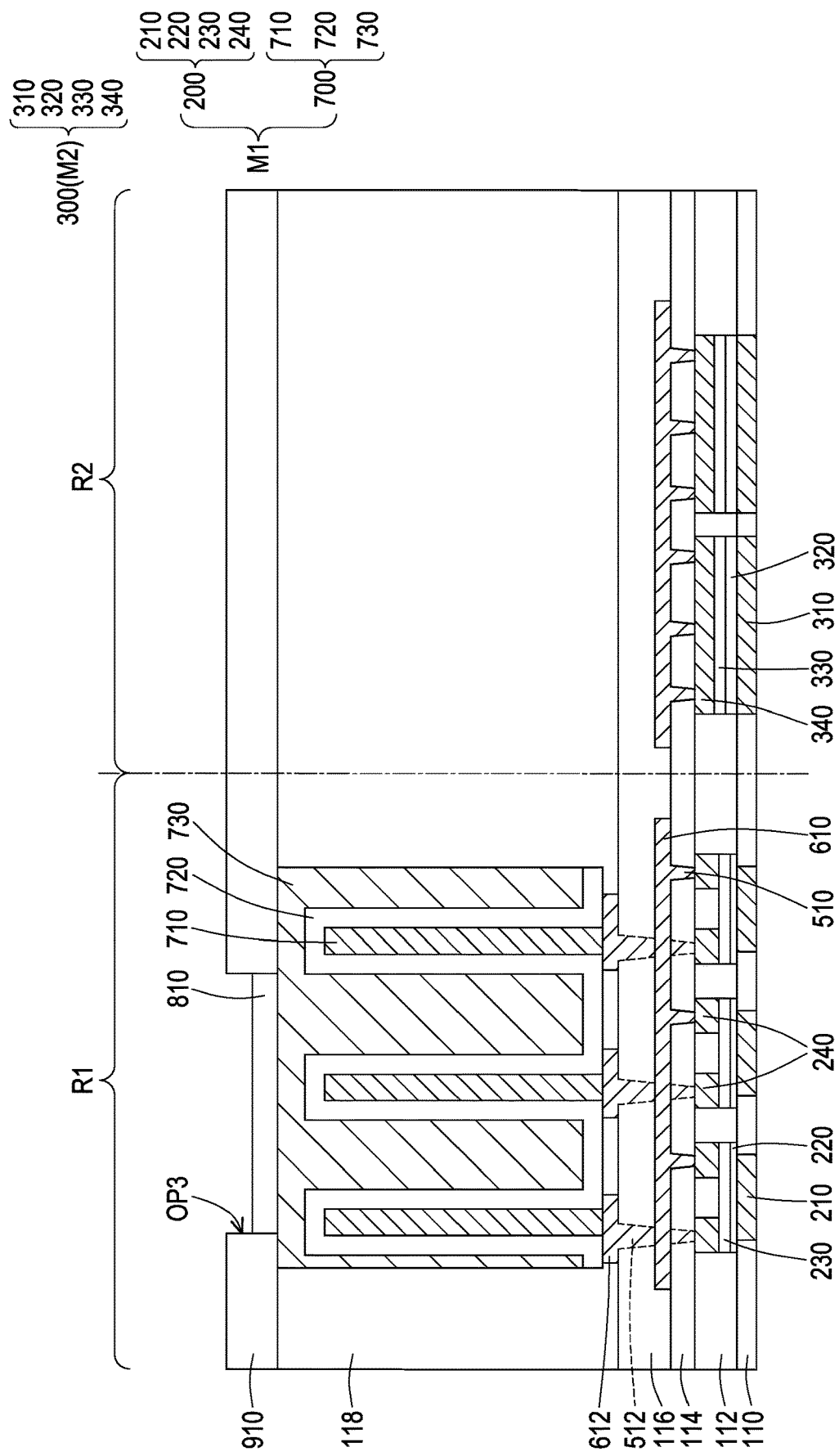
Figure 2U:
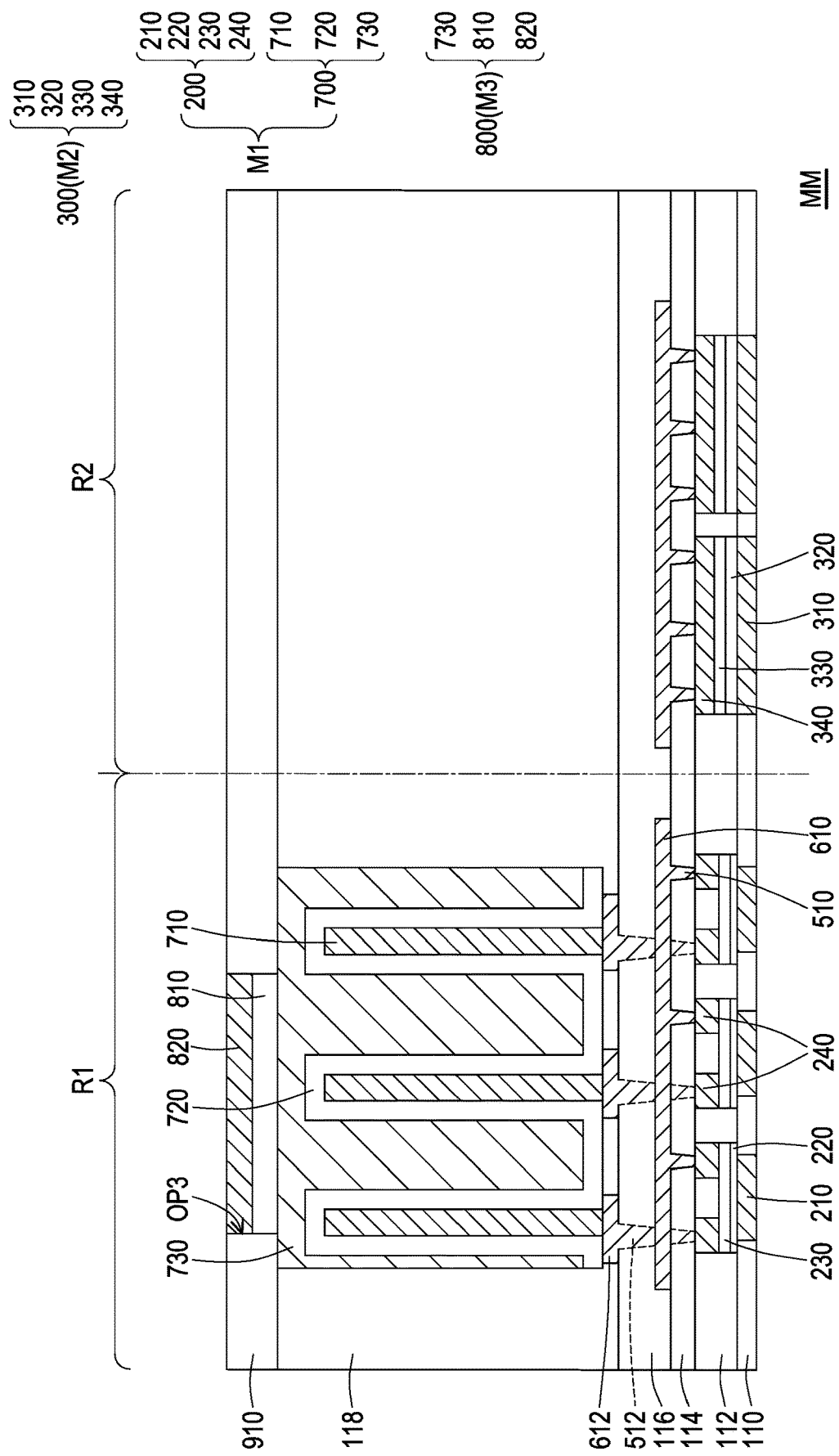

FIG. 2A to FIG. 2U are cross-sectional views illustrating various stages of a manufacturing method of the memory module MM in FIG. 1 in accordance with some embodiments of the disclosure.

Referring to FIG. 2A, a sub-dielectric layer 110 is provided. In some embodiments, the sub-dielectric layer 110 is part of one of the dielectric layers 36 of the interconnect structure 30 in FIG. 1, so the detailed description thereof is omitted herein. In some embodiments, a plurality of gate electrodes 210 and a plurality of bottom electrodes 310 are formed in the sub-dielectric layer 110. For example, the gate electrodes 210 and the bottom electrodes 310 are embedded in the sub-dielectric layer 110. In some embodiments, the gate electrodes 210 are formed in the first region R1 while the bottom electrodes 310 are formed in the second region R2. In some embodiments, the gate electrodes 210 and the bottom electrodes 310 are made of a metallic material (such as silver, aluminum, copper, tungsten, nickel, titanium, tantalum, tungsten, zirconium, hafnium, cobalt, alloys thereof, combinations thereof, or the like), a metal compound (such as titanium nitride, tantalum nitride, metal silicide, combinations thereof, or the like), polycrystalline silicon, doped silicon, or the like.

In some embodiments, the gate electrodes 210 and the bottom electrodes 310 are formed simultaneously during a same step. In some embodiments, the gate electrodes 210 and the bottom electrodes 310 are formed by the following steps. First, the sub-dielectric layer 110 is patterned to form a plurality of openings (not shown) in the sub-dielectric layer 110. In some embodiments, the sub-dielectric layer 110 is patterned through a photolithography and etching process. The etching process includes, for example, an anisotropic etching process such as dry etch or an isotropic etching process such as wet etch. In some embodiments, the etchant for the wet etch includes a combination of hydrogen fluoride (HF) and ammonia ($NH_3$), a combination of HF and tetramethylammonium hydroxide (TMAH), or the like. On the other hand, the dry etch process includes, for example, reactive ion etch (RIE), inductively coupled plasma (ICP) etch, electron cyclotron resonance (ECR) etch, neutral beam etch (NBE), and/or the like. After the sub-dielectric layer 110 is patterned to form the openings, a gate electrode material (not shown) is deposited on the patterned sub-dielectric layer 110 to fill up the openings. In some embodiments, the gate electrode material is deposited through atomic layer deposition (ALD), CVD, physical vapor deposition (PVD), plating, or the like. Thereafter, a portion of the gate electrode material is removed until the sub-dielectric layer 110 is exposed, so as to form the gate electrodes 210 and the bottom electrodes 310. In some embodiments, the portion of the gate electrode material is removed by a mechanical grinding process, a chemical mechanical polishing (CMP) process, or the like. In some embodiments, since the gate electrodes 210 and the bottom electrodes 310 are formed simultaneously during the same step, the gate electrodes 210 and the bottom electrodes 310 are made of a same material and are located at a same level height. As illustrated in FIG. 2A, a top surface of the sub-dielectric layer 110, top surfaces of the gate electrodes 210, and top surfaces of the bottom electrodes 310 are substantially coplanar.

Referring to FIG. 2B, a plurality of gate dielectric layers 220 is formed over the sub-dielectric layer 110 and the gate electrodes 210. For example, the gate dielectric layers 220 are formed in the first region R1 and are not formed in the second region R2. In some embodiments, the gate dielectric layers 220 include silicon oxide, silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. In some embodiments, the gate dielectric layers 220 include metal oxides, metal nitrides, metal silicates, transition metal-oxides, transition metal-nitrides, transition metal-silicates, oxynitrides of metals, metal aluminates, or combinations thereof. For example, the gate dielectric layers 220 include hafnium oxide ($HfO_2$), hafnium silicon oxide (HfSiO), hafnium silicon oxynitride (HfSiON), hafnium tantalum oxide (HfTaO), hafnium lanthanum oxide (HfLaO), hafnium titanium oxide (HfTiO), hafnium zirconium oxide (HfZrO), zirconium silicate, zirconium aluminate, silicon nitride, silicon oxynitride, zirconium oxide, titanium oxide, aluminum oxide ($Al_2O_3$), hafnium dioxide-alumina ($HfO_2$—$Al_2O_3$) alloy, and/or combinations thereof. The gate dielectric layers 220 may be formed by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. As illustrated in FIG. 2B, a plurality of gate dielectric layers 220 is shown. However, the disclosure is not limited thereto. In some alternative embodiments, a single layer of the gate dielectric layer 220 may be formed to extend throughout the first region R1.

Referring to FIG. 2C, a first storage material layer 320a is conformally formed over the sub-dielectric layer 110, the gate electrodes 210, the gate dielectric layers 220, and the bottom electrodes 310. In some embodiments, the first storage material layer 320a includes amorphous oxide semiconductor materials. In some embodiments, examples of the amorphous oxide semiconductor material include indium gallium zinc oxide (InGaZnO; IGZO), tungsten-doped indium oxide (InWO), indium zinc oxide (InZnO), indium tin oxide (InSnO), Zinc oxide (ZnO), gallium oxide (GaOx), indium oxide (InOx), aluminum zinc oxide (AZO), combinations thereof, or the like. In some embodiments, the first storage material layer 320a is deposited by a suitable deposition process, such as CVD, PECVD, flowable chemical vapor deposition (FCVD), HDP-CVD, sub-atmospheric chemical vapor deposition (SACVD), PVD, or ALD.

Referring to FIG. 2C and FIG. 2D, a portion of the first storage material layer 320a is removed to form an intermediate storage material layer 320b. In some embodiments, the first storage material layer 320a located in the first region R1 is removed and the remaining first storage material layer 320a in the second region R2 forms the intermediate storage material layer 320b. In some embodiments, the portion of the first storage material layer 320a is removed through a photolithography and etching process or other suitable processes.

Referring to FIG. 2E, a second storage material layer 330a is conformally formed over the sub-dielectric layer 110, the gate electrodes 210, the gate dielectric layers 220, the bottom electrodes 310, and the intermediate storage material layer 320b. In some embodiments, the second storage material layer 330a includes amorphous oxide semiconductor materials. Examples of the amorphous oxide semiconductor material include IGZO, InWO, InZnO, InSnO, ZnO, GaOx, InOx, AZO, combinations thereof, or the like. In some embodiments, the second storage material layer 330a is deposited by a suitable deposition process, such as CVD, PECVD, FCVD, HDP-CVD, SACVD, PVD, or ALD. As mentioned above, the first storage material layer 320a also includes amorphous oxide semiconductor materials. In some embodiments, the second storage material layer 230a includes amorphous oxide semiconductor materials with different oxygen vacancy concentration from that of the first storage material layer 320a, which can be achieved by composition, doping, and/or treatment control. Therefore, in some embodiments, the first storage material layer 320a and the second storage material layer 330a are considered as being made of different materials. Although amorphous oxide semiconductor materials are utilized as examples for the materials of the first storage material layers 320a and the second storage material layer 330a, the disclosure is not limited thereto. In some alternative embodiments, the materials of the first storage material layers 320a and the second storage material layer 330a may respectively include a single or composite film of $HfO_2$, $Hr_{1-x}Zr_xO_2$, $ZrO_2$, $TiO_2$, $NiO$, $TaO_x$, $Cu_2O$, $Nb_2O_5$, $Al_2O_3$, $MoO_x$, $CoO$, $ZnO$, $WO_3$, $V_2O_5$, $Fe_3O_4$, $SrZrO_3$, $SrTiO_3$, $Pr_{1-x}Ca_xMnO_3$, $La_{1-x}Ca_xMnO$, or the like.

Referring to FIG. 2E and FIG. 2F, a portion of the second storage material layer 330a and a portion of the intermediate storage material layer 320b are removed to form a plurality of channel layers 230 over the gate electrodes 210 in the first region R1 and to form a plurality of first storage layers 320 and a plurality of second storage layers 330 on the bottom electrode 310 in the second region R2. For example, the remaining second storage material layer 230a that is located in the first region R1 constitutes the channel layers 230 and the remaining second storage material layer 230a that is located in the second region R2 constitutes the second storage layers 330. Meanwhile, the remaining intermediate storage material layer 320b constitutes the first storage layers 320. In other words, the channel layers 230 and the second storage layers 330 are made of a same material and are simultaneously formed during a same step. Please be noted that although the channel layers 230 and the second storage layers 330 are originated by the same layer (i.e. the second storage material layer 330a), due to the thickness difference between the layers underneath the channel layers 230 and the second storage layers 330 (i.e. the gate dielectric layers 220 underneath the channel layers 230 and the first storage layers 320 underneath the second storage layers 330), the channel layers 230 and the second storage layers 330 are located at different level heights. In some embodiments, the portion of the second storage material layer 330a and the portion of the intermediate storage material layer 320b are removed through a photolithography and etching process or other suitable processes. In some embodiments, the portion of the second storage material layer 330a and the portion of the intermediate storage material layer 320b are removed simultaneously during a same step.

As illustrated in FIG. 2F, sidewalls of each channel layer 230 are aligned with sidewalls of the corresponding gate dielectric layer 220. Meanwhile, the sidewalls of each channel layer 230 and the sidewalls of each gate dielectric layer 220 extend beyond sidewalls of the corresponding gate electrode 210. However, the disclosure is not limited thereto. In some alternative embodiments, sidewalls of each channel layer 230 are not aligned with sidewalls of the corresponding gate dielectric layer 220, but stay within sidewalls of the corresponding gate dielectric layer 220. On the other hand, sidewalls of each second storage layer 330 are aligned with sidewalls of the corresponding first storage layer 320 and sidewalls of the corresponding bottom electrode 310.

Referring to FIG. 2G, a sub-dielectric layer 112 is formed on the sub-dielectric layer 110, the gate dielectric layers 220, the channel layers 230, the first storage layers 320, and the second storage layers 330. For example, the sub-dielectric layer 112 covers the gate dielectric layers 220, the channel layers 230, the first storage layers 320, and the second storage layers 330. In some embodiments, a material and a formation method of the sub-dielectric layer 112 are similar to that of the sub-dielectric layer 110, so the detailed description thereof is omitted herein.

Referring to FIG. 2H, a plurality of openings OP1 is formed in the sub-dielectric layer 112. In the first region R1, the openings OP1 are formed near two ends of each channel layer 230. For example, the openings OP1 in the first region R1 expose two ends of each channel layer 230. In the second region R2, the openings OP1 are formed corresponding to the second storage layer 330. For example, the openings OP1 in the second region R2 expose an entire top surface of each second storage layer 330. In some embodiments, the openings OP1 are formed through a photolithography and etching process.

Referring to FIG. 2I, a plurality of source/drain regions 240 are formed in the openings OP1 of the first region R1 and a plurality of top electrodes 340 are formed in the openings OP1 of the second region R2. For example, the source/drain regions 240 fill up the openings OP1 of the sub-dielectric layer 112 in the first region R1 and the top electrodes 340 fill up the openings OP1 of the sub-dielectric layer 112 in the second region R2. As illustrated in FIG. 2I, each pair of the source/drain regions 240 is formed on two ends of the corresponding channel layer 230. On the other hand, each of the top electrodes 340 is formed on the corresponding second storage layer 330 to be in physical contact with the corresponding second storage layer 330. In some embodiments, sidewalls of each top electrode 340 is aligned with the sidewalls of the corresponding second storage layer 330, the sidewalls of the corresponding first storage layer 320, and the sidewalls of the corresponding bottom electrode 310. In some embodiments, the source/ drain regions 240 and the top electrodes 340 are made of a metallic material (such as silver, aluminum, copper, tungsten, nickel, titanium, tantalum, tungsten, zirconium, hafnium, cobalt, alloys thereof, combinations thereof, or the like), a metal compound (such as titanium nitride, tantalum nitride, metal silicide, combinations thereof, or the like), polycrystalline silicon, doped silicon, or the like.

In some embodiments, the source/drain regions 240 and the top electrodes 340 are formed simultaneously during a same step. In some embodiments, the source/drain regions 240 and the top electrodes 340 are formed by the following steps. Frist, a conductive material (not shown) is deposited on the sub-dielectric layer 112 to fill up the openings OP1. In some embodiments, the conductive material is deposited through ALD, CVD, PVD, plating, or the like. Thereafter, a portion of the conductive material is removed until the sub-dielectric layer 112 is exposed, so as to form the source/drain regions 240 and the top electrodes 340. In some embodiments, the portion of the conductive material is removed by a mechanical grinding process, a CMP process, or the like. As illustrated in FIG. 2I, a top surface of the sub-dielectric layer 112, top surfaces of the source/drain regions 240, and top surfaces of the top electrodes 340 are substantially coplanar.

In some embodiments, each gate electrode 210, each gate dielectric layer 220, each channel layer 230, and each pair of the source/drain regions 240 form a transistor 200 in the first region R1. As illustrated in FIG. 2I, each gate dielectric layer 220 and each channel layer 230 is disposed on the corresponding gate electrode 210. On the other hand, each pair of source/drain regions 240 is disposed on the corresponding channel layer 230. In some embodiments, the transistors 200 are embedded in the sub-dielectric layer 110 and the sub-dielectric layer 112. It should be noted that although three transistors 200 are shown in FIG. 2I, the disclosure is not limited thereto. In some alternative embodiments, the number of the transistors 200 may be adjusted depending on circuit design.

In some embodiments, each bottom electrode 310, each first storage layer 320, each second storage layer 330, and each top electrode 340 form a capacitor 300 in the second region R2. As illustrated in FIG. 2I, the bottom electrode 310, the first storage layer 320, the second storage layer 330, and the top electrode 340 are stacked in sequential order from bottom to top. In some embodiments, the capacitors 300 may be the second memory device M2 shown in FIG. 1. In some embodiments, each capacitor 300 may serve as a memory cell for the second memory device M2. For example, the first storage layers 320 and the second storage layers 330 may be utilized to store data. In some embodiments, the capacitors 300 are electrically connected to the transistor 40 in FIG. 1. That is, the capacitors 300 are connected to a FEOL transistor. Referring to FIG. 1 and FIG. 2I, the electrical connection between the capacitors 300 and the transistor 40 may be realized by electrically connecting the bottom electrodes 310 of the capacitors 300 (i.e. the second memory device M2) to the transistor 40 through the conductive patterns 34 and the conductive vias 32 located between these two elements. However, the disclosure is not limited thereto. In some alternative embodiments, the electrical connection between the capacitors 300 and the transistor 40 may be realized by electrically connecting the top electrode 340 of the capacitors 300 (i.e. the second memory device M2) to the transistor 40 through the conductive patterns 34 and the conductive vias 32. In some embodiments, the transistor 40 (i.e. the FEOL transistor) may serve as a selector for the second memory device M2. It should be noted that although two capacitors 300 are shown in FIG. 2I, the disclosure is not limited thereto. In some alternative embodiments, the number of the capacitors 300 may be adjusted depending on circuit design.

Referring to FIG. 2J, a sub-dielectric layer 114, a plurality conductive vias 510, and a plurality of conductive patterns 610 are formed on the sub-dielectric layer 112, the transistors 200, and the capacitors 300. In some embodiments, a material and a formation method of the sub-dielectric layer 114 are similar to that of the sub-dielectric layer 110, so the detailed description thereof is omitted herein. Similarly, materials and formation methods of the conductive vias 510 and the conductive patterns 610 are respectively similar to that of the conductive vias 32 and the conductive patterns 34 in FIG. 1, so the detailed descriptions thereof are omitted herein. In some embodiments, the conductive patterns 610 are disposed on the sub-dielectric layer 114. As illustrated in FIG. 2J, the conductive vias 510 located in the first region R1 penetrate through the sub-dielectric layer 114 to be in physical contact with some of the source/drain regions 240 of the transistors 200 (for example, the drain regions of the transistors 200), so as to render electrical connection between the conductive pattern 610 in the first region R1 and the transistors 200. Meanwhile, the conductive vias 510 located in the second region R2 penetrate through the sub-dielectric layer 114 to be in physical contact with the top electrodes 340 of the capacitors 300, so as to render electrical connection between the conductive pattern 610 in the second region R2 and the capacitors 300.

Referring to FIG. 2K, a sub-dielectric layer 116, a plurality conductive vias 512, and a plurality of conductive patterns 612 are formed on the sub-dielectric layer 114 and the conductive pattern 610. Please be noted that the conductive vias 512 are behind the conductive pattern 610 and exists in a different cross-sectional view, so the conductive vias 512 are denoted by dotted line. In some embodiments, a material and a formation method of the sub-dielectric layer 116 are similar to that of the sub-dielectric layer 110, so the detailed description thereof is omitted herein. Similarly, materials and formation methods of the conductive vias 512 and the conductive patterns 612 are respectively similar to that of the conductive vias 32 and the conductive patterns 34 in FIG. 1, so the detailed descriptions thereof are omitted herein. In some embodiments, the conductive vias 512 and the conductive patterns 612 are formed in the first region R1. For example, the conductive vias 512 and the conductive patterns 612 are not formed in the second region R2. As illustrated in FIG. 2K, the conductive patterns 612 are disposed on the sub-dielectric layer 116. Meanwhile, the conductive vias 512 penetrate through the sub-dielectric layer 116 and the sub-dielectric layer 114 to be in physical contact with some of the source/drain regions 240 of the transistors 200 (for example, the source regions of the transistors 200).

Referring to FIG. 2L, a sub-dielectric layer 118 is formed on the sub-dielectric layer 116 and the conductive patterns 612. In some embodiments, a material and a formation method of the sub-dielectric layer 118 are similar to that of the sub-dielectric layer 110, so the detailed description thereof is omitted herein.

Referring to FIG. 2M, an opening OP2 is formed in the sub-dielectric layer 118. In some embodiments, the opening OP2 is formed in the first region R1. For example, the opening OP2 is formed to expose the conductive patterns 612 in the first region R1. In some embodiments, the opening OP2 is formed through a photolithography and etching process.

Referring to FIG. 2N, a plurality of electrodes 710 is formed in the opening OP2 of the sub-dielectric layer 118. For example, the electrodes 710 are formed on the conductive patterns 612. In some embodiments, the electrodes 710 are made of a metallic material (such as silver, aluminum, copper, tungsten, nickel, titanium, tantalum, tungsten, zirconium, hafnium, cobalt, alloys thereof, combinations thereof, or the like), a metal compound (such as titanium nitride, tantalum nitride, metal silicide, combinations thereof, or the like), or the like. In some embodiments, the electrodes 710 are formed through ALD, CVD, PVD, plating, or the like. As illustrated in FIG. 2N, each electrode 710 takes the form of a pillar. However, the disclosure is not limited thereto. In some alternative embodiments, the electrodes 710 may have other shapes or geometries. In some embodiments, a height of each electrode 710 is less than a thickness of the sub-dielectric layer 118.

Referring to FIG. 2O, a storage layer 720 is conformally formed in the opening OP2. For example, the storage layer 720 is formed to cover the conductive patterns 612 and the electrodes 710. In some embodiments, the storage layer 720 includes a single or composite film of $HfO_2$, $Hr_{1-x}Zr_xO_2$, $ZrO_2$, $TiO_2$, NiO, $TaO_x$, $Cu_2O$, $Nb_2O_5$, $Al_2O_3$, $MoO_x$, CoO, ZnO, $WO_3$, $V_2O_5$, $Fe_3O_4$, $SrZrO_3$, $SrTiO_3$, $Pr_{1-x}Ca_xMnO_3$, $La_{1-x}Ca_xMnO$, or the like. In some embodiments, the storage layer 720 is formed by CVD, PECVD, FCVD, HDP-CVD, SACVD, PVD, or ALD.

Referring to FIG. 2P, an electrode 730 is formed in the opening OP2. For example, the electrode 730 fills up the opening OP2 of the sub-dielectric layer 118. In some embodiments, a material of the electrode 730 may be the same as the material of the electrode 710. However, the disclosure is not limited thereto. In some alternative embodiments, the material of the electrode 730 may be different from the material of the electrode 710. In some embodiments, the electrode 730 is made of a metallic material (such as silver, aluminum, copper, tungsten, nickel, titanium, tantalum, tungsten, zirconium, hafnium, cobalt, alloys thereof, combinations thereof, or the like), a metal compound (such as titanium nitride, tantalum nitride, metal silicide, combinations thereof, or the like), or the like. In some embodiments, the electrode 730 is formed by the following steps. Frist, a conductive material (not shown) is deposited on the sub-dielectric layer 118 and the storage layer 720 to fill up the opening OP2. In some embodiments, the conductive material is deposited through ALD, CVD, PVD, plating, or the like. Thereafter, a portion of the conductive material is removed until the sub-dielectric layer 118 is exposed, so as to form the electrode 730. In some embodiments, the portion of the conductive material is removed by a mechanical grinding process, a CMP process, or the like. As illustrated in FIG. 2P, a top surface of the sub-dielectric layer 118 and a top surface of the electrode 730 are substantially coplanar.

In some embodiments, the electrode 710, the storage layer 720, and the electrode 730 form a capacitor 700 in the first region R1. In some embodiments, the electrode 710 may be referred to as a bottom electrode of the capacitor 700 while the electrode 730 may be referred to as a top electrode of the capacitor 700. In some embodiments, the capacitor 700 and the transistors 200 form the first memory device M1 in FIG. 1. That is, the first memory device M1 includes the transistors 200 and the capacitor 700. In some embodiments, the capacitor 700 may serve as a memory cell for the first memory device M1. For example, the storage layer 720 may be utilized to store data. In some embodiments, the capacitor 700 is electrically connected to the transistors 200. For example, the electrode 710 of the capacitor 700 is electrically connected to the source/drain regions 240 of the transistors 200 sequentially through the conductive patterns 612, the conductive vias 512, the conductive pattern 610, and the conductive vias 510. In some embodiments, the transistors 200 may serve as selectors for the first memory device M1.

Referring to FIG. 2Q, a storage material layer 810a is formed on the sub-dielectric layer 118 and the capacitor 700. In some embodiments, the storage material layer 810a includes amorphous oxide semiconductor materials. Examples of the amorphous oxide semiconductor material include IGZO, InWO, InZnO, InSnO, ZnO, GaOx, InOx, AZO, combinations thereof, or the like. Alternatively, the storage material layer 810a may include a single or composite film of $HfO_2$, $Hr_{1-x}Zr_xO_2$, $ZrO_2$, $TiO_2$, NiO, $TaO_x$, $Cu_2O$, $Nb_2O_5$, $Al_2O_3$, $MoO_x$, CoO, ZnO, $WO_3$, $V_2O_5$, $Fe_3O_4$, $SrZrO_3$, $SrTiO_3$, $Pr_{1-x}Ca_xMnO_3$, $La_{1-x}Ca_xMnO$, or the like. In some embodiments, the storage material layer 810a is deposited by a suitable deposition process, such as CVD, PECVD, FCVD, HDP-CVD, SACVD, PVD, or ALD.

Referring to FIG. 2Q and FIG. 2R, a portion of the storage material layer 810a is removed to form a storage layer 810. In some embodiments, the storage layer 810 is located in the first region R1. For example, the storage layer 810 is disposed on and in physical contact with the electrode 730. In some embodiments, the portion of the storage material layer 810a is removed through a photolithography and etching process or other suitable processes.

Referring to FIG. 2S, a dielectric layer 910 is formed on the sub-dielectric layer 118, the capacitor 700, and the storage layer 810. In some embodiments, the dielectric layer 910 corresponds to one of the dielectric layers 36 of the interconnect structure 30 in FIG. 1, so the detailed description thereof is omitted herein.

Referring to FIG. 2T, an opening OP3 is formed in the dielectric layer 910. In some embodiments, the opening OP3 is formed in the first region R1. For example, the opening OP3 is formed to expose an entire top surface of the storage layer 810. In some embodiments, the opening OP3 is formed through a photolithography and etching process.

Referring to FIG. 2U, an electrode 820 is formed in the opening OP3. For example, the electrode 820 fills up the opening OP3 of the dielectric layer 910. In some embodiments, a material of the electrode 820 may be the same as the material of the electrode 730. However, the disclosure is not limited thereto. In some alternative embodiments, the material of the electrode 820 may be different from the material of the electrode 730. In some embodiments, the electrode 820 is made of a metallic material (such as silver, aluminum, copper, tungsten, nickel, titanium, tantalum, tungsten, zirconium, hafnium, cobalt, alloys thereof, combinations thereof, or the like), a metal compound (such as titanium nitride, tantalum nitride, metal silicide, combinations thereof, or the like), or the like. In some embodiments, the electrode 820 is formed by the following steps. Frist, a conductive material (not shown) is deposited on the dielectric layer 910 and the storage layer 810 to fill up the opening OP3. In some embodiments, the conductive material is deposited through ALD, CVD, PVD, plating, or the like. Thereafter, a portion of the conductive material is removed until the dielectric layer 910 is exposed, so as to form the electrode 820. In some embodiments, the portion of the conductive material is removed by a mechanical grinding process, a CMP process, or the like. As illustrated in FIG. 2U, a top surface of the dielectric layer 910 and a top surface of the electrode 820 are substantially coplanar. It should be noted that the steps shown in FIG. 2R to FIG. 2U may be altered in some alternative embodiments. For example, a storage material layer (not shown) and an electrode material layer (not shown) may be deposited on the sub-dielectric layer 118 and the capacitor 700. Thereafter, these two layers are patterned together through a photolithography and etching process, to form the storage layer 810 and the electrode 820. Then, the dielectric layer 910 is formed to laterally wrap around the storage layer 810 and the electrode 820, so as to form the structure shown in FIG. 2U.

In some embodiments, the electrode 730, the storage layer 810, and the electrode 820 form a capacitor 800 in the first region R1. In some embodiments, the capacitor 800 may be the third memory device M3 (OTP) shown in FIG. 1. In some embodiments, the electrode 730 may be referred to as a bottom electrode of the capacitor 800 while the electrode 820 may be referred to as a top electrode of the capacitor 800. As mentioned above, the electrode 730 also serves as the top electrode of the capacitor 700. In other words, the capacitor 700 and the capacitor 800 share the same electrode 730, which is biased at a constant voltage during application. In some embodiments, the capacitor 800 may serve as a memory cell for the third memory device M3. For example, the storage layer 810 may be utilized to store data. In some embodiments, the capacitor 800 is electrically connected to the transistor 40 in FIG. 1. That is, the capacitor 800 is connected to a FEOL transistor. Referring to FIG. 1 and FIG. 2U, the electrical connection between the capacitor 800 and the transistor 40 may be realized by electrically connecting the electrode 820 of the capacitor 800 (i.e. the third memory device M3) to the transistor 40 through the conductive patterns 34 and the conductive vias 32 (or some deep via structure that provides connections across multiple layers). In some embodiments, the transistor 40 (i.e. the FEOL transistor) may serve as a selector for the third memory device M3. In some embodiments, the capacitor 800 (i.e. the third memory device M3) and the capacitor 300 (i.e. the second memory device M2) are electrically connected to different transistors 40 (when multiple transistors 40 are presented). However, the disclosure is no limited thereto. In some alternative embodiments, the capacitor 800 (i.e. the third memory device M3) and the capacitor 300 (i.e. the second memory device M2) may be electrically connected to the same transistor 40.

After the electrode 820 is formed, the formation of the memory module MM is substantially completed. In some embodiments, the first memory device M1 is embedded in the sub-dielectric layers 110, 112, 114, 116, and 118, the second memory device M2 is embedded in the sub-dielectric layers 110 and 112, and the third memory device M3 is embedded in the dielectric layer 910. In some embodiments, the sub-dielectric layers 110, 112, 114, 116, and 118 correspond to one of the dielectric layers 36 of the interconnect structure 30 in FIG. 1. On the other hand, the dielectric layer 910 corresponds to another one of the dielectric layers 36 of the interconnect structure 30 in FIG. 1. As such, the first memory device M1 and the second memory device M2 are being considered as embedding in the same dielectric layer 36 while the third memory device M3 is being considered as embedding in another dielectric layer 36. In some embodiments, since the interconnect structure 30 is being considered as formed during back-end-of-line (BEOL) process, the first memory device M1, the second memory device M2, and the third memory device M3 are also being considered as formed during BEOL processes. By integrating the formations of the first memory device M1, the second memory device M2, and the third memory device M3 into the BEOL process, FEOL area may be released to reduce chip size and the manufacturing cost. Moreover, FEOL can adopt the most advanced nodes to realize high performance. Furthermore, the data/signal transmission distance between devices may be shortened to enhance the device performance.

Figure 3:
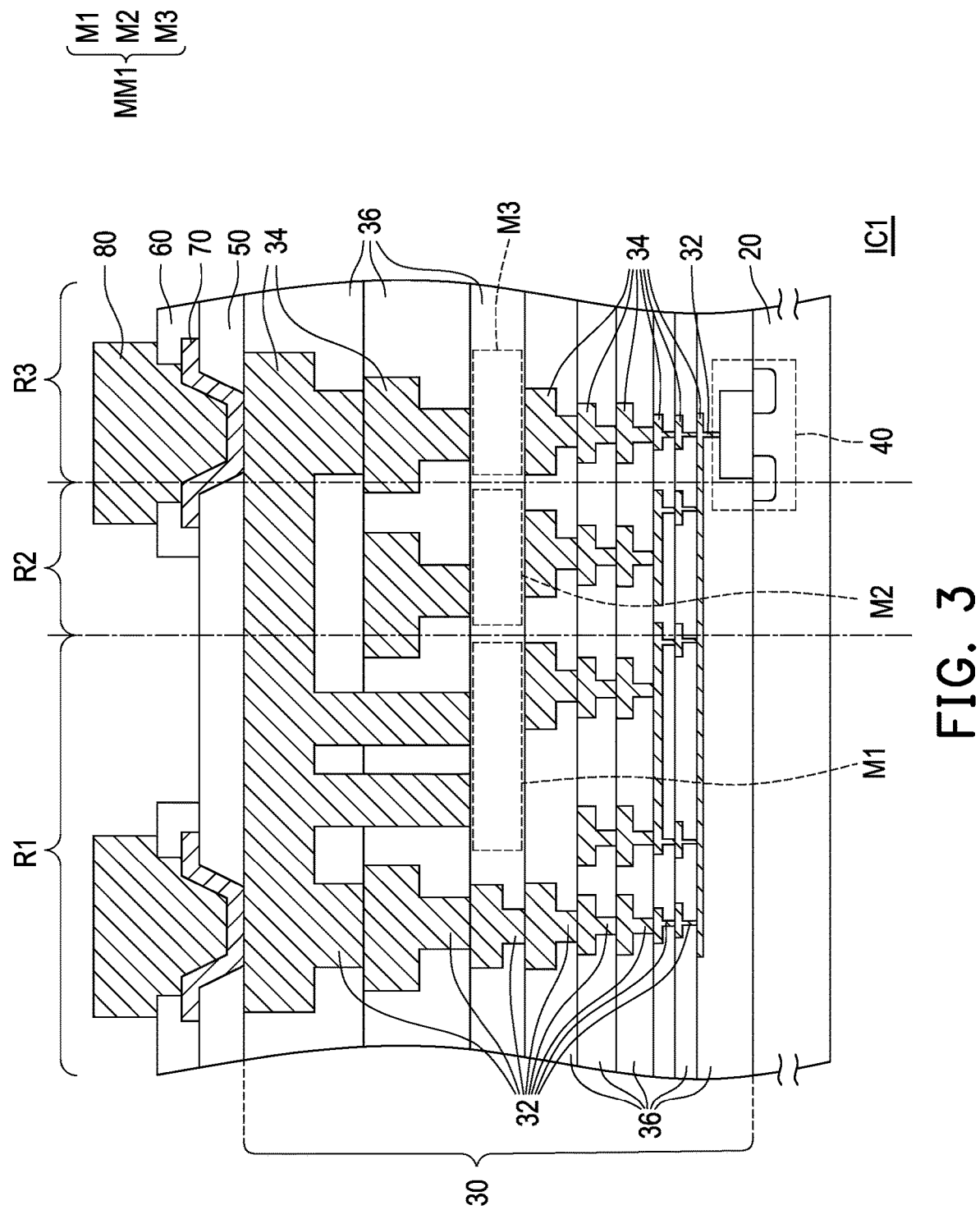
FIG. 3 is a schematic cross-sectional view of an integrated circuit in accordance with some alternative embodiments of the disclosure.

FIG. 3 is a schematic cross-sectional view of an integrated circuit IC1 in accordance with some alternative embodiments of the disclosure. Referring to FIG. 3, the integrated circuit IC1 in FIG. 3 is similar to the integrated circuit IC in FIG. 1, so similar elements are denoted by the same reference numeral and the detailed descriptions thereof are omitted herein. The difference between the integrated circuit IC1 in FIG. 3 and the integrated circuit IC in FIG. 1 lies in that the integrated circuit IC1 includes a first region, R1, a second region R2, and a third region R3. In addition, the first memory device M1, the second memory device M2, and the third memory device M3 are embedded in the same dielectric layer 36. As illustrated in FIG. 3, the first region R1 is adjacent to the second region R2, and the second region R2 is adjacent to the third region R3. In some embodiments, the first region R1, the second region R2, and the third region R3 are immediately adjacent to one another. However, the disclosure is not limited thereto. In some alternative embodiments, the first region R1, the second region R2, and the third region R3 are spatially separated from one another with other metal routings therebetween. In some embodiments, the second region R2 is located between the first region R1 and the third region R3. In some embodiments, the first memory device M1 is located in the first region R1, the second memory device M2 is located in the second region R2, and the third memory device M3 is located in the third region R3. In some embodiments, the first memory device M1, the second memory device M2, and the third memory device M3 are collectively referred to as a memory module MM1.

In some embodiments, the first memory device M1, the second memory device M2, and the third memory device M3 can be different types of memory devices. Taking NVM device, high density cache device, and OTP device respectively as the first memory device M1, the second memory device M2, and the third memory device M3 as an example, the formation method and the structure of the memory module MM1 will be described below in conjunction with FIG. 4A to FIG. 4V.

Figure 4A:
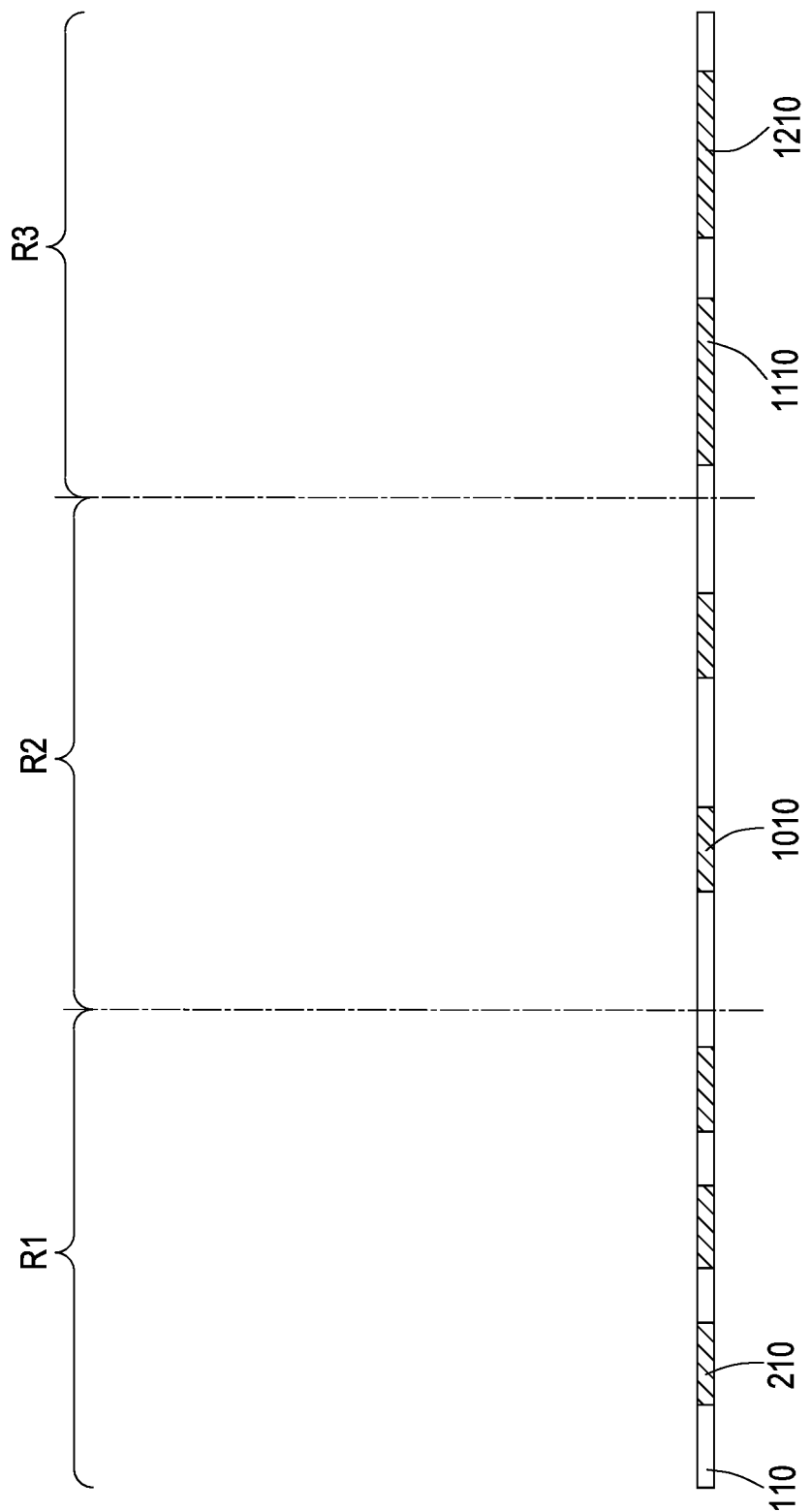
FIG. 4A to FIG. 4V are cross-sectional views illustrating various stages of a manufacturing method of the memory module in FIG. 3 in accordance with some alternative embodiments of the disclosure.
Figure 4B:
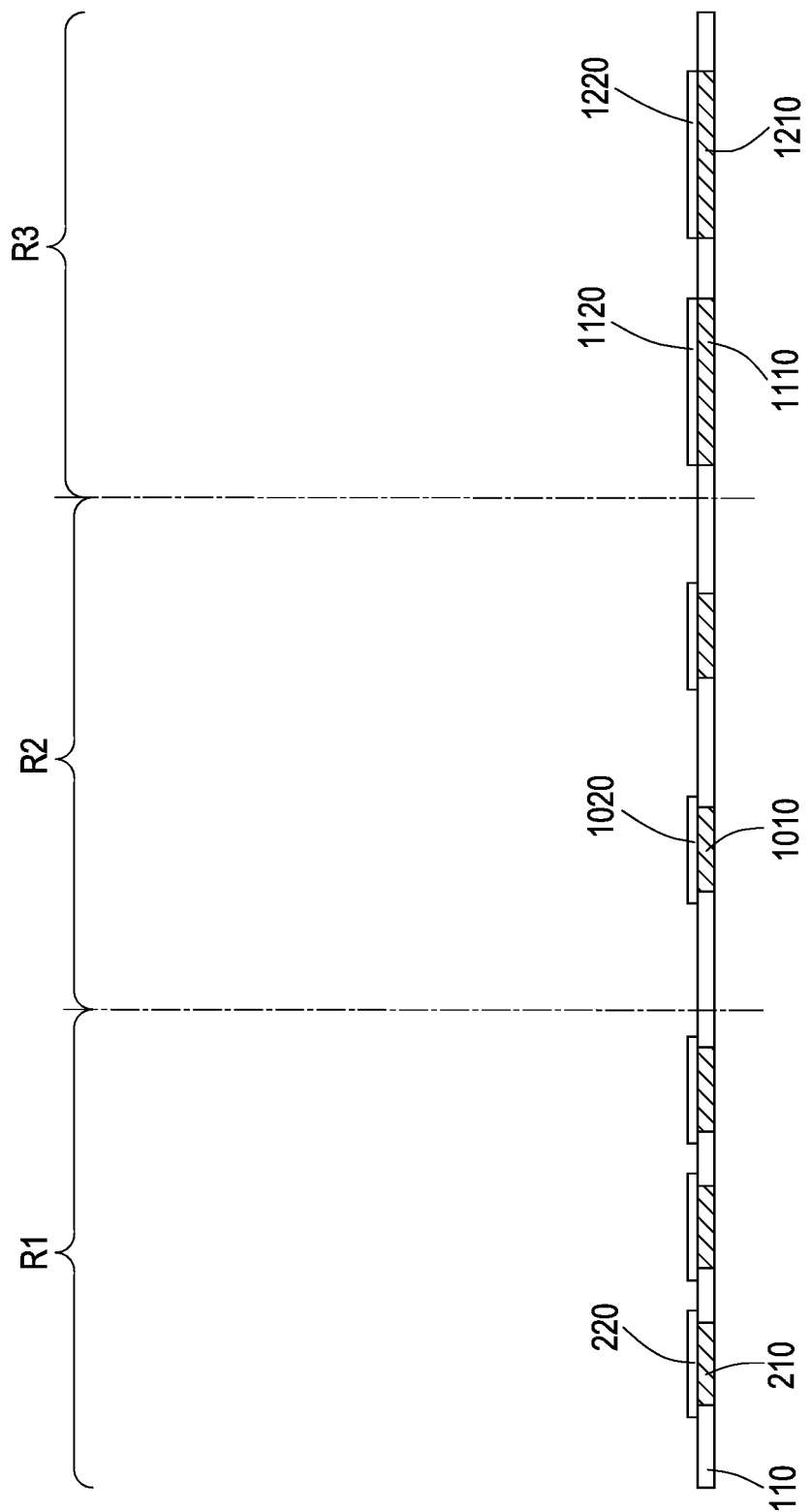
Figure 4C:
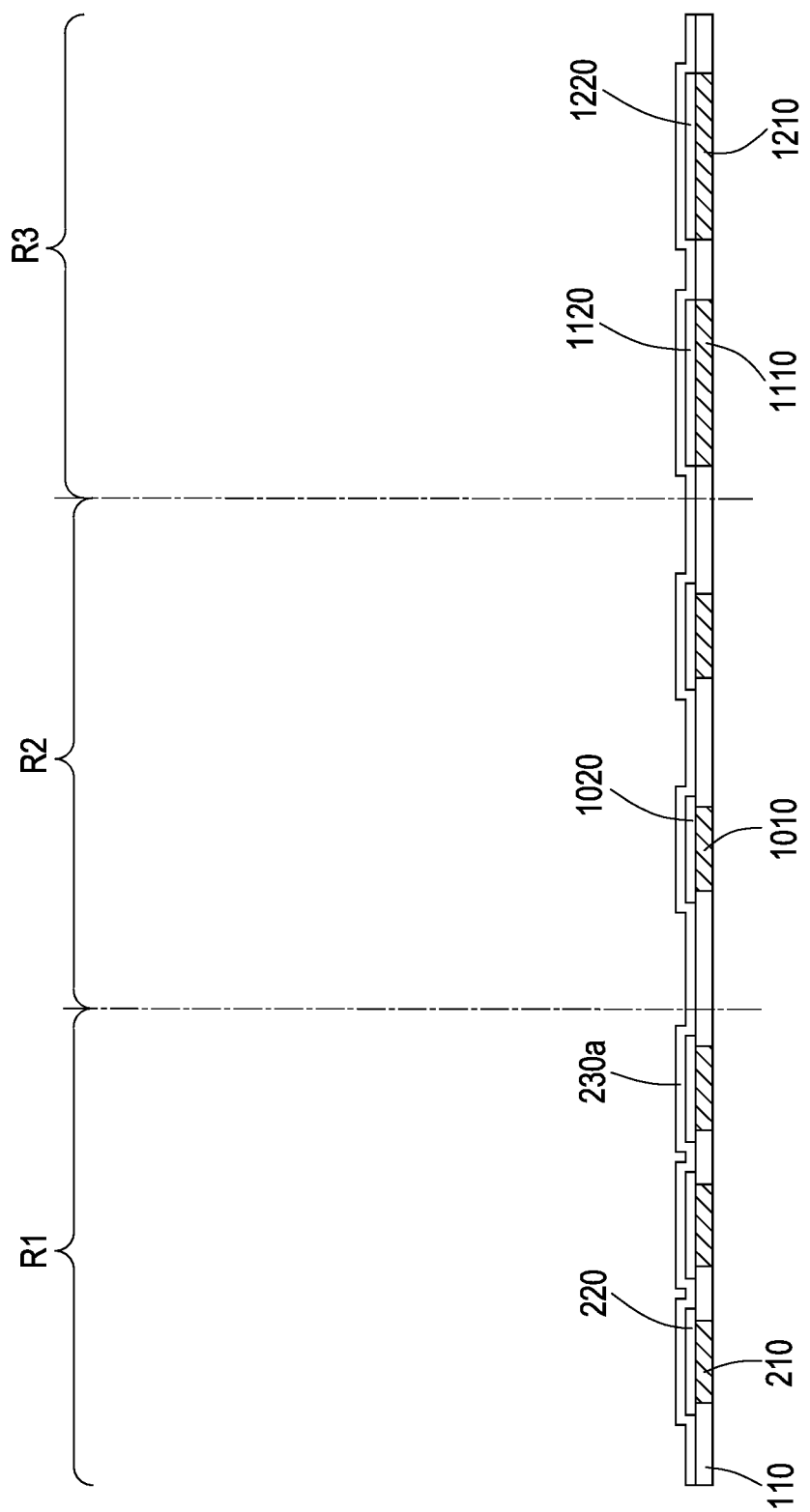
Figure 4D:
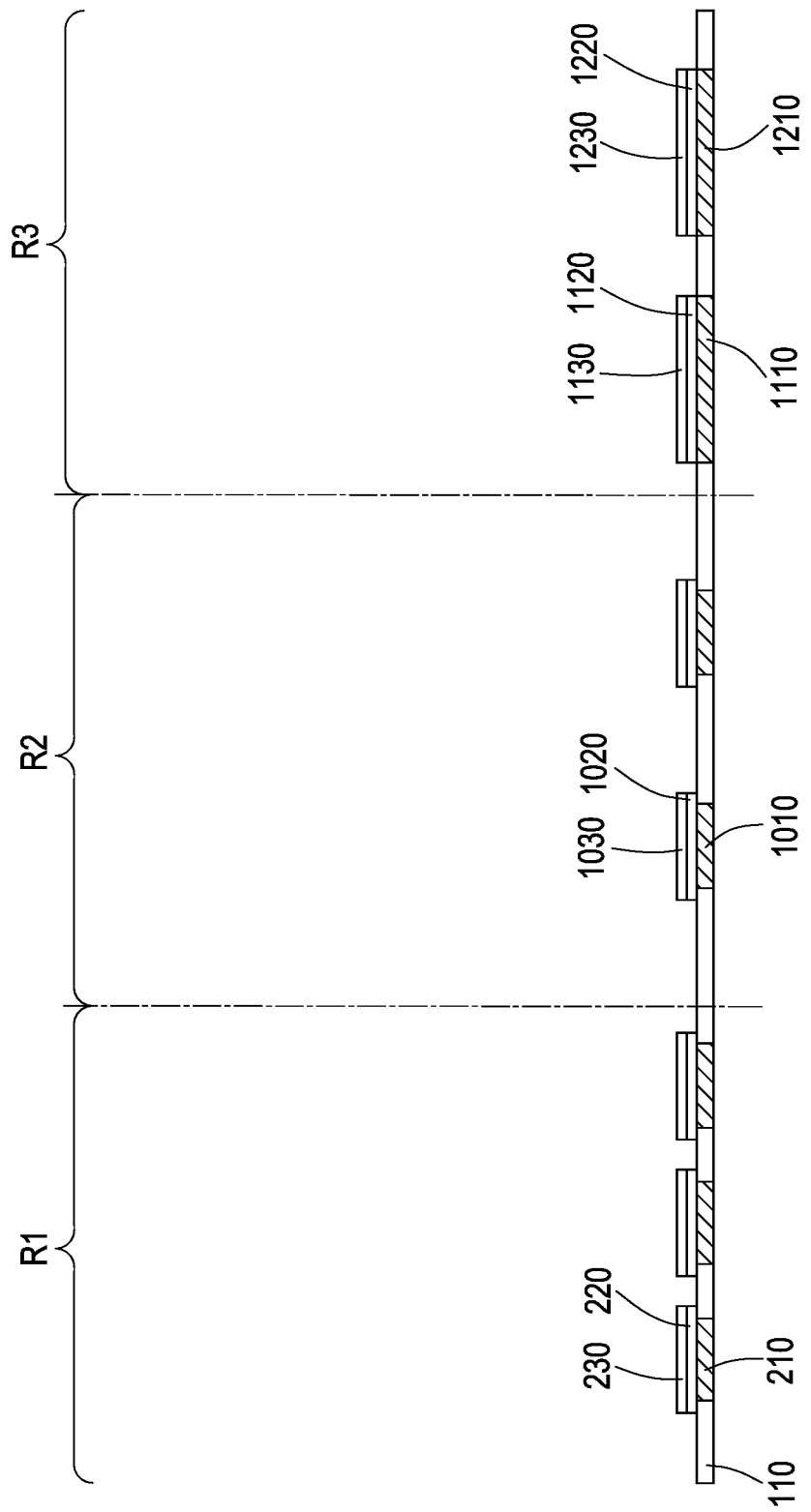
Figure 4E:
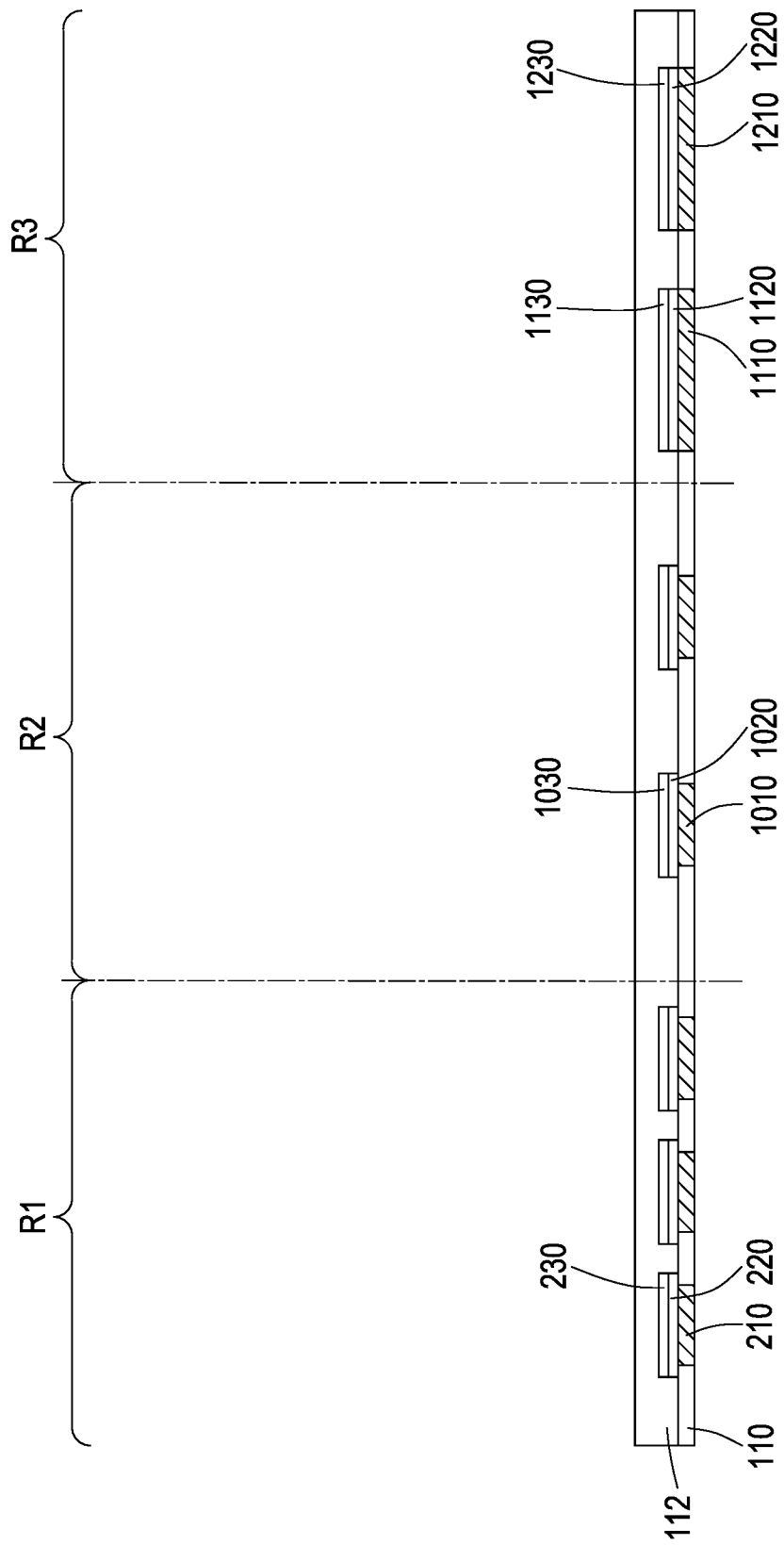
Figure 4F:
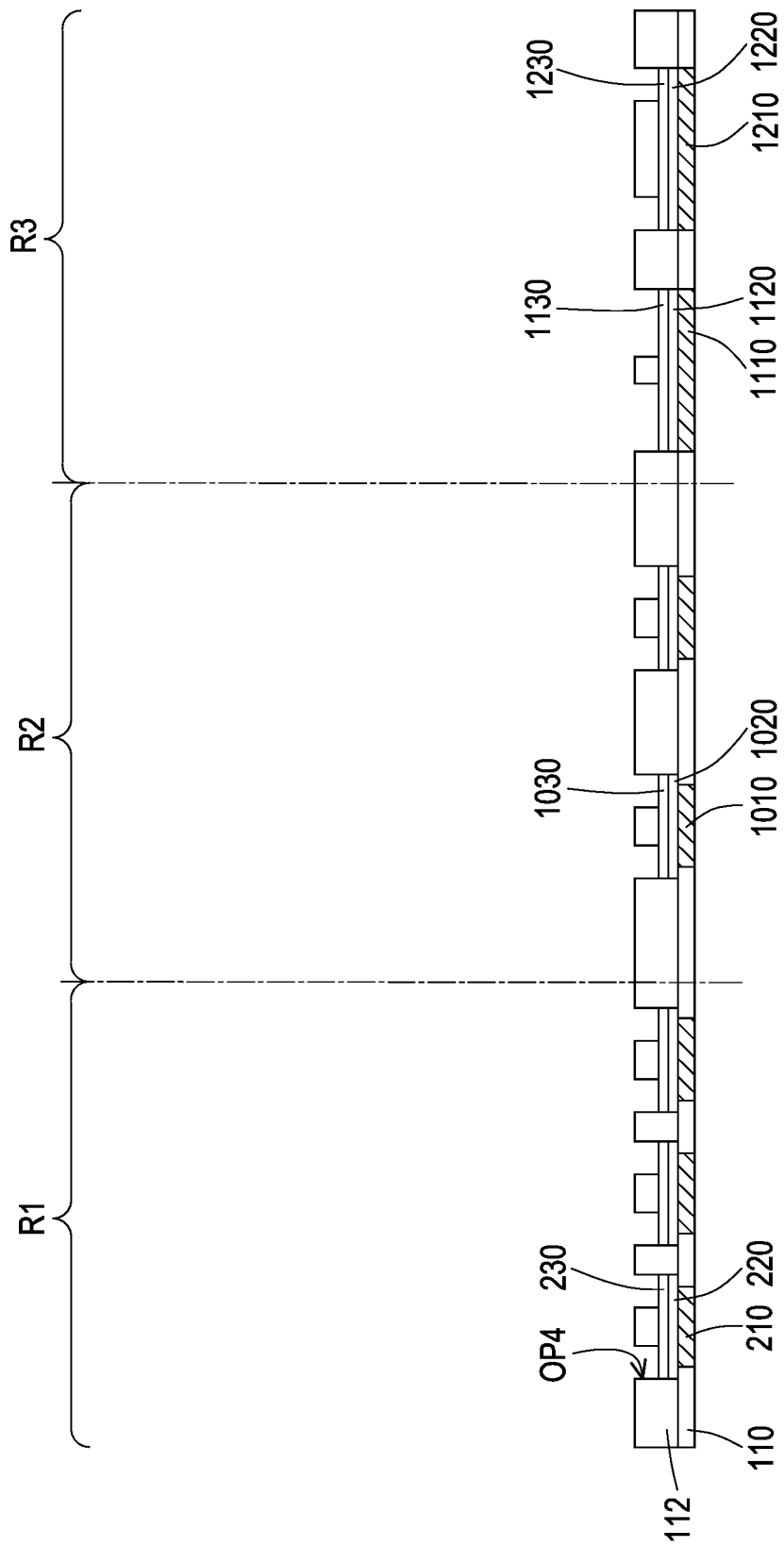
Figure 4G:
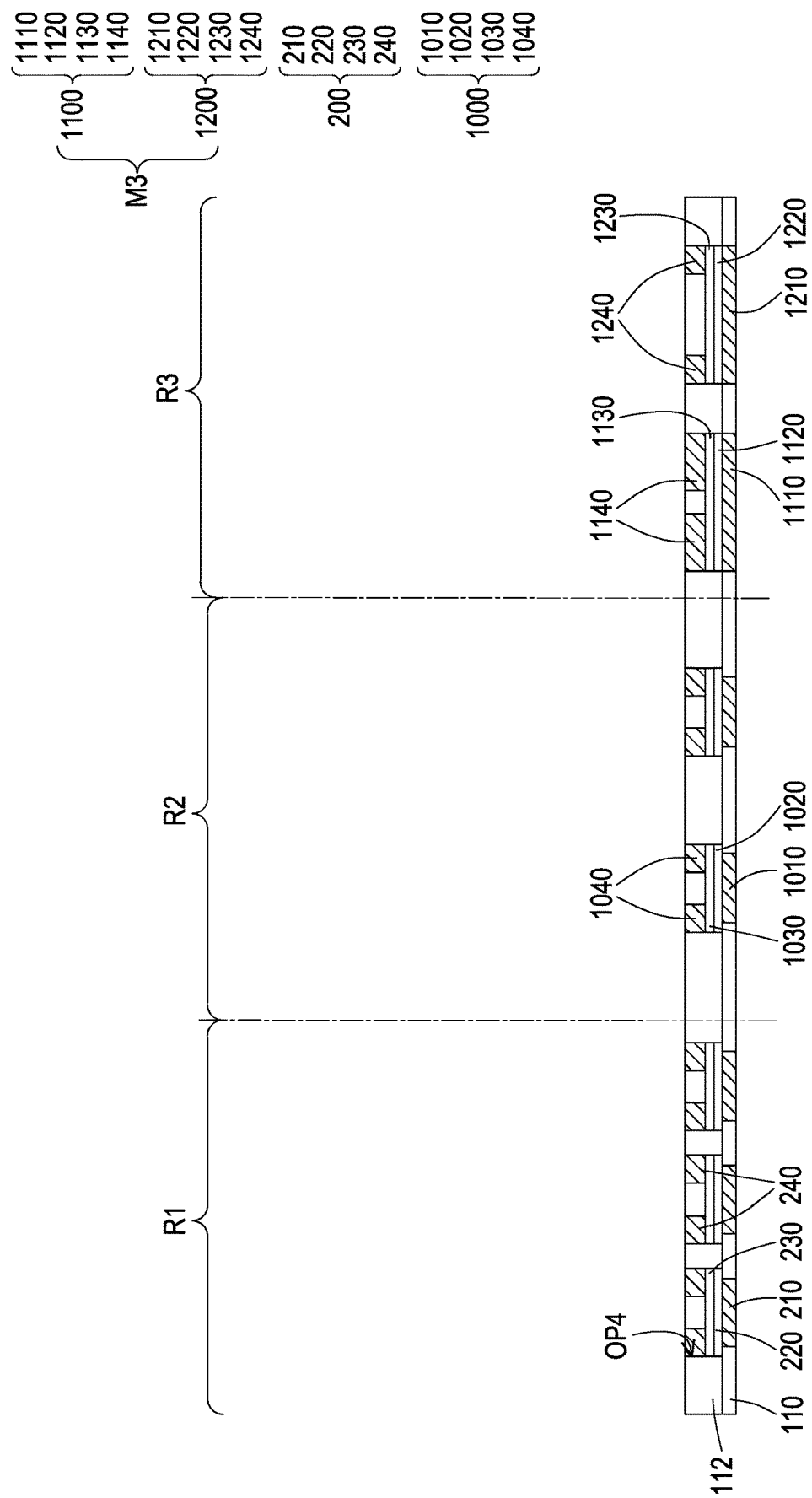
Figure 4H:
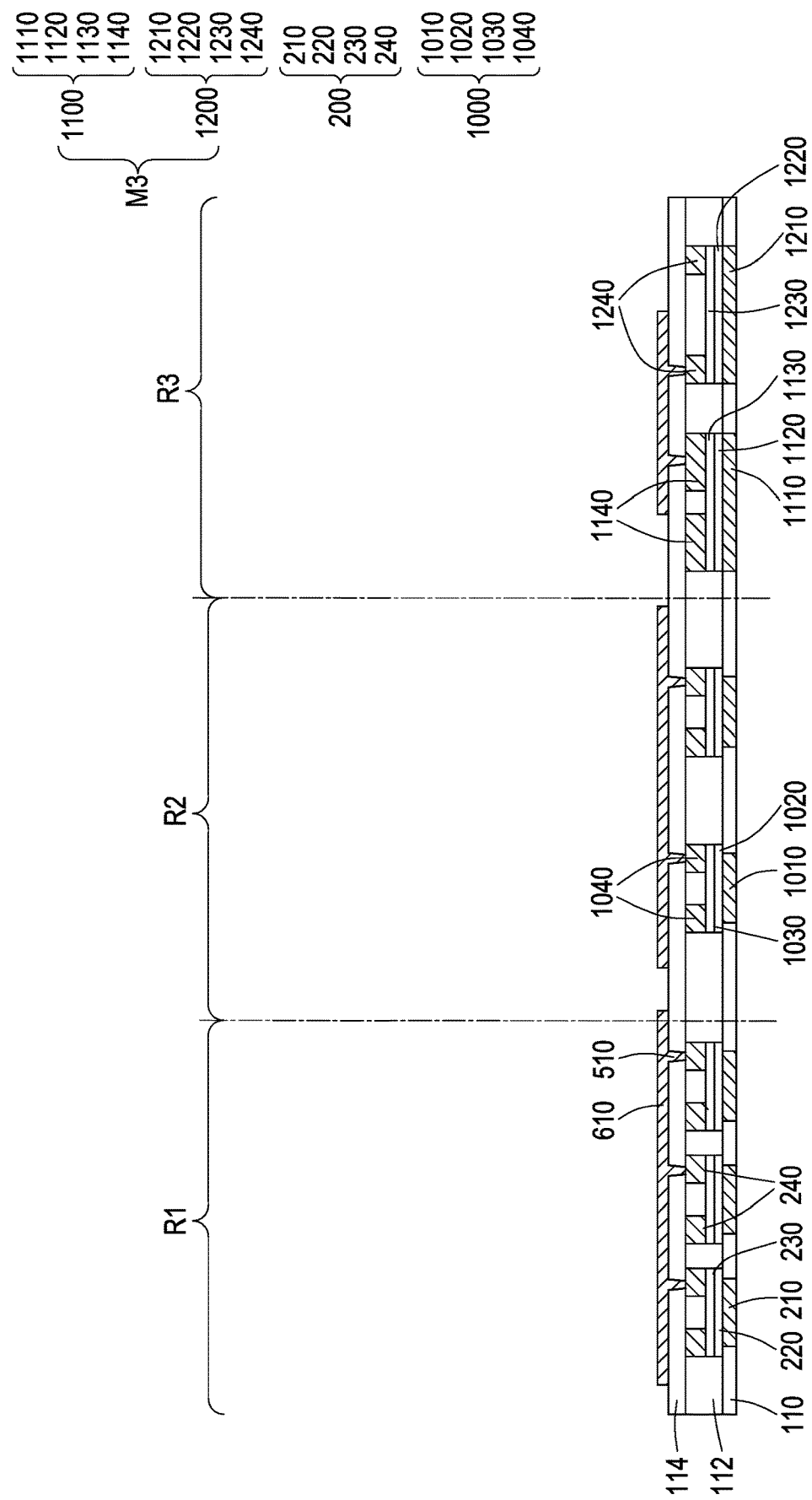
Figure 4I:
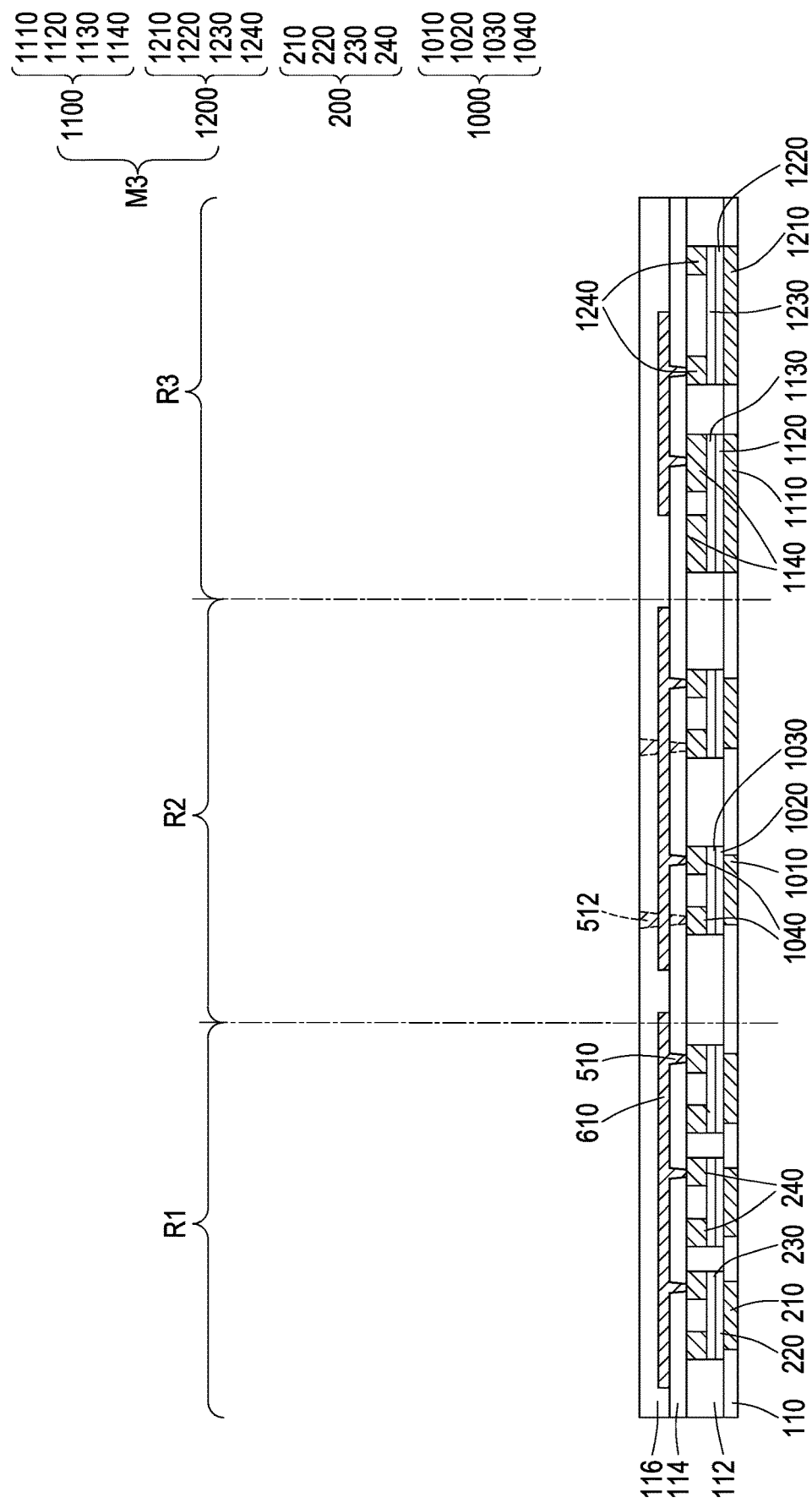
Figure 4J:
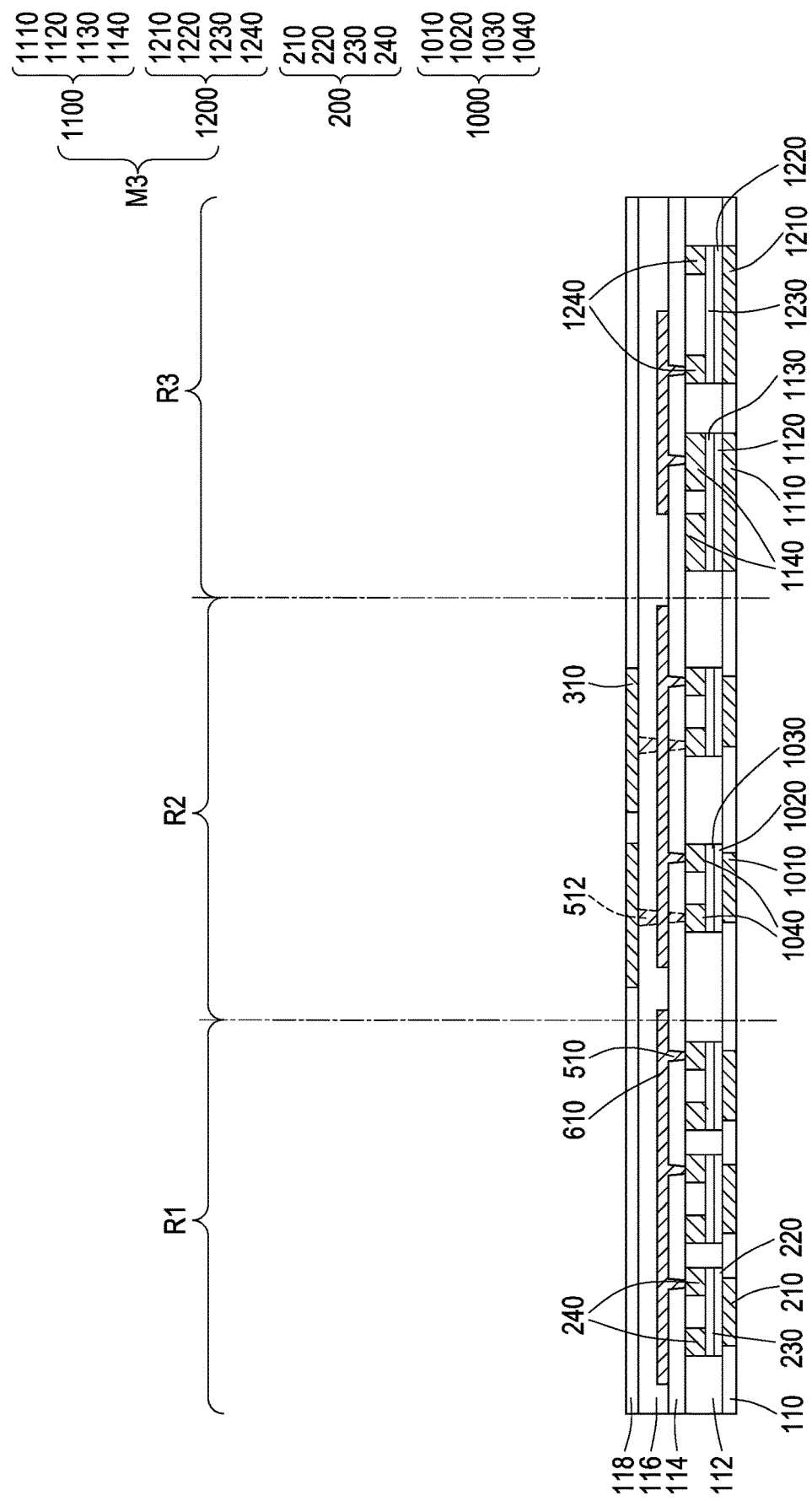
Figure 4K:
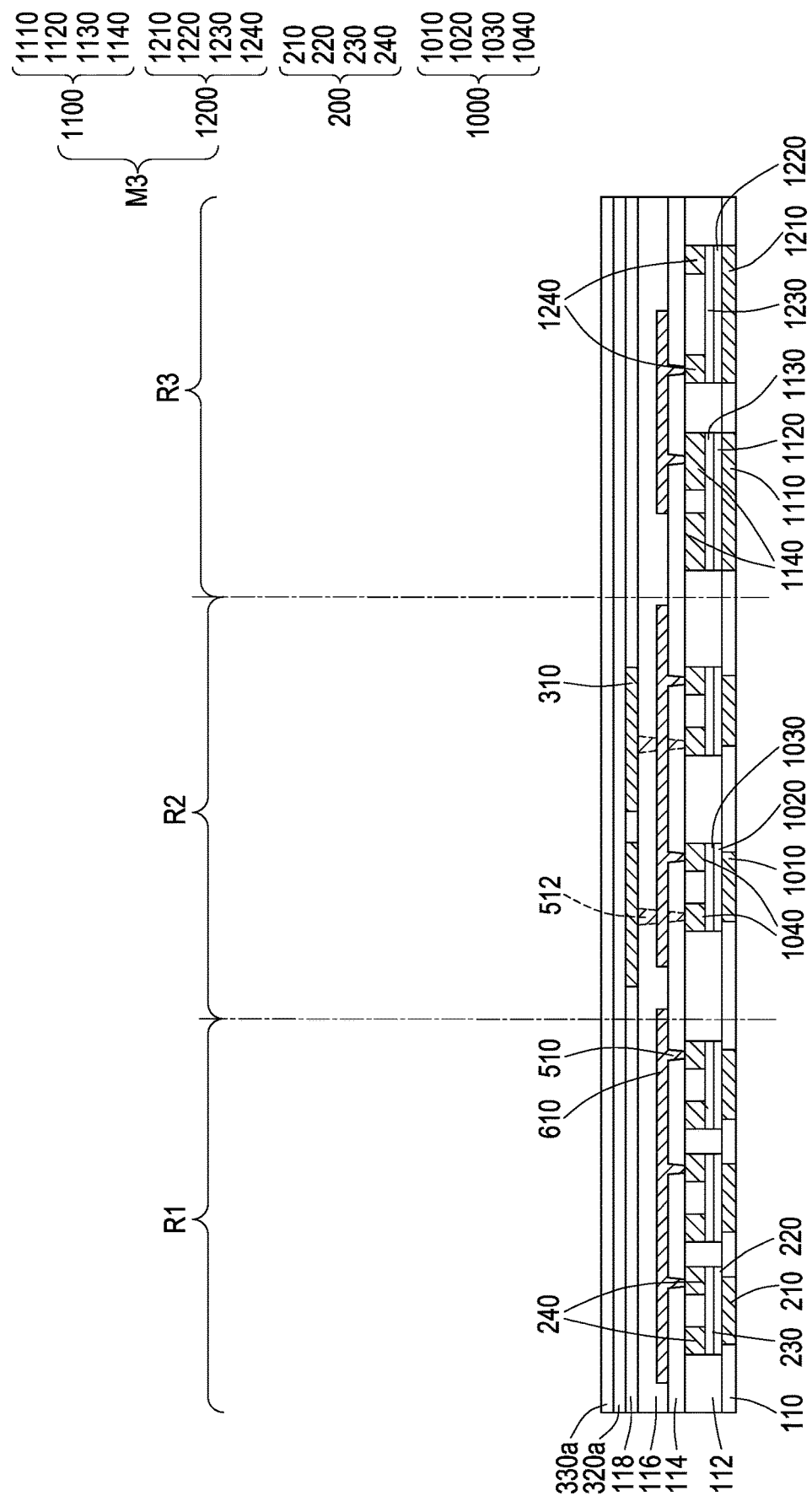
Figure 4L:
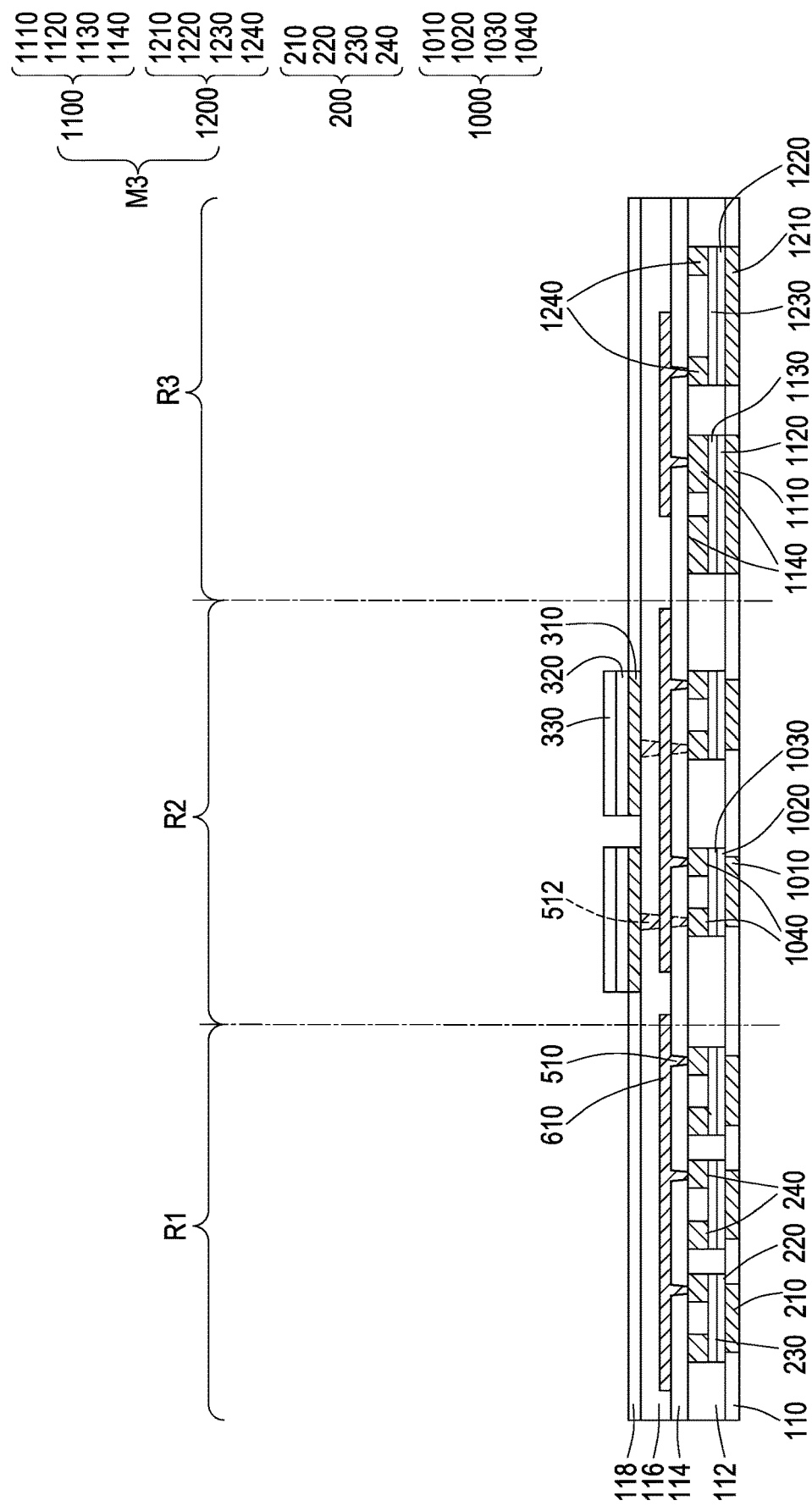
Figure 4M:
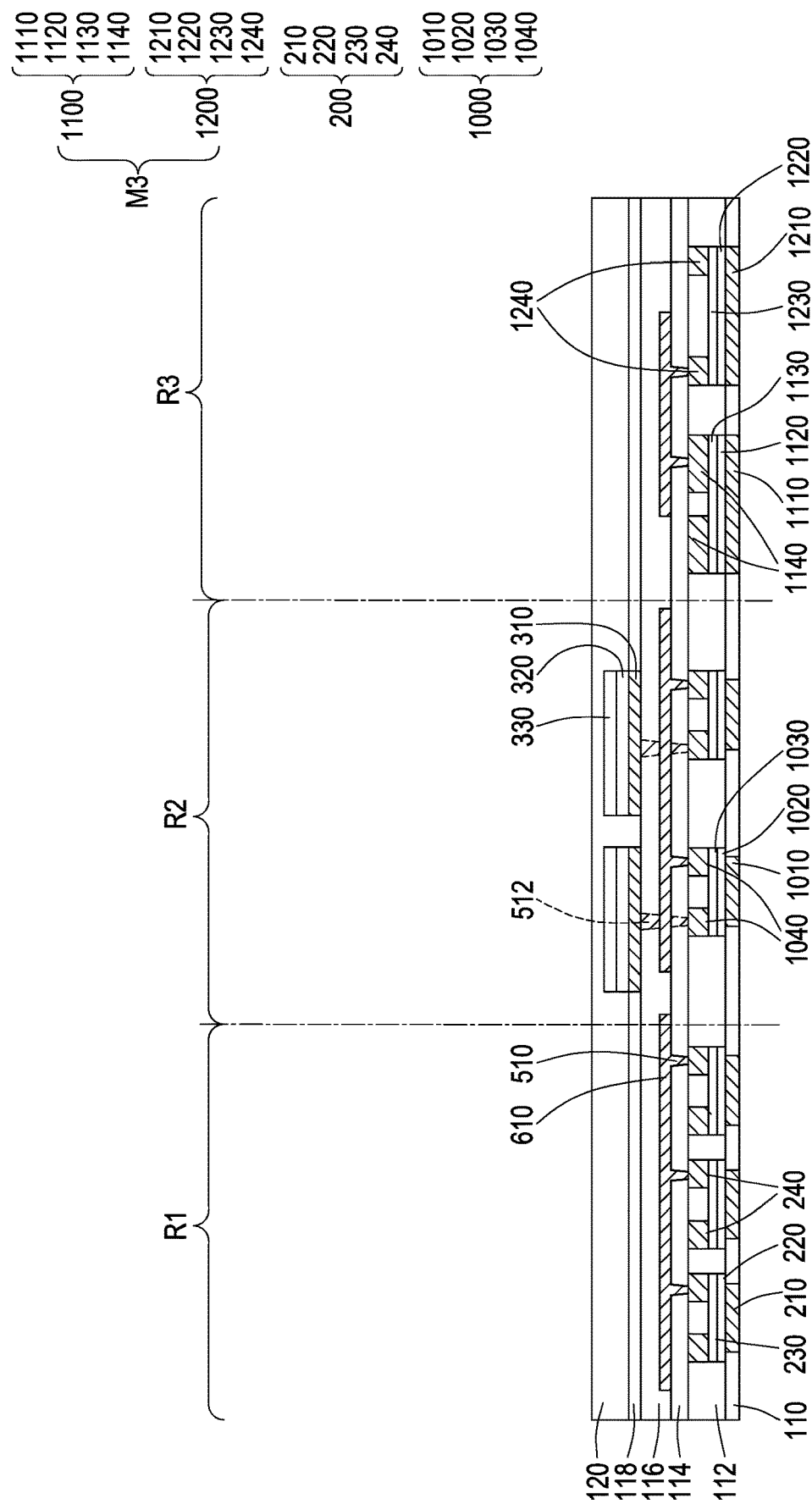
Figure 4N:
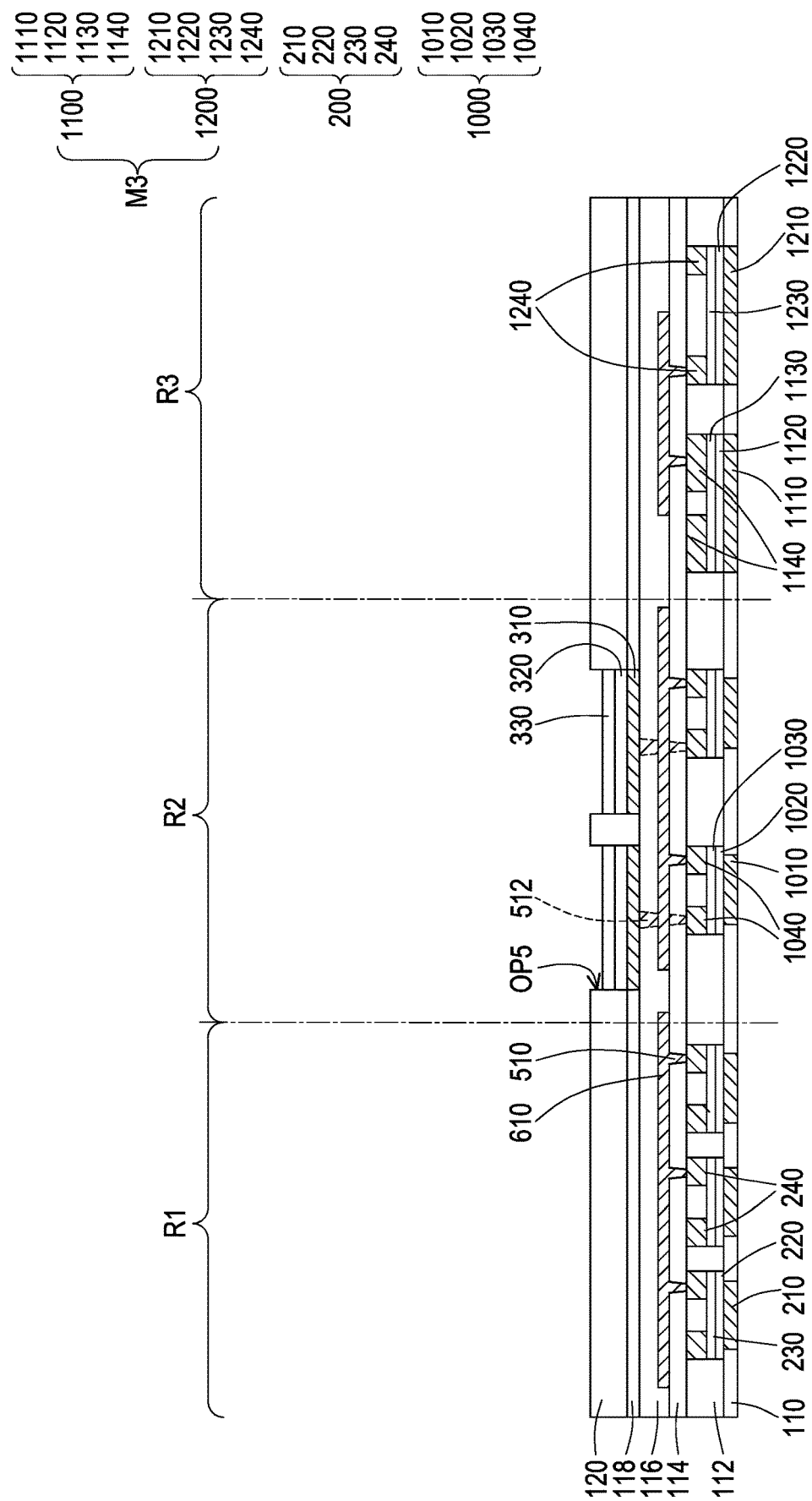
Figure 40:
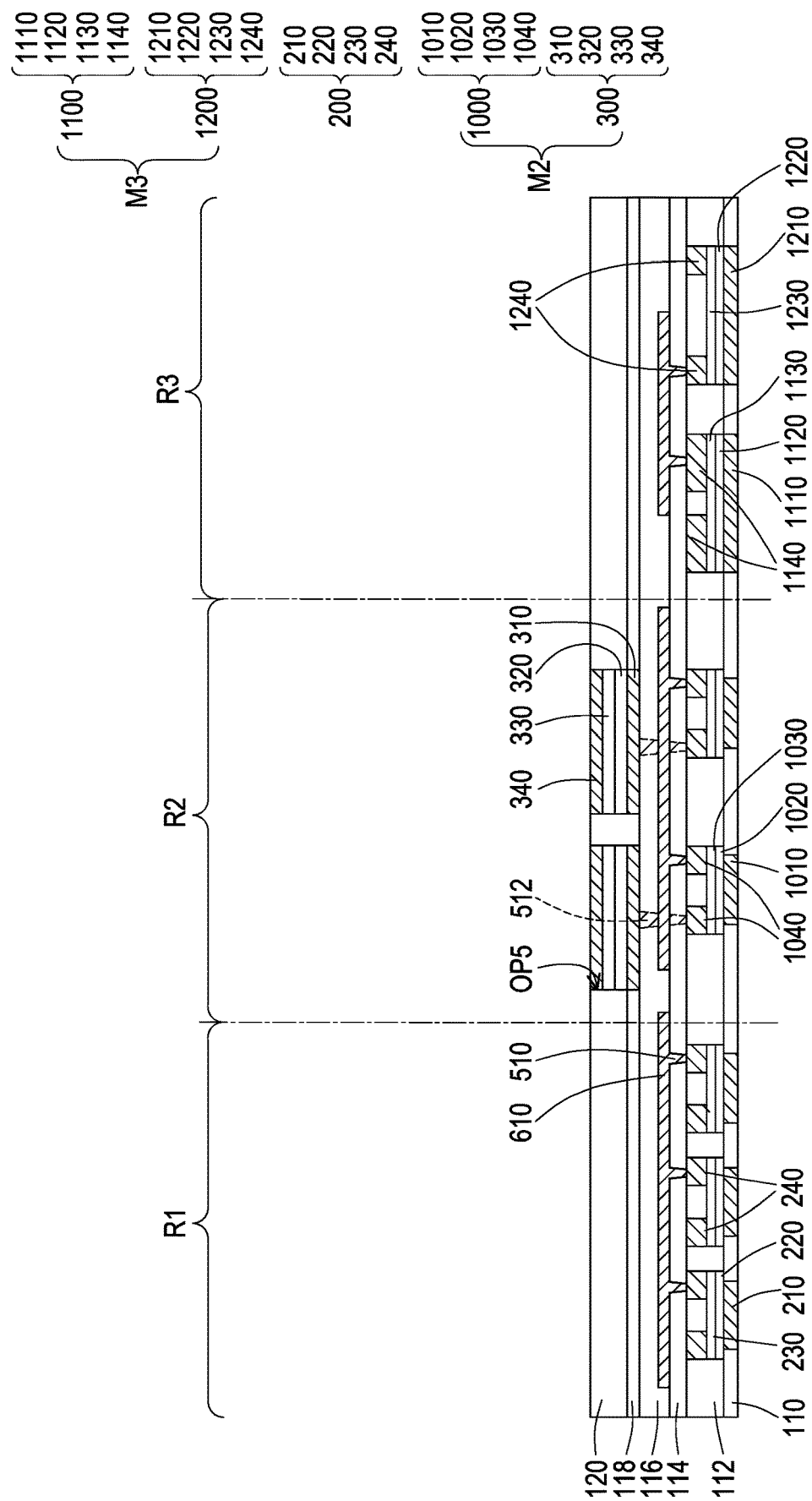
Figure 4P:
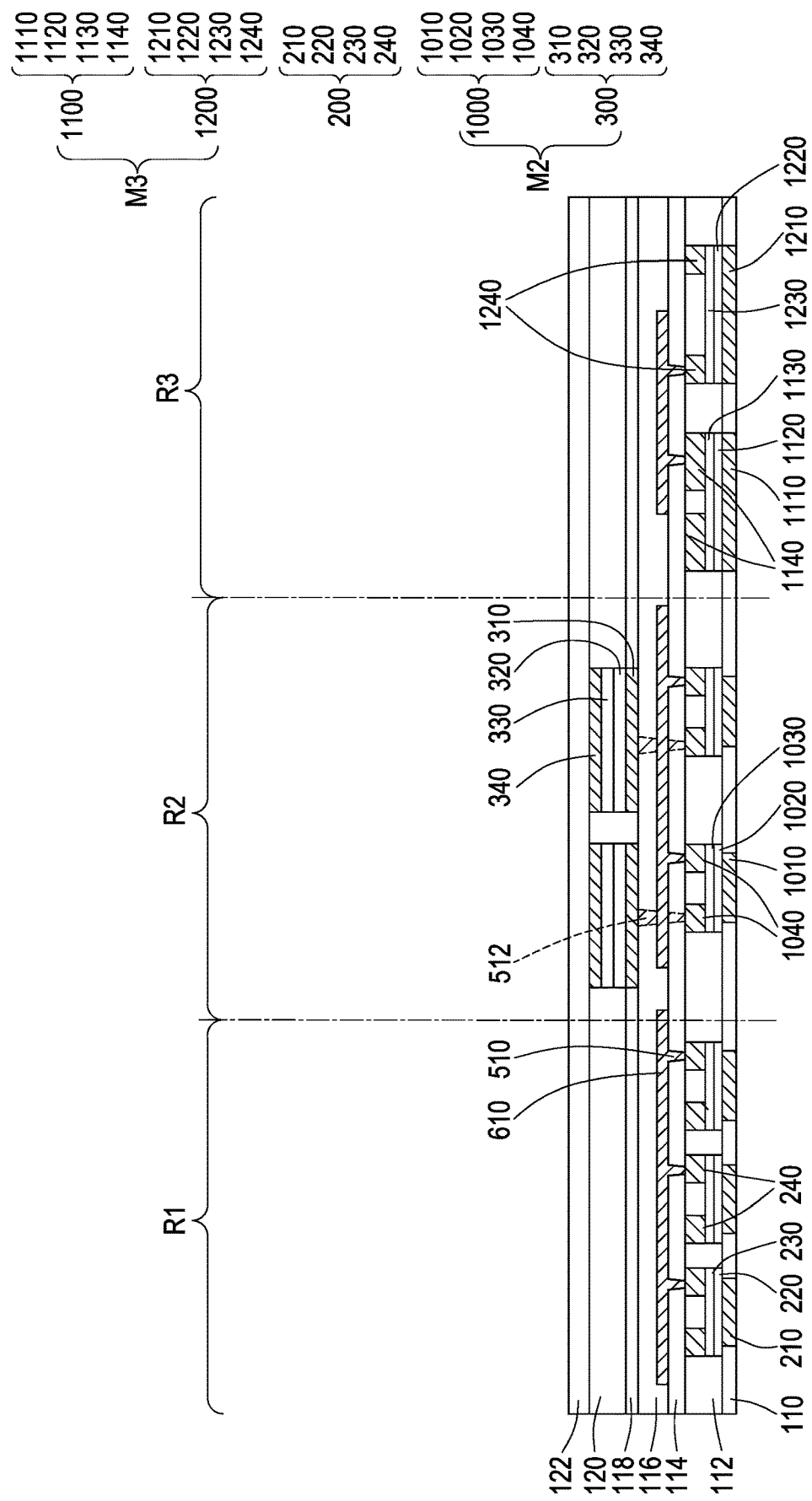
Figure 4Q:
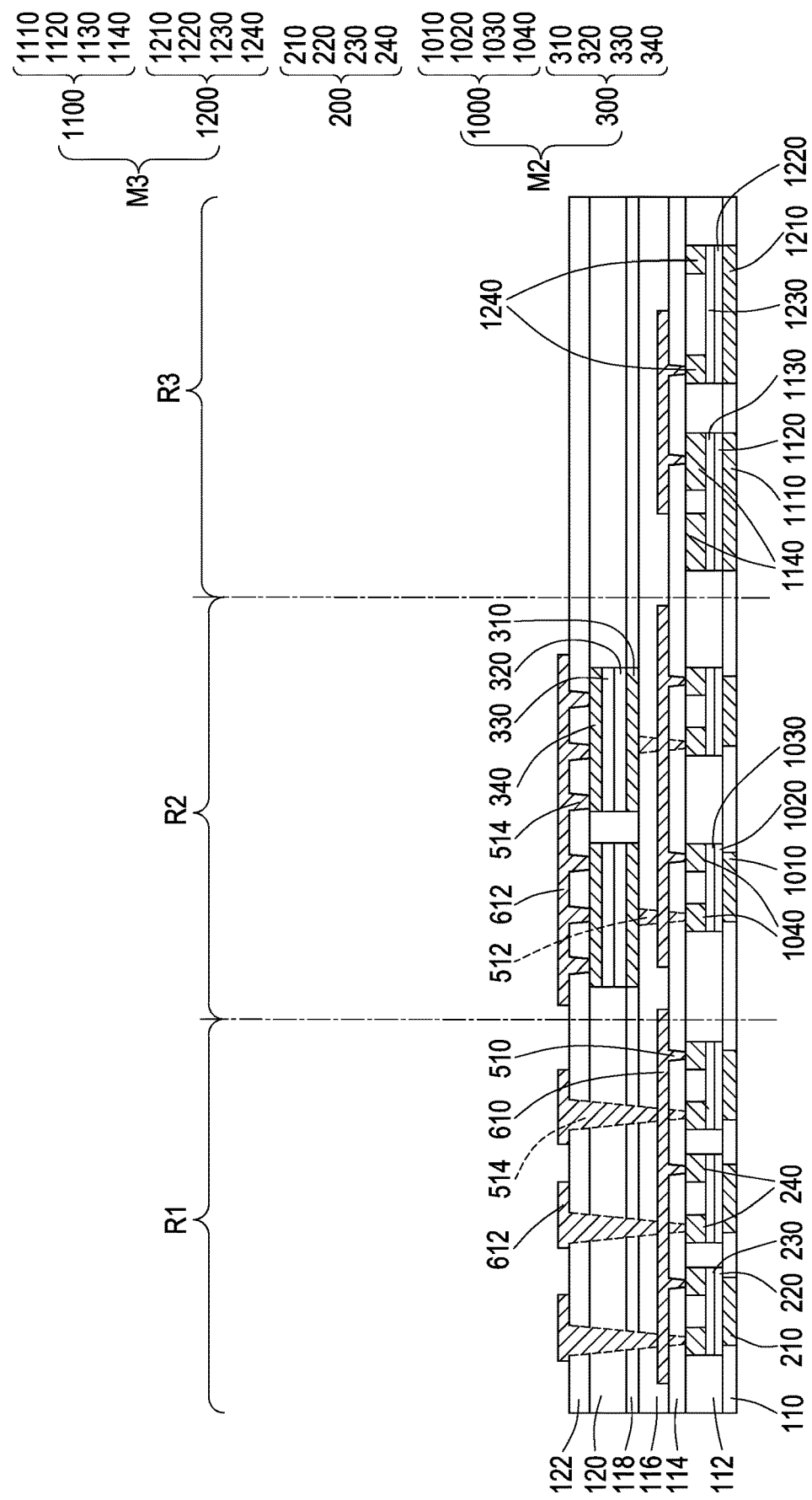
Figure 4R:
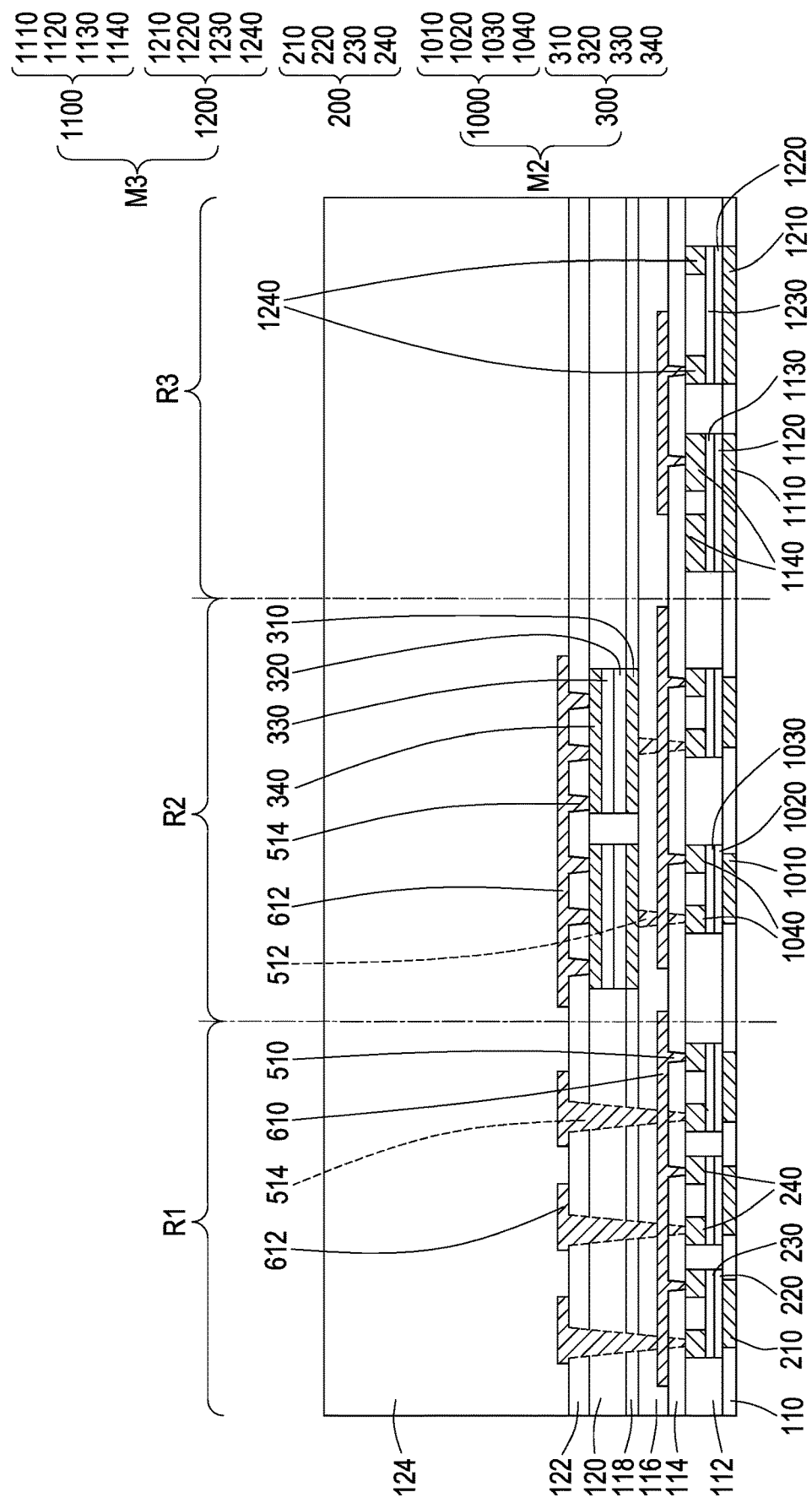
Figure 4S:
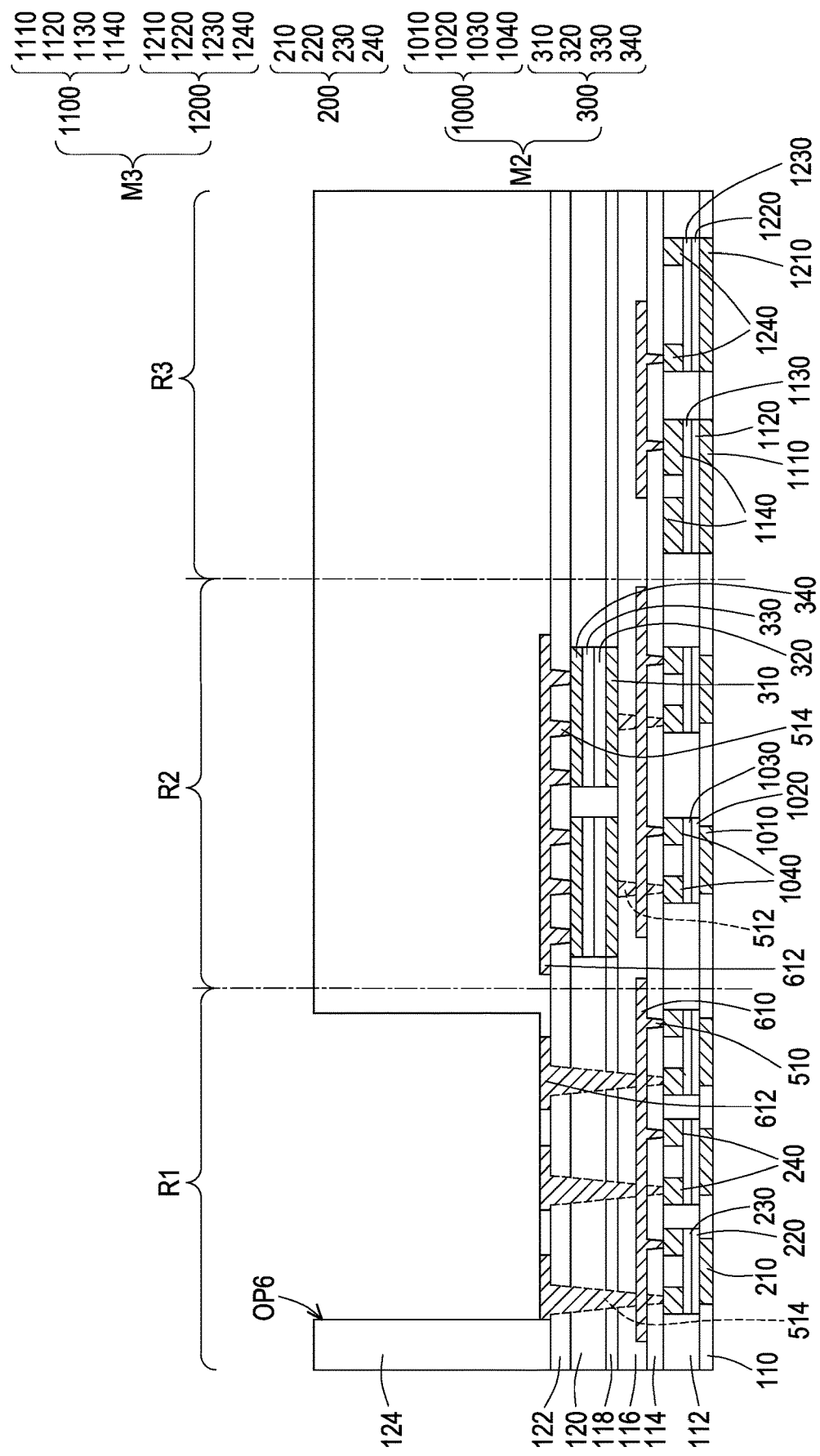
Figure 4T:
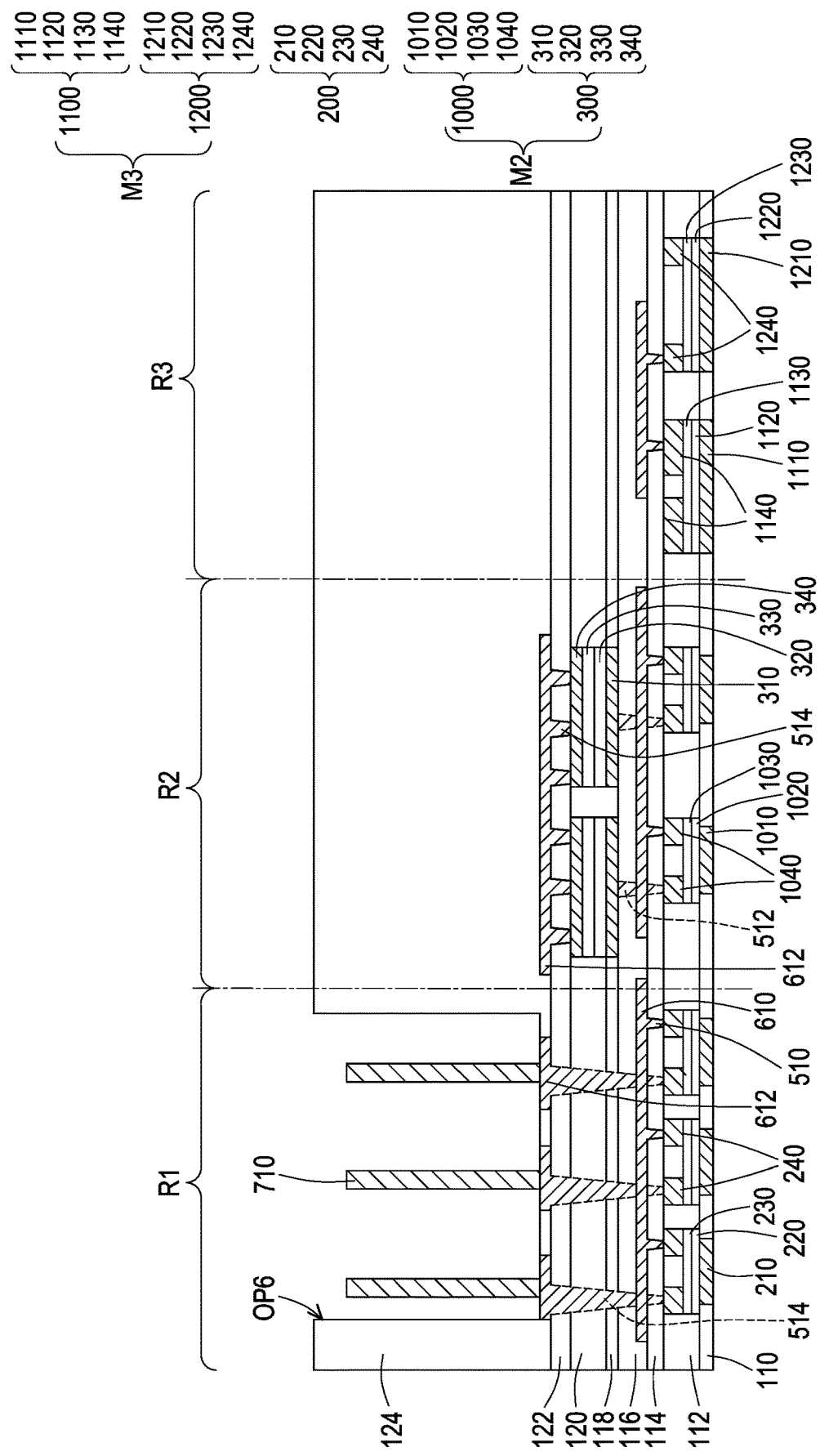
Figure 4U:
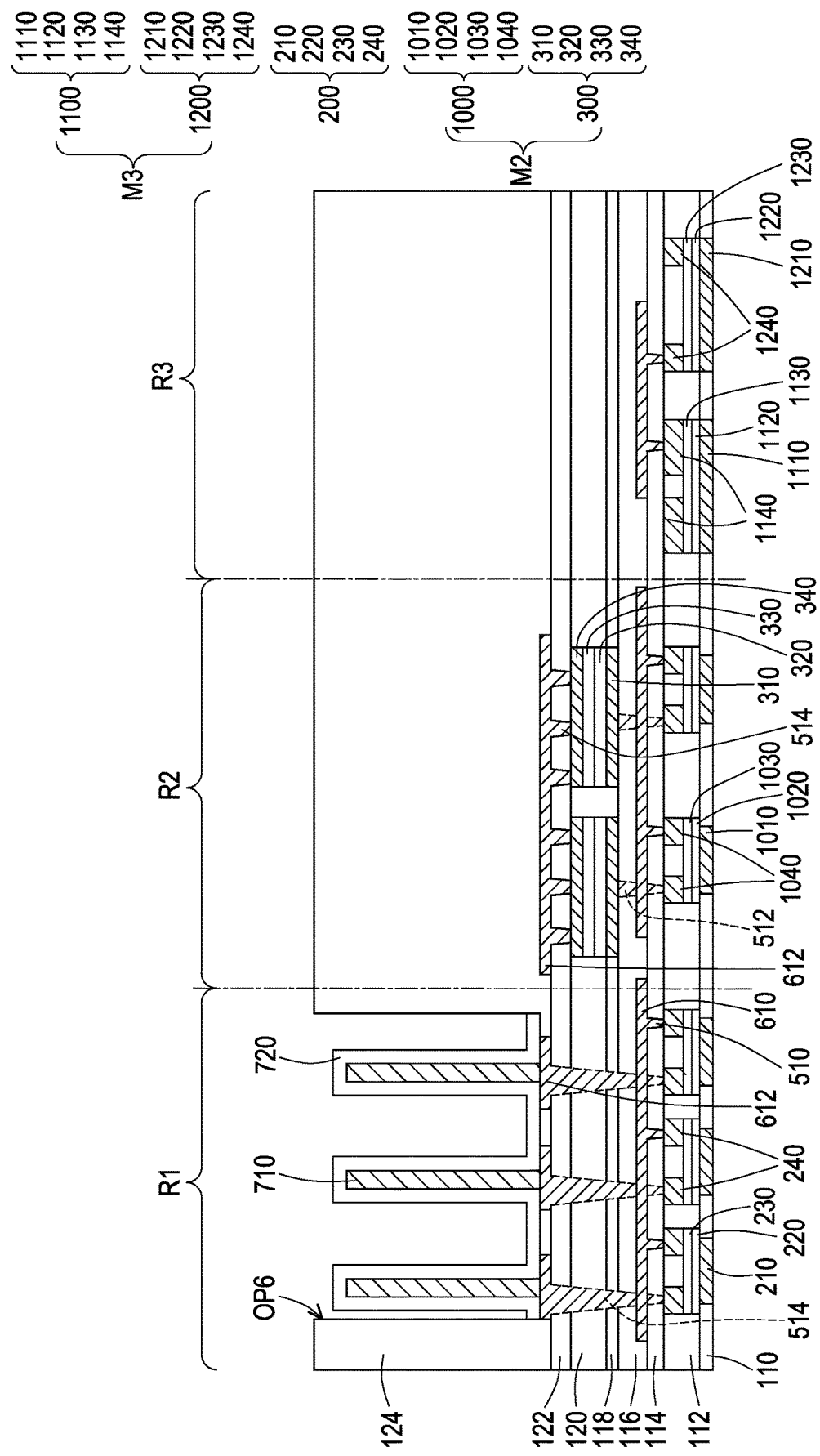
Figure 4V:
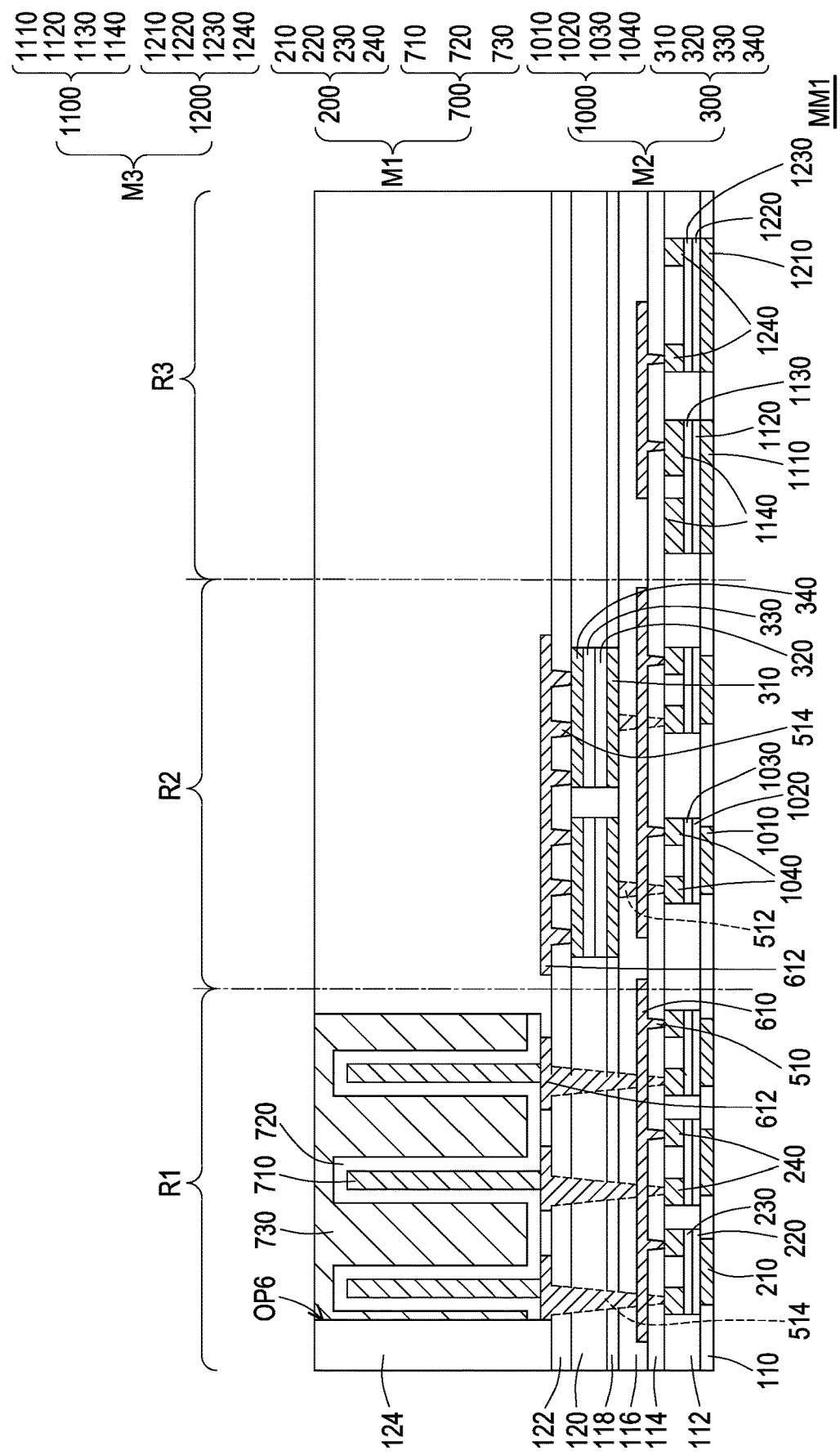

FIG. 4A to FIG. 4V are cross-sectional views illustrating various stages of a manufacturing method of the memory module MM1 in FIG. 3 in accordance with some alternative embodiments of the disclosure.

Referring to FIG. 4A, a sub-dielectric layer 110 is provided. In some embodiments, a material and a formation method of the sub-dielectric layer 110 in FIG. 4A are similar to that of the sub-dielectric layer 110 in FIG. 2A, so the detailed description thereof is omitted herein. As illustrated in FIG. 4A, a plurality of gate electrodes 210, a plurality of gate electrodes 1010, a gate electrode 1110, and a gate electrode 1210 are formed in the sub-dielectric layer 110. For example, the gate electrodes 210, the gate electrodes 1010, the gate electrode 1110, and the gate electrode 1210 are embedded in the sub-dielectric layer 110. In some embodiments, the gate electrodes 210 are formed in the first region R1, the gate electrodes 1010 are formed in the second region R2, and the gate electrode 1110 and the gate electrode 1210 are formed in the third region R3. In some embodiments, the gate electrodes 210, the gate electrodes 1010, the gate electrode 1110, and the gate electrode 1210 are formed simultaneously during a same step. In some embodiments, materials and formation methods of the gate electrodes 210, the gate electrodes 1010, the gate electrode 1110, and the gate electrode 1210 in FIG. 4A are similar to that of the gate electrodes 210 in FIG. 2A, so the detailed descriptions thereof are omitted herein. As illustrated in FIG. 4A, a top surface of the sub-dielectric layer 110, top surfaces of the gate electrodes 210, top surfaces of the gate electrodes 1010, a top surface of the gate electrode 1110, and a top surface of the gate electrode 1210 are substantially coplanar.

Referring to FIG. 4B, a plurality of gate dielectric layers 220 is formed over the sub-dielectric layer 110 and the gate electrodes 210, a plurality of gate dielectric layers 1020 is formed over the sub-dielectric layer 110 and the gate electrodes 1010, and a gate dielectric layer 1120 is formed over the sub-dielectric layer 110 and the gate electrode 1110, and a gate dielectric layer 1220 is formed over the sub-dielectric layer 110 and the gate electrode 1210. For example, the gate dielectric layers 220 are formed in the first region R1, the gate dielectric layers 1020 are formed in the second region R2, and the gate dielectric layer 1120 and the gate dielectric layer 1220 are formed in the third region R3. In some embodiments, materials and formation methods of the gate dielectric layers 220, the gate dielectric layers 1020, the gate dielectric layer 1120, and the gate dielectric layer 1220 in FIG. 4A are similar to that of the gate dielectric layers 220 in FIG. 2B, so the detailed descriptions thereof are omitted herein. As illustrated in FIG. 4B, a plurality of gate dielectric layers 220, a plurality of gate dielectric layers 1020, a gate dielectric layer 1120, and a gate dielectric layer 1220 are shown. However, the disclosure is not limited thereto. In some alternative embodiments, a single layer of the gate dielectric layer may be formed to extend throughout the first region R1, the second region R2, and the third region R3, and different portions of this gate dielectric layer may be respectively referred to as the gate dielectric layers 220, the gate dielectric layers 1020, the gate dielectric layer 1120, and the gate dielectric layer 1220.

Referring to FIG. 4C, a channel material layer 230*a* is conformally formed over the sub-dielectric layer 110, the gate electrodes 210, the gate electrodes 1010, the gate electrode 1110, the gate electrode 1210, the gate dielectric layers 220, the gate dielectric layers 1020, the gate dielectric layer 1120, and the gate dielectric layer 1220. In some embodiments, the channel material layer 230*a* includes amorphous oxide semiconductor materials. Examples of the amorphous oxide semiconductor material include IGZO, InWO, InZnO, InSnO, ZnO, GaOx, InOx, AZO, combinations thereof, or the like. In some embodiments, the channel material layer 230*a* is deposited by a suitable deposition process, such as CVD, PECVD, FCVD, HDP-CVD, SACVD, PVD, or ALD.

Referring to FIG. 4C and FIG. 4D, a portion of the channel material layer 230*a* is removed to form a plurality of channel layers 230, a plurality of channel layer 1030, a channel layer 1130, and a channel layer 1230. In some embodiments, the channel layers 230 are located in the first region R1 and are over the gate electrodes 210 and the gate dielectric layers 220, the channel layers 1030 are located in the second region R2 and are over the gate electrodes 1010 and the gate dielectric layers 1020, the channel layer 1130 is located in the third region R3 and is over the gate electrode 1110 and the gate dielectric layer 1120, and the channel layer 1230 is located in the third region R3 and is over the gate electrode 1210 and the gate dielectric layer 1220. In some embodiments, the channel layers 230, the channel layers 1030, the channel layer 1130, and the channel layer 1230 are made of a same material and are simultaneously formed during a same step. In some embodiments, the portion of the channel material layer 230*a* is removed through a photolithography and etching process or other suitable processes. As illustrated in FIG. 4D, sidewalls of each channel layer 230 are aligned with sidewalls of the corresponding gate dielectric layer 220, sidewalls of each channel layer 1030 are aligned with sidewalls of the corresponding gate dielectric layer 1020, sidewalls of the channel layer 1130 are aligned with sidewalls of the gate dielectric layer 1120 and sidewalls of the gate electrode 1110, and sidewalls of the channel layer 1230 are aligned with sidewalls of the gate dielectric layer 1220 and sidewalls of the gate electrode 1210. Meanwhile, the sidewalls of each channel layer 230 and the sidewalls of each gate dielectric layer 220 extend beyond sidewalls of the corresponding gate electrode 210, and the sidewalls of each channel layer 1030 and the sidewalls of each gate dielectric layer 1020 extend beyond sidewalls of the corresponding gate electrode 1010. However, the disclosure is not limited thereto. In some alternative embodiments, sidewalls of each channel layer 230 are not aligned with sidewalls of the corresponding gate dielectric layer 220, but stay within sidewalls of the corresponding gate dielectric layer 220. Similarly, sidewalls of each channel layer 1030 are not aligned with sidewalls of the corresponding gate dielectric layer 1020, but stay within sidewalls of the corresponding gate dielectric layer 1020. In some embodiments, the channel layers 230, the channel layers 1030, the channel layer 1130, and the channel layer 1230 are located at a same level height.

Referring to FIG. 4E, a sub-dielectric layer 112 is formed on the sub-dielectric layer 110, the gate dielectric layers 220, the gate dielectric layers 1020, the gate dielectric layer 1120, the gate dielectric layer 1220, the channel layers 230, the channel layers 1030, the channel layer 1130, and the channel layer 1230. For example, the sub-dielectric layer 112 covers the gate dielectric layers 220, the gate dielectric layers 1020, the gate dielectric layer 1120, the gate dielectric layer 1220, the channel layers 230, the channel layers 1030, the channel layer 1130, and the channel layer 1230. In some embodiments, a material and a formation method of the sub-dielectric layer 112 in FIG. 4E are similar to that of the sub-dielectric layer 112 in FIG. 2G, so the detailed description thereof is omitted herein.

Referring to FIG. 4F, a plurality of openings OP4 is formed in the sub-dielectric layer 112. In the first region R1, the openings OP4 are formed near two ends of each channel layer 230. In the second region R2, the openings OP4 are formed near two ends of each channel layer 1030. In the third region R3, the openings OP4 are formed near two ends of the channel layer 1130 and near two ends of the channel layer 1230. For example, the openings OP4 in the first region R1 expose two ends of each channel layer 230, the openings OP4 in the second region R2 expose two ends of each channel layer 1030, the openings OP4 in the third region R3 expose two ends of the channel layer 1130 and two ends of the channel layer 1230. In some embodiments, the openings OP4 are formed through a photolithography and etching process.

Referring to FIG. 4G, a plurality of source/drain regions 240 are formed in the openings OP4 of the first region R1, a plurality of source/drain regions 1040 are formed in the openings OP4 of the second region R2, and source/drain regions 1140 and source/drain regions 1240 are formed in the openings OP4 of the third region R3. For example, the source/drain regions 240 fill up the openings OP4 of the sub-dielectric layer 112 in the first region R1, the source/drain regions 1040 fill up the openings OP4 of the sub-dielectric layer 112 in the second region R2, and the source/drain regions 1140 and the source/drain regions 1240 fill up the openings OP4 of the sub-dielectric layer 112 in the third region R3. As illustrated in FIG. 4G, each pair of the source/drain regions 240 is formed on two ends of the corresponding channel layer 230, each pair of the source/drain regions 1040 is formed on two ends of the corresponding channel layer 1030, the source/drain regions 1140 are formed on two ends of the channel layer 1130, and the source/drain regions 1240 are formed on two ends of the channel layer 1230. In some embodiments, the source/drain regions 240, the source/drain regions 1040, the source/drain regions 1140, and the source/drain regions 1240 are formed simultaneously during a same step. In some embodiments, materials and formation methods of the source/drain regions 240, the source/drain regions 1040, the source/drain regions 1140, and the source/drain regions 1240 in FIG. 4G are similar to that of the source/drain regions 240 in FIG. 2H, so the detailed descriptions thereof are omitted herein. As illustrated in FIG. 2I, a top surface of the sub-dielectric layer 112, top surfaces of the source/drain regions 240, top surfaces of the source/drain regions 1040, top surfaces of the source/drain regions 1140, and top surfaces of the source/drain regions 1240 are substantially coplanar.

In some embodiments, each gate electrode 210, each gate dielectric layer 220, each channel layer 230, and each pair of the source/drain regions 240 form a transistor 200 in the first region R1. On the other hand, each gate electrode 1010, each gate dielectric layer 1020, each channel layer 1030, and each pair of the source/drain regions 1040 form a transistor 1000 in the second region R2. Moreover, the gate electrode 1110, the gate dielectric layer 1120, the channel layer 1130, and the source/drain regions 1140 form a transistor 1100 in the third region R3 while the gate electrode 1210, the gate dielectric layer 1220, the channel layer 1230, and the source/drain regions 1240 form a transistor 1200 in the third region R3. In some embodiments, the transistors 200, the transistors 1000, the transistor 1100, and the transistor 1200 are embedded in the sub-dielectric layers 110 and 112. For example, the transistors 200, the transistors 1000, the transistor 1100, and the transistor 1200 are located at a same level height. It should be noted that although three transistors 200, two transistors 1000, one transistor 1100 and one transistor 1200 are shown in FIG. 4G, the disclosure is not limited thereto. In some alternative embodiments, the number of the transistors 200, the transistors 1000, the transistor 1100, and the transistor 1200 may be adjusted depending on circuit design.

As mentioned above, the third memory device M3 in FIG. 3 is an OTP device, so the transistor 1100 and the transistor 1200 may be collectively referred to as the third memory device M3. For example, the source/drain regions 1140 of the transistor 1100 may be electrically coupled to the source/drain regions 1240 of the transistor 1200 to from the third memory device M3 (shown in FIG. 4H). In some embodiments, the transistor 1100 is referred to as a read transistor of the third memory device M3 while the transistor 1200 is referred to as a program transistor of the third memory device M3. However, it should be understood that the role (read/program) of these two transistors is process dependent. Therefore, the relation with device dimensions as illustrated here is not universal. The role can be reversed in different processes. In some embodiments, gate dielectric breakdown may be utilized as a one-time programming mechanism, and can be achieved by applying a high voltage to the gate electrode 1210 of the transistor 1200. Before the gate dielectric breakdown of the program transistor (i.e. the transistor 1200), a region between the gate electrode 1210 and source/drain regions 1240 of the program transistor behaves like a capacitor, and the program transistor can be regarded as being in a high resistance state (i.e., having a logic data "1"). When the gate electrode 1210 of the program transistor receives a high voltage, the gate dielectric breakdown may occur in the program transistor (i.e. the transistor 1200), and a conductive path penetrating through the gate dielectric layer 1220 of the program transistor may be formed. In this way, the region between the gate electrode 1210 and source/drain regions 1240 of the program transistor behaves like a resistor, and the program transistor can be regarded as being in a low resistance state (i.e., having a logic data "0"). During a read operation, the read transistor (i.e. the transistor 1100) may read the state of the program transistor (i.e. the transistor 1200).

Referring to FIG. 4H, a sub-dielectric layer 114, a plurality conductive vias 510, and a plurality of conductive patterns 610 are formed on the sub-dielectric layer 112, the transistors 200, the transistors 1000, the transistor 1100, and the transistor 1200. In some embodiments, materials and formation methods of the sub-dielectric layer 114, the conductive vias 510, and the conductive patterns 610 in FIG. 4H are respectively similar to that of the sub-dielectric layer 114, the conductive vias 510, and the conductive patterns 610 in FIG. 2J, so the detailed descriptions thereof are omitted herein. In some embodiments, the conductive patterns 610 are disposed on the sub-dielectric layer 114. In some embodiments, the conductive vias 510 located in the first region R1 penetrate through the sub-dielectric layer 114 to be in physical contact with some of the source/drain regions 240 of the transistors 200 (for example, the drain regions of the transistors 200), so as to render electrical connection between the conductive pattern 610 in the first region R1 and the transistors 200. Meanwhile, the conductive vias 510 located in the second region R2 penetrate through the sub-dielectric layer 114 to be in physical contact with the some of the source/drain regions 1040 of the transistors 1000 (for example, the drain regions of the transistors 1000), so as to render electrical connection between the conductive pattern 610 in the second region R2 and the transistors 1000. Moreover, a portion of the conductive vias 510 located in the third region R3 penetrate through the sub-dielectric layer 114 to be in physical contact with one of the source/drain regions 1140 of the transistor 1100 and another portion of the conductive vias 510 located in the third region R3 penetrate through the sub-dielectric layer 114 to be in physical contact with one of the source/drain regions 1240 of the transistor 1200, so as to render electrical connection between the source/drain regions 1140 of the transistor 1100 and the source/drain regions 1240 of the transistor 1200. For example, the source/drain regions 1140 of the transistor 1100 and the source/drain regions 1240 of the transistor 1200 are electrically connected through the conductive vias 510 and the conductive pattern 610 in the third region R3.

Referring to FIG. 4I, a sub-dielectric layer 116 and a plurality conductive vias 512 are formed on the sub-dielectric layer 114 and the conductive pattern 610. Please be noted that the conductive vias 512 are behind the conductive pattern 610 and exists in a different cross-sectional view, so the conductive vias 512 are denoted by dotted line. In some embodiments, materials and formation methods of the sub-dielectric layer 116 and the conductive vias 512 in FIG. 4I are respectively similar to that of the sub-dielectric layer 116 and the conductive vias 512 in FIG. 2K, so the detailed descriptions thereof are omitted herein. As illustrated in FIG. 4I, the conductive vias 512 are formed in the second region R2. For example, the conductive vias 512 are not formed in the first region R1 and the third region R3. In some embodiments, the conductive vias 512 penetrate through the sub-dielectric layer 116 and the sub-dielectric layer 114 to be in physical contact with some of the source/drain regions 1040 of the transistors 1000 (for example, the source regions of the transistors 1000).

Referring to FIG. 4J, a sub-dielectric layer 118 and bottom electrodes 310 are formed on the sub-dielectric layer 116 and the conductive vias 512. In some embodiments, materials and formation methods of the sub-dielectric layer 116 and the bottom electrodes 310 in FIG. 4J are respectively similar to that of the sub-dielectric layer 110 and the bottom electrodes 310 in FIG. 2A, so the detailed descriptions thereof are omitted herein. In some embodiments, the bottom electrodes 310 are embedded in the sub-dielectric layer 118. In some embodiments, the bottom electrodes 310 are formed in the second region R2. For example, the bottom electrodes 310 are not formed in the first region R1 and the third region R3. As illustrated in FIG. 4J, a top surface of the sub-dielectric layer 118 and top surfaces of the bottom electrodes 310 are substantially coplanar.

Referring to FIG. 4K, a first storage material layer 320a and a second storage material layer 330a are sequentially formed on the sub-dielectric layer 118 and the bottom electrodes 310. In some embodiments, a material and a formation method of the first storage material layer 320a in FIG. 4K are similar to that of the first storage material layer 320a in FIG. 2C, so the detailed description thereof is omitted herein. Similarly, a material and a formation method of the second storage material layer 330a in FIG. 4K are similar to that of the second storage material layer 330a in FIG. 2E, so the detailed description thereof is also omitted herein.

Referring to FIG. 4K and FIG. 4L, a portion of the second storage material layer 330a and a portion of the first storage material layer 320a are removed to form a plurality of first storage layers 320 and a plurality second storage layers 330 on the bottom electrodes 310 in the second region R2. For example, the remaining first storage material layer 320a constitutes the first storage layers 320 and the remaining second storage material layer 330a constitutes the second storage layers 330. As illustrated in FIG. 4M, sidewalls of each second storage layer 330 are aligned with sidewalls of the corresponding first storage layer 320 and sidewalls of the corresponding bottom electrode 310. In some embodiments, the portion of the second storage material layer 330a and the portion of the first storage material layer 320a are removed through a photolithography and etching process or other suitable processes. In some embodiments, the portion of the second storage material layer 330a and the portion of the first storage material layer 320a are removed simultaneously during a same step.

Referring to FIG. 4M, a sub-dielectric layer 120 is formed on the sub-dielectric layer 118, the first storage layers 320, and the second storage layers 330. For example, the sub-dielectric layer 120 covers the first storage layers 320 and the second storage layers 330. In some embodiments, a material and a formation method of the sub-dielectric layer 120 in FIG. 4M are similar to that of the sub-dielectric layer 112 in FIG. 2G, so the detailed description thereof is omitted herein.

Referring to FIG. 4N, a plurality of openings OP5 is formed in the sub-dielectric layer 120. In some embodiments, the openings OP5 are formed in the second region R2 to correspond to the second storage layer 330. For example, the openings OP5 expose an entire top surface of each storage layer 330. In some embodiments, the openings OP5 are formed through a photolithography and etching process.

Referring to FIG. 4O, a plurality of top electrodes 340 is formed in the openings OP5. For example, the top electrodes 340 fill up the openings OP5 of the sub-dielectric layer 120 in the second region R2. As illustrated in FIG. 4O, each top electrode 340 is formed on the corresponding second storage layer 330 to be in physical contact with the corresponding second storage layer 330. In some embodiments, sidewalls of each top electrode 340 are aligned with the sidewalls of the corresponding second storage layer 330, the sidewalls of the corresponding first storage layer 320, and the sidewalls of the corresponding bottom electrode 310. In some embodiments, a material and a formation method of the top electrodes 340 in FIG. 4O are similar to that of the top electrode 340 in FIG. 2I, so the detailed description thereof is omitted herein. As illustrated in FIG. 4O, a top surface of the sub-dielectric layer 120 and top surfaces of the top electrodes 340 are substantially coplanar.

In some embodiments, each bottom electrode 310, each first storage layer 320, each second storage layer 330, and each top electrode 340 form a capacitor 300 in the second region R2. As illustrated in FIG. 4O, the bottom electrode 310, the first storage layer 320, the second storage layer 330, and the top electrode 340 are stacked in sequential order from bottom to top. In some embodiments, the capacitors 300 and the transistors 1000 form the second memory device M2 in FIG. 3. That is, the second memory device M2 includes the transistors 1000 and the capacitors 300. In some embodiments, the capacitors 300 may serve as memory cells for the second memory device M2. For example, the first storage layers 320 and the second storage layers 330 may be utilized to store data. In some embodiments, the capacitors 300 are electrically connected to the transistors 1000. For example, the bottom electrodes 310 of the capacitors 300 are electrically connected to the source/drain regions 1040 of the transistors 1000 sequentially through the conductive vias 512, the conductive pattern 610, and the conductive vias 510 in the second region R2. In some embodiments, the transistors 1000 may serve as selectors for the second memory device M2. It should be noted that although two capacitors 300 are shown in FIG. 4O, the disclosure is not limited thereto. In some alternative embodiments, the number of the capacitors 300 may be adjusted depending on circuit design.

Referring to FIG. 4P, a sub-dielectric layer 122 is formed on the sub-dielectric layer 120 and the capacitors 300. In some embodiments, a material and a formation method of the sub-dielectric layer 122 in FIG. 4P are similar to that of the sub-dielectric layer 114 in FIG. 2J, so the detailed description thereof is omitted herein.

Referring to FIG. 4Q, a plurality of conductive vias 514 and a plurality of conductive patterns 612 are formed. Please be noted that the conductive vias 514 located in the first region R1 are behind the conductive pattern 610 and exists in a different cross-sectional view, so the conductive vias 514 located in the first region R1 are denoted by dotted line. In some embodiments, materials and formation methods of the conductive vias 514 and the conductive patterns 612 in FIG. 4Q are respectively similar to that of the conductive vias 512 and the conductive patterns 612 in FIG. 2K, so the detailed descriptions thereof are omitted herein. In some embodiments, the conductive vias 514 and the conductive patterns 612 are formed in the first region R1 and the second region R2. On the other hand, the conductive vias 514 and the conductive patterns 612 are not formed in the third region R3. In some embodiments, the conductive patterns 612 are disposed on the sub-dielectric layer 122. As illustrated in FIG. 4Q, the conductive vias 514 located in the first region R1 penetrate through the sub-dielectric layer 122, the sub-dielectric layer 120, the sub-dielectric layer 118, the sub-dielectric layer 116, and the sub-dielectric layer 114 to be in physical contact with some of the source/drain regions 240 of the transistors 200 (for example, the source regions of the transistors 200), so as to render electrical connection between the conductive pattern 612 in the first region R1 and the transistors 200. Meanwhile, the conductive vias 514 located in the second region R2 penetrate through the sub-dielectric layer 122 to be in physical contact with the top electrodes 340 of the capacitors 300, so as to render electrical connection between the conductive pattern 612 in the second region R2 and the capacitors 300.

Referring to FIG. 4R, a sub-dielectric layer 124 is formed on the sub-dielectric layer 122 and the conductive patterns 612. In some embodiments, a material and a formation method of the sub-dielectric layer 124 in FIG. 4R are similar to that of the sub-dielectric layer 118 in FIG. 2L, so the detailed description thereof is omitted herein.

Referring to FIG. 4S, an opening OP6 is formed in the sub-dielectric layer 124. In some embodiments, the opening OP6 is formed in the first region R1. For example, the opening OP6 is formed to expose the conductive patterns 612 in the first region R1. In some embodiments, the opening OP6 is formed through a photolithography and etching process.

Referring to FIG. 4T, a plurality of electrodes 710 is formed in the opening OP6 of the sub-dielectric layer 124. For example, the electrodes 710 are formed on the conductive patterns 612. In some embodiments, a material and a formation method of the electrodes 710 in FIG. 4T are similar to that of the electrodes 710 in FIG. 2N, so the detailed description thereof is omitted herein. As illustrated in FIG. 4T, each electrode 710 takes the form of a pillar. However, the disclosure is not limited thereto. In some alternative embodiments, the electrodes 710 may have other shapes or geometries. In some embodiments, a height of each electrode 710 is less than a thickness of the sub-dielectric layer 124.

Referring to FIG. 4U, a storage layer 720 is conformally formed in the opening OP6. For example, the storage layer 720 is formed to cover the conductive patterns 612 and the electrodes 710. In some embodiments, a material and a formation method of the storage layer 720 in FIG. 4U are similar to that of the storage layer 720 in FIG. 2O, so the detailed description thereof is omitted herein.

Referring to FIG. 4V, an electrode 730 is formed in the opening OP6. For example, the electrode 730 fills up the opening OP6 of the sub-dielectric layer 124. In some embodiments, a material and a formation method of the electrode 730 in FIG. 4V are similar to that of the electrode 730 in FIG. 2P, so the detailed description thereof is omitted herein. As illustrated in FIG. 4V, a top surface of the sub-dielectric layer 124 and a top surface of the electrode 730 are substantially coplanar.

In some embodiments, the electrode 710, the storage layer 720, and the electrode 730 form a capacitor 700 in the first region R1. In some embodiments, the electrode 710 may be referred to as a bottom electrode of the capacitor 700 while the electrode 730 may be referred to as a top electrode of the capacitor 700. In some embodiments, the capacitor 700 and the transistors 200 form the first memory device M1 in FIG. 3. That is, first memory device M1 includes the transistors 200 and the capacitor 700. In some embodiments, the capacitor 700 may serve as a memory cell for the first memory device M1. For example, the storage layer 720 may be utilized to store data. In some embodiments, the capacitor 700 is electrically connected to the transistors 200. For example, the electrode 710 of the capacitor 700 is electrically connected to the source/drain regions 240 of the transistors 200 sequentially through the conductive patterns 612, the conductive vias 514, the conductive pattern 610, and the conductive vias 510. In some embodiments, the transistors 200 may serve as selectors for the first memory device M1. As illustrated in FIG. 4V, the capacitor 700 of the first memory device M1 and the capacitors 300 of the second memory device M2 are located at different level heights.

After the electrode 730 is formed, the formation of the memory module MM1 is substantially completed. In some embodiments, the first memory device M1 is embedded in the sub-dielectric layers 110, 112, 114, 116, 118, 120, 122, and 124, the second memory device M2 is embedded in the sub-dielectric layers 110, 112, 114, 116, 118, and 120, and the third memory device M3 is embedded in the sub-dielectric layers 110 and 112. In some embodiments, the sub-dielectric layers 110, 112, 114, 116, 118, 120, 122, and 124 correspond to one of the dielectric layers 36 of the interconnect structure 30 in FIG. 3. As such, the first memory device M1, the second memory device M2, and the third memory device M3 are being considered as embedding in the same dielectric layer 36. In some embodiments, since the interconnect structure 30 is being considered as formed during back-end-of-line (BEOL) process, the first memory device M1, the second memory device M2, and the third memory device M3 are also being considered as formed during BEOL processes. By integrating the formations of the first memory device M1, the second memory device M2, and the third memory device M3 into the BEOL process, FEOL area may be released to reduce chip size and the manufacturing cost. Moreover, FEOL can adopt the most advanced nodes to realize high performance. Furthermore, the data/signal transmission distance between devices may be shortened to enhance the device performance.

In accordance with some embodiments of the disclosure, an integrated circuit includes a substrate, a first transistor, and an interconnect structure. The first transistor is over the substrate. The interconnect structure is disposed on the substrate and includes a first dielectric layer and a memory module. The memory module includes a first memory device, a second memory device, and a third memory device. The first memory device is embedded in the first dielectric layer. The second memory device is disposed aside the first memory device and is embedded in the first dielectric layer. The first memory device, the second memory device, and the third memory device are different types of memory devices.

In accordance with some alternative embodiments of the disclosure, an integrated circuit has a first region and a second region adjacent to the first region. The integrated circuit includes a substrate, a first transistor, and an interconnect structure. The first transistor is over the substrate. The interconnect structure is disposed on the substrate and includes dielectric layers, a first memory device, a second memory device, and a third memory device. The first memory device is located in the first region and includes a second transistor having a gate electrode. The second memory device is located in the second region and includes a bottom electrode. The first memory device and the second memory device are embedded in a same dielectric layer. The gate electrode of the second transistor of the first memory device and the bottom electrode of the second memory device are located at a same level height. The third memory device is located in the first region. The third memory device and the first memory device are embedded in different dielectric layers.

In accordance with some embodiments of the disclosure, a manufacturing method of an integrated circuit having a first region and a second region adjacent to the first region includes at least the following steps. A substrate is provided. A first transistor is formed over the substrate. An interconnect structure is formed over the substrate. The interconnect structure is formed by at least the following steps. First, dielectric layers are formed. Thereafter, a memory module is formed in the dielectric layers. The memory module is formed by at least the following steps. A first memory device is formed in the first region by forming a second transistor having a gate electrode. A second memory device is formed in the second region by forming a bottom electrode, and the gate electrode of the second transistor of the first memory device and the bottom electrode of the second memory device are simultaneously formed. A third memory device is formed above the first memory device and in the first region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of an integrated circuit having a first region and a second region adjacent to the first region, comprising:
    providing a substrate;
    forming a first transistor over the substrate; and
    forming an interconnect structure over the substrate, comprising:
        forming dielectric layers; and
        forming a memory module in the dielectric layers, comprising:
            forming a first memory device in the first region, comprising:
                forming a second transistor having a gate electrode;
            forming a second memory device in the second region, comprising:
                forming a bottom electrode, wherein the gate electrode of the second transistor of the first memory device and the bottom electrode of the second memory device are simultaneously formed; and
            forming a third memory device above the first memory device and in the first region.

2. The method of claim 1, wherein forming the memory module comprising:
    forming the gate electrode in the first region and the bottom electrode in the second region;
    conformally forming a first storage material layer over the gate electrode and the bottom electrode;
    removing the first storage material layer located in the first region to form an intermediate storage material layer;
    conformally forming a second storage material layer over the gate electrode and the intermediate storage material layer;
    removing a portion of the intermediate storage material layer and a portion of the second storage material layer to form a channel layer over the gate electrode in the first region and to form a first storage layer and a second storage layer on the bottom electrode in the second region; and
    forming source/drain regions on the channel layer in the first region and forming a top electrode on the second storage layer in the second region, wherein the gate electrode, the channel layer, and the source/drain regions form the second transistor of the first memory device, and the bottom electrode, the first storage layer, the second storage layer, and the top electrode form the second memory device.

3. The method of claim 2, wherein the portion of the intermediate storage material layer and the portion of the second storage material layer are removed during a same step.

4. The method of claim 2, wherein the source/drain regions and the top electrode are simultaneously formed.

5. The method of claim 1, wherein forming the first memory device comprises:
    forming a plurality of conductive pillars over and electrically coupled to the second transistor;
    depositing a storage material layer overlying and lining individual sidewalls of the plurality of conductive pillars; and
    forming an electrode overlying the storage material layer and extending along the individual sidewalls of the plurality of conductive pillars.

6. The method of claim 1, wherein forming the first memory device comprises forming a first capacitor overlying and electrically coupled to the second transistor, and wherein forming the third memory device comprises:
    forming a second capacitor overlying the first capacitor, wherein the first and second capacitors share a shared electrode.

7. The method of claim 6, wherein forming the second capacitor comprises:
    depositing a storage material layer overlying the shared electrode;
    patterning the storage material layer to localize a portion of the storage material layer to the shared electrode;
    depositing a first dielectric layer of the dielectric layers overlying the portion of storage material layer; and
    forming a top electrode atop the portion of the storage material layer and inset into the first dielectric layer.

8. A manufacturing method of an integrated circuit having a first region and a second region adjacent to the first region, comprising:
    forming a semiconductor device over a substrate; and
    forming an interconnect structure over the semiconductor device and comprising:
        depositing a first dielectric layer; and
        forming a memory module on the first dielectric layer and comprising:
            forming a first memory device at the first region;
            forming a second memory device at the second region, wherein the first memory device and the second memory device are both inset into the first dielectric layer; and
            forming a third memory device overlying the first memory device and at the first region, wherein the first memory device, the second memory device, and the third memory device are different types of memory devices.

9. The method of claim 8, wherein forming the memory module comprises:
   patterning the first dielectric layer to form a first opening and a second opening respectively at the first and second regions;
   depositing a conductive layer overlying the first dielectric layer and filling the first and second openings; and
   performing a planarization into the conductive layer to expose the first dielectric layer, wherein a portion of the conductive layer in the first opening forms a gate electrode of the first memory device and another portion of the conductive layer in the second opening forms a bottom electrode of the second memory device.

10. The method of claim 9, wherein forming the memory module comprises:
    forming a gate dielectric layer overlying the gate electrode;
    forming a channel layer overlying the gate dielectric layer; and
    forming a pair of source/drain electrodes overlying the channel layer, wherein the gate electrode, the gate dielectric layer, the channel layer, and the pair of source/drain electrodes form a transistor.

11. The method of claim 9, wherein forming the memory module comprises:
    forming a pair of storage material layers overlying the bottom electrode; and
    forming a top electrode overlying the pair of storage material layers, wherein the bottom electrode, the pair of storage material layers, and the top electrode form the second memory device.

12. The method of claim 8, wherein forming the interconnect structure comprises depositing a second dielectric layer over a portion of the first memory device, and wherein forming the first memory device comprises:
    patterning the second dielectric layer to form an opening overlying the portion of the first memory device;
    forming a pillar-shaped electrode in the opening;
    depositing a storage material layer overlying and lining the pillar-shaped electrode in the opening;
    depositing a conductive layer overlying the second dielectric layer and filling a remainder of the opening over the storage material layer; and
    performing a planarization into the conductive layer to clear the conductive layer from atop the second dielectric layer, wherein a portion of the conductive layer in the opening forms an electrode.

13. The method of claim 12, wherein forming the third memory device comprises:
    forming an additional storage material layer localized atop the electrode; and
    forming an additional electrode overlying the additional storage material layer, wherein the electrode, the additional storage material layer, and the additional electrode form the third memory device.

14. The method of claim 8, wherein forming the first memory device comprises:
    forming a transistor inset into the first dielectric layer;
    forming a conductive stack overlying the transistor and comprising a plurality of vias and a plurality of conductive layers that are stacked away from the transistor; and
    forming a capacitor on the conductive stack, electrically coupled to a source/drain region of the transistor by the conductive stack.

15. A manufacturing method of an integrated circuit, comprising:
    forming a gate electrode and a first capacitor electrode spaced over a substrate and level with each other;
    forming a gate dielectric layer and a channel layer overlying the gate electrode;
    forming a pair of first storage layers overlying the first capacitor electrode;
    forming a pair of source/drain electrodes and a second capacitor electrode respectively overlying the channel layer and the pair of first storage layers;
    forming a conductive structure overlying and extending from the pair of source/drain electrodes;
    forming a third capacitor electrode that overlies and is electrically coupled to an electrode of the pair of source/drain electrodes by the conductive structure;
    forming a second storage layer overlying and on sidewalls of the third capacitor electrode;
    forming a fourth capacitor electrode overlying the second storage layer and extending along the sidewalls of the third capacitor electrode;
    forming a third storage layer overlying the fourth capacitor electrode; and
    forming a fifth capacitor electrode overlying the third storage layer.

16. The manufacturing method of claim 15, wherein the gate electrode, the gate dielectric layer, the channel layer, the pair of source/drain electrodes, the third capacitor electrode, the second storage layer, and the fourth capacitor electrode form a first memory device, wherein the first capacitor electrode, the pair of first storage layers, and the second capacitor electrode form a second memory device, and wherein the fourth capacitor electrode, the third storage layer, and the fifth capacitor electrode form a third memory device.

17. The manufacturing method of claim 15, wherein forming the channel layer and a storage layer of the pair of first storage layers comprises:
    depositing an amorphous oxide layer; and
    patterning the amorphous oxide layer into the channel layer and the storage layer of the pair of first storage layers.

18. The manufacturing method of claim 15, wherein forming the third storage layer comprises:
    depositing an amorphous oxide layer overlying the fourth capacitor electrode and the second capacitor electrode; and
    patterning the amorphous oxide layer, wherein a portion of the amorphous oxide layer at completion of the patterning forms the third storage layer and has a width less than a width of the fourth capacitor electrode.

19. The manufacturing method of claim 15, further comprising:
    forming an interconnect structure having a lower portion separating the gate electrode and the first capacitor electrode from the substrate and further having an upper portion overlying the fifth capacitor electrode.

20. The manufacturing method of claim 19, further comprising:
    forming a transistor underlying the interconnect structure, on the substrate, and electrically coupled to the fifth capacitor electrode by the interconnect structure.

* * * * *